US012136904B2

(12) United States Patent
Valle et al.

(10) Patent No.: US 12,136,904 B2
(45) Date of Patent: Nov. 5, 2024

(54) MICROPHONE WITH FLEXIBLE PERFORMANCE

(71) Applicant: INVENSENSE, INC., San Jose, CA (US)

(72) Inventors: Stefano Valle, Milan (IT); Igor Mucha, Bratislava (SK); Alessandro Magnani, Milan (IT); Nicola Vannucci, Milan (IT)

(73) Assignee: INVENSENSE, INC., San Jose, CA (US)

( * ) Notice: Subject to any disclaimer, the term of this patent is extended or adjusted under 35 U.S.C. 154(b) by 149 days.

(21) Appl. No.: 17/821,549

(22) Filed: Aug. 23, 2022

(65) Prior Publication Data

US 2022/0399865 A1 Dec. 15, 2022

Related U.S. Application Data

(63) Continuation-in-part of application No. 17/412,238, filed on Aug. 25, 2021.
(Continued)

(51) Int. Cl.
*H03G 3/30* (2006.01)
*H04R 3/00* (2006.01)
*H04R 19/04* (2006.01)

(52) U.S. Cl.
CPC ............. *H03G 3/3005* (2013.01); *H04R 3/00* (2013.01); *H04R 19/04* (2013.01);
(Continued)

(58) Field of Classification Search
CPC .... H03M 3/376; H03M 3/354; H03M 1/0604; H03M 1/0863; H03G 3/3005;
(Continued)

(56) References Cited

U.S. PATENT DOCUMENTS 5,389,927 A 2/1995 Turney et al.
6,249,237 B1 6/2001 Prater
(Continued)

FOREIGN PATENT DOCUMENTS

CN 107112965 A 8/2017
KR 20180026453 3/2018
(Continued)

OTHER PUBLICATIONS

Office Action dated Sep. 22, 2016 for U.S. Appl. No. 14/812,576, 23 pages.
(Continued)

*Primary Examiner* — Carolyn R Edwards
*Assistant Examiner* — Julie X Dang
(74) *Attorney, Agent, or Firm* — Amin, Turocy & Watson, LLP

(57) ABSTRACT

Disclosed embodiments provide flexible performance, high dynamic range, microelectromechanical (MEMS) multipath digital microphones, which allow seamless, low latency transitions between audio signal paths without audible artifacts over interruptions in the audio output signal. Disclosed embodiments facilitate performance and power saving mode transitions maintaining high dynamic range capability.

14 Claims, 15 Drawing Sheets

Related U.S. Application Data

(60) Provisional application No. 63/156,219, filed on Mar. 3, 2021.

(52) U.S. Cl.
CPC . *H03G 2201/103* (2013.01); *H04R 2201/003* (2013.01); *H04R 2430/01* (2013.01)

(58) Field of Classification Search
CPC .. H03G 3/3089; H03G 3/3001; H03G 3/3002; H03G 3/00; H03G 3/32; H03G 1/0088; H03G 7/007; H03G 3/3026; H03G 3/3036; H03G 2201/103; H04R 3/00; H04R 23/004; H04R 19/04; H04R 1/04; H04R 1/005; H04R 3/005; H04R 29/006; H04R 2201/003; H04R 19/005; H04R 2430/01; H04R 1/08; H04R 2410/03; H04H 30/04; H04H 60/04; Y02D 30/70; H03F 3/45475; H03F 3/187; H03F 2200/03
USPC .................. 381/81, 107, 111, 104, 71.11
See application file for complete search history.

(56) References Cited

U.S. PATENT DOCUMENTS

| | | |
|---|---|---|
| 6,255,974 B1 | 7/2001 | Morizio et al. |
| 6,333,707 B1 | 12/2001 | Oberhammer et al. |
| 6,445,320 B1 | 9/2002 | Noro et al. |
| 7,295,645 B1 | 11/2007 | El-Ghoroury et al. |
| 7,327,294 B2 | 2/2008 | Gierenz et al. |
| 9,071,267 B1 | 6/2015 | Schneider et al. |
| 9,596,537 B2 | 3/2017 | He et al. |
| 9,673,768 B2 | 6/2017 | Perrott |
| 9,959,856 B2 | 5/2018 | Satoskar et al. |
| 10,756,748 B1 | 8/2020 | Khatavkar et al. |
| 10,855,308 B2 | 12/2020 | Perrott |
| 11,189,261 B1 | 11/2021 | Lu et al. |
| 11,374,589 B2 | 6/2022 | Perrott |
| 11,637,537 B2 | 4/2023 | Mucha |
| 2003/0078007 A1 | 4/2003 | Parssinen et al. |
| 2004/0192237 A1* | 9/2004 | Kayano ................ H03G 3/3042 455/127.2 |
| 2006/0071835 A1 | 4/2006 | Inukai |
| 2006/0097899 A1 | 5/2006 | Nagai |
| 2006/0220935 A1 | 10/2006 | Hughes et al. |
| 2007/0098119 A1 | 5/2007 | Stothers et al. |
| 2008/0137784 A1 | 6/2008 | Krone |
| 2008/0272950 A1 | 11/2008 | Eastty et al. |
| 2009/0161883 A1 | 6/2009 | Katsianos |
| 2010/0172506 A1 | 7/2010 | Iwano |
| 2011/0026739 A1 | 2/2011 | Thomsen et al. |
| 2011/0029109 A1 | 2/2011 | Thomsen et al. |
| 2012/0033817 A1 | 2/2012 | Francois et al. |
| 2012/0229316 A1 | 9/2012 | Loeda et al. |
| 2012/0328126 A1* | 12/2012 | Sakai ................... H03G 3/3005 381/107 |
| 2013/0129117 A1 | 5/2013 | Thomsen et al. |
| 2013/0195291 A1 | 8/2013 | Josefsson |
| 2014/0002284 A1 | 1/2014 | Tan et al. |
| 2014/0010374 A1 | 1/2014 | Kasai et al. |
| 2014/0086433 A1 | 3/2014 | Josefsson |
| 2014/0133677 A1 | 5/2014 | Zerbini et al. |
| 2014/0140538 A1 | 5/2014 | Kropfitsch et al. |
| 2014/0270252 A1 | 9/2014 | Pahuja et al. |
| 2015/0042496 A1* | 2/2015 | Straeussnigg ............ H04R 3/00 341/118 |
| 2015/0124981 A1 | 5/2015 | Veneri et al. |
| 2015/0194979 A1 | 7/2015 | Jiang et al. |
| 2015/0237432 A1 | 8/2015 | Miluzzi et al. |
| 2015/0263686 A1 | 9/2015 | Lesso |
| 2015/0350770 A1* | 12/2015 | Khenkin ............. H04R 19/005 381/111 |
| 2016/0087596 A1* | 3/2016 | Yurrtas .................... H04R 1/04 381/111 |
| 2016/0150325 A1 | 5/2016 | Oliaei |
| 2016/0157017 A1 | 6/2016 | Lesso et al. |
| 2016/0344358 A1 | 11/2016 | Oliaei |
| 2016/0365081 A1 | 12/2016 | Satoskar et al. |
| 2017/0033754 A1* | 2/2017 | Perrott .................. H04H 60/04 |
| 2018/0048325 A1 | 2/2018 | Schneider et al. |
| 2019/0190528 A1 | 6/2019 | Lassen |
| 2020/0162099 A1* | 5/2020 | Perrott .................. H03M 1/188 |
| 2020/0186157 A1* | 6/2020 | Kim ....................... H04R 19/04 |

FOREIGN PATENT DOCUMENTS

| | | |
|---|---|---|
| WO | 2012048892 A1 | 4/2012 |
| WO | 2020106485 | 5/2020 |

OTHER PUBLICATIONS

Notice of Allowance dated Feb. 3, 2017 for U.S. Appl. No. 14/812,576, 15 pages.
Notice of Allowance dated Mar. 18, 2020 for U.S. Appl. No. 16/543,276, 24 pages.
Office Action dated Apr. 1, 2020 for U.S. Appl. No. 16/673,484, 39 pages.
International Search Report and Written Opinion mailed Jun. 25, 2020 for PCT Application No. PCT/US2019/060764, 21 pages.
International Preliminary Report on Patentability mailed Jun. 3, 2021 for PCT Application No. PCT/US2019/060764, 13 pages.
Office Action dated Jul. 20, 2021 for U.S. Appl. No. 17/081,622, 53 pages.
Notice of Allowance dated Feb. 18, 2022 for U.S. Appl. No. 17/081,622, 72 pages.
Office Action dated Feb. 22, 2022 for U.S. Appl. No. 16/938,734, 26 pages.
International Search Report and Written Opinion mailed May 11, 2022 for PCT Application No. PCT/US2022/012181, 14 pages.
Final Office Action dated Sep. 6, 2022 for U.S. Appl. No. 16/938,734, 15 pages.
Notice of Allowance received for U.S. Appl. No. 16/938,734 dated Dec. 15, 2022, 23 pages.
Non-Final Office Action received for U.S. Appl. No. 17/412,238 dated Dec. 9, 2022, 68 pages.
Notice of Allowance received for U.S. Appl. No. 16/543,276 dated May 13, 2020, 7 pages.
Notice of Allowance received for U.S. Appl. No. 16/543,276 dated Jun. 25, 2020, 7 pages.
Notice of Allowance received for U.S. Appl. No. 16/673,484 dated Jul. 27, 2020, 43 pages.
Notice of Allowance received for U.S. Appl. No. 16/673,484 dated Oct. 21, 2020, 6 pages.
Notice of Allowance received for U.S. Appl. No. 17/081,622 dated May 26, 2022 6 pages.
Final Office Action received for U.S. Appl. No. 17/412,238, dated May 23, 2023, 63 pages.
Notice of Allowance mailed Sep. 1, 2023 for U.S. Appl. No. 17/664,114, 36 pages.
Notice of Allowance mailed Dec. 4, 2023 for U.S. Appl. No. 17/412,238, 60 pages.
International Preliminary Report on Patentability received for PCT Application No. PCT/US2022/012181 dated Sep. 14, 2023, 9 pages.
Chinese Office Action mailed Apr. 24, 2024 for Chinese Application No. 201980076249.1, 13 pages (with translation).
Liu Yan, Hua Siliang, Wang Donghui, Hou Chaohuan. "A Mixed CT-SC Σ-Δ modulator for electret microphone". Microelectronics, Apr. 2009, 39(2). 10 pages (with translation).
Niels Marker-Villumsen, Ivan H. H. Jørgensen and Erik Bruun. "Objective Evaluation of the Audibility of Transient Errors in Anadaptive A/D Conversion Channel" 2014 IEEE International Conference on Acoustic, Speech and Signal Processing (ICASSP), 2014, 5 pages.
Notice of Allowance mailed Apr. 10, 2024 for U.S. Appl. No. 17/412,238, 85 pages.

(56) References Cited

OTHER PUBLICATIONS

Office Action mailed Aug. 28, 2024 for U.S. Appl. No. 17/804,616, 156 pages.

* cited by examiner

```
┌─────────────────────────────────────────────────────────────────┐
│  SWITCH FROM OPERATING A LSPL SIGNAL PATH TO TWO SIGNAL PATHS IN │
│   DSP, COMPRISING A LSPL SIGNAL PATH AND A HSPL SIGNAL PATH      │
│                                                           1302   │
└─────────────────────────────────────────────────────────────────┘
                                 ↓
┌─────────────────────────────────────────────────────────────────┐
│  POWER ON ONE OR MORE COMPONENT OF THE HSPL SIGNAL PATH USING A  │
│ POWER MANAGEMENT COMPONENT CONFIGURED TO MANAGE POWER STATES     │
│   OF COMPONENTS OF THE TWO SIGNAL PATHS IN THE DSP, BASED ON A   │
│ SELECTED TRANSITION OF MODES BASED ON A PERFORMANCE CRITERIA OR A│
│        POWER CONSUMPTION CRITERIA ASSOCIATED WITH A DIFFERENT    │
│     PERFORMANCE CHARACTERISTIC OR POWER CONSUMPTION OF THE LSPL  │
│                         SIGNAL PATH                       1304   │
└─────────────────────────────────────────────────────────────────┘
                                 ↓
┌─────────────────────────────────────────────────────────────────┐
│ SWITCH TO THE HSPL PATH USING THE MULTIPATH DIGITAL AUDIO COMBINER│
│  COMPONENT TO MIX SIGNALS OF THE RESPECTIVE PORTIONS OF LSPL SIGNAL│
│    PATH AND A HSPL SIGNAL PATH AND TO GENERATE THE OUTPUT SIGNAL │
│     BASED ON THE RESPECTIVE PORTION OF THE HSPL SIGNAL PATH AND A│
│  MINIMUM TRANSITION TIME CONFIGURED TO ALLOW THE HSPL SIGNAL PATH│
│                         TO STABILIZE                             │
│                                                           1306   │
└─────────────────────────────────────────────────────────────────┘
                                 ↓
┌─────────────────────────────────────────────────────────────────┐
│     ADJUST GAIN AND BIAS IN THE LSPL SIGNAL PATH USING A POWER   │
│   MANAGEMENT COMPONENT CONFIGURED TO ADJUST GAIN ASSOCIATED IN   │
│ THE LSPL PATH BASED AT LEAST IN PART ON AN ESTIMATED SIGNAL LEVEL IN│
│                      THE HSPL SIGNAL PATH                 1308   │
└─────────────────────────────────────────────────────────────────┘
                                 ↓
┌─────────────────────────────────────────────────────────────────┐
│    ENABLE SWITCHING, USING THE MULTIPATH DIGITAL AUDIO COMBINER  │
│   COMPONENT, FROM OPERATING TWO SIGNAL PATHS IN DSP, COMPRISING A│
│     LSPL SIGNAL PATH AND A HSPL SIGNAL PATH, TO OPERATING ONE, LSPL│
│ SIGNAL PATH, BASED ON THE RESPECTIVE PORTION OF THE LSPL SIGNAL PATH│
│ AND A MINIMUM TRANSITION TIME CONFIGURED TO ALLOW THE LSPL SIGNAL│
│                      PATH TO STABILIZE                    1310   │
└─────────────────────────────────────────────────────────────────┘
```

FIG. 13

MICROPHONE WITH FLEXIBLE PERFORMANCE

PRIORITY CLAIM

This patent application is a continuation-in-part application of patent application Ser. No. 17/412,238, filed Aug. 25, 2021, entitled "MICROPHONE WITH FLEXIBLE PERFORMANCE," which patent application is a Non-Provisional Application that claims priority to U.S. Provisional Patent Application Ser. No. 63/156,219, filed Mar. 3, 2021, entitled "MICROPHONE WITH FLEXIBLE PERFORMANCE," the entirety of which is incorporated by reference herein.

TECHNICAL FIELD

The subject disclosure relates to digital microphones and, more specifically, to multipath digital microphone implementations with enhanced flexibility in performance.

BACKGROUND

Microphones can be exposed to environments where sound levels, described on a log scale using units of decibels of sound pressure level (dB SPL), can range from very quiet (e.g., less than 25 dB SPL) to very loud (e.g., 140 dB SPL). In addition, microphones are typically required to maintain their performance over a large signal range, e.g., up to 120 dB. Simultaneously, microphones are required to exhibit very small intrinsic noise in order to make weak audio signals detectable, while they also need to handle very large audio signals without significant distortion. As a result, such requirements dictate that microphones have a very large dynamic range (DR).

Analog and digital microphones output a voltage or digital output stream, respectively, corresponding to the audio signal sensed by the microphone. The advantage of a digital microphone is that its digital output stream is relatively immune to noise and that an analog-to-digital converter (ADC) is not required to perform digital signal processing on the microphone digital output stream. However, one disadvantage of a digital microphone is that its dynamic range is often lower than what can be achieved with an analog microphone due to constraints in the power consumption that can be allocated to the microphone within many applications.

Conventional solutions for improving DR of a digital microphone can include techniques such as employing one or more of a high DR ADC or employing an automatic gain control amplifier (AGC) which can significantly lower ADC DR requirements while still meeting the desired max SPL and noise floor levels of the overall digital microphone. However, such conventional solutions can require excessively large power consumption and/or introduce troublesome artifacts. Other solutions can require specific analog front ends that are likely to suffer from low signal to noise ratio (SNR) performance or multipath approaches that, due to the combining algorithm can suffer from instantaneous saturation effects.

In addition, the ability to integrate a high DR digital microphone is desirable for implementation in devices such as mobile devices that can be exposed to a variety of widely varying SPL environments. For example, a digital microphone comprising one or more microelectromechanical systems (MEMS) acoustic sensors with a component implementing an algorithm for high DR in complementary metal oxide semiconductor (CMOS) processes can provide a low power, high DR digital microphone suitable for such mobile devices. However, as the demands for consumer electronics trends toward smaller, mobile, and more feature-rich devices, the need for a high DR, digital, feature-rich microphone continues to confront continued demand for smaller and more power efficient devices. Thus, a low-power, high DR ADC remains a challenge to providing high DR, feature-rich, and low-power compact digital microphone.

Moreover, conventional digital microphones with pulse-density modulation (PDM) outputs typically provide two active modes of operation (e.g., high quality mode (HQM) and a low power mode (LPM)), which can be conventionally selected by varying supplied clock frequency. However, many applications can benefit from digital microphones providing a more flexible performance adjustment than just these two conventional modes.

It is thus desired to provide high dynamic range digital microphones that improve upon these and other deficiencies. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, exemplary devices, systems, and methods provide flexible performance, high dynamic range, MEMS multipath digital microphones, which allow seamless, low latency transitions between audio signal paths without audible artifacts or interruptions in the audio output signal. Disclosed embodiments facilitate performance and power saving mode transitions maintaining high dynamic range capability Accordingly, an exemplary apparatus can comprise a gain adjustment component associated with a MEMS acoustic sensor or microphone DSP configured to adjust respective gains associated with adjustable ADCs in multiple signal paths of the DSP on respective signal levels in the signal paths. In addition, an exemplary apparatus can further comprise a multipath digital audio combiner component configured to compensate for gain imbalance among the signal paths to generate an output signal based on the signal paths. Furthermore, an exemplary apparatus can further comprise a power management component configured to manage power states associated with components of the signal paths of the MEMS acoustic sensor based on a selected transition of modes based on one or more of a performance criteria or a power consumption criteria, as further described herein.

In a further non-limiting aspect, exemplary methods and systems associated with multipath digital microphone systems are described.

These and other embodiments are described in more detail below.

BRIEF DESCRIPTION OF THE DRAWINGS

Various non-limiting embodiments are further described with reference to the accompanying drawings, in which:

FIG. 13 depicts another exemplary flowchart of further non-limiting methods associated with various non-limiting embodiments of the subject disclosure;

DETAILED DESCRIPTION

Figure 1:
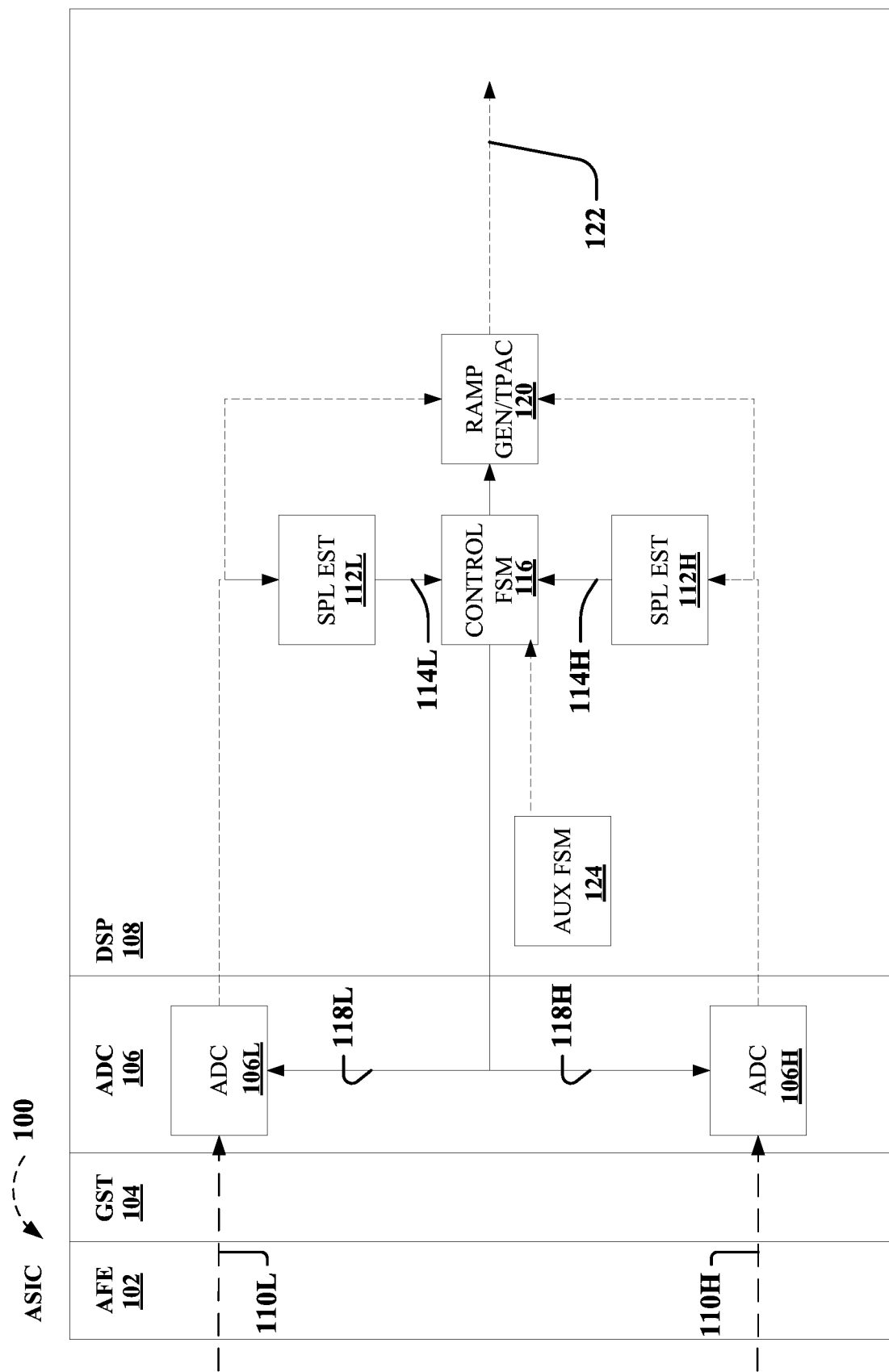
FIG. 1 depicts a functional block diagram of an exemplary embodiment demonstrating various non-limiting aspects of the subject disclosure.

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

As the demands for consumer electronics trends toward smaller, mobile and more feature-rich devices, the need for a high DR, digital, feature-rich microphone continues to confront continued demand for smaller and more power efficient devices.

A dual-path based system utilizing automatic gain control (AGC) can provide inaudible switching between the signal paths and acceptable die area occupation with low power consumption, without audible artifacts when switching between the two paths. As a non-limiting example, U.S. Non-Provisional patent application Ser. No. 16/543,276, filed Aug. 16, 2019, entitled, "METHOD FOR IMPROVING DIE AREA AND POWER EFFICIENCY IN HIGH DYNAMIC RANGE DIGITAL MICROPHONES," describes high DR multipath digital microphones employing automatic gain control (AGC) which minimize audible artifacts associated with either the change in the gain automatic gain control amplifiers switching between multipath digital audio signal digital signal processing chains, the entirety of which is incorporated by reference herein.

Similarly, multipath based systems utilizing adaptive ADC range ADCs can provide inaudible switching between the signal paths and acceptable die area occupation with low power consumption, without audible artifacts when switching between the paths. As a non-limiting example, U.S. Non-Provisional patent application Ser. No. 16/673,484, filed Nov. 4, 2019, entitled, "ADAPTIVE ANALOG TO DIGITAL CONVERTER (ADC) MULTIPATH DIGITAL MICROPHONES," describes high DR multipath digital microphones employing adaptive ADC range ADCs, and which minimize audible artifacts associated with the change in the gain of the adaptive ADCs, the entirety of which is incorporated by reference herein.

However, as described above, conventional digital microphones with PDM outputs typically provide two active modes of operation (e.g., HQM and LPM), which can be conventionally selected by varying supplied clock frequency. However, many applications may benefit from digital microphones providing a more flexible performance adjustment than just these two modes. In a non-limiting aspect, applications that can benefit from exemplary flexible performance digital microphones, systems, and methods that provide more than just two modes (e.g., HQM and LPM) can take advantage of a lower power mode at the clock frequency normally used for HQM, by trading off some performance parameters, such as SNR or acoustic overload point (AOP) for the lower power consumption, as provided herein. In another non-limiting aspect, applications that can benefit from exemplary flexible performance digital microphones, systems, and methods that provide more than just two modes (e.g., HQM and LPM) can take advantage of a lower power mode (e.g., an ultra low power mode (ULPM)), that could reduce power consumption of the microphone at the clock frequency normally used for LPM, as provided herein.

According to various described embodiments, the subject disclosure provides exemplary flexible performance digital microphones, systems, and methods for multipath digital microphones. In non-limiting aspects, exemplary embodiments can comprise exemplary flexible performance digital microphones, systems, and methods that facilitate turning on and off a signal path (e.g., in a dual path digital microphone), modifying gain and supply current in the signal paths in such a way that an optimum trade-off between key performance parameters such as SNR, AOP, power consumption, and/or other performance parameters can be achieved for a given application. In further non-limiting aspects, exemplary embodiments can comprise exemplary flexible performance digital microphones, systems, and methods that facilitate seamless (e.g., inaudible) transition between two operational modes (e.g., full dynamic range (FDR) mode reduced dynamic range (RDR), reduced power mode), with the transition having no interruptions in audio being experienced. In addition, in other non-limiting aspects, exemplary embodiments can comprise exemplary flexible performance digital microphones, systems, and methods that facilitate low latency, seamless transitions (e.g., between FDR mode and RDR, reduced power mode) as a result of the provided exemplary digital implementations that provide such transitions without problematic filtering. In another non-limiting aspect, exemplary embodiments described herein can facilitate RDR with reduced power by powering only a low sound pressure level (LSPL) signal path, as further described herein. In addition, in further non-limiting embodiments, gains of a selected and powered signal path (e.g. LSPL signal path) can be adjusted (e.g., via an exemplary power management component or auxiliary finite state machine) in order to facilitate FDR implementations with reduced power, while facilitating better SNR than a high sound pressure level (HSPL) signal path, as further described herein. In still further non-limiting aspects, while power reductions can be achieved by switching off one of the paths (e.g., LSPL signal path or HSPL signal path), further power reductions can be facilitated by reducing supplied current to one or more components in the selected and powered signal path, as further described herein.

In further non-limiting aspects, exemplary embodiments can comprise exemplary flexible performance digital microphones, systems, and methods that facilitate selection of the various modes of operation via a One Wire Communication Interface (OWCI) protocol, e.g., selected by the left-right SELECT pin of the microphone, in a non-limiting embodiment. As a non-limiting example, U.S. Non-Provisional patent application Ser. No. 16/673,484, filed Jun. 13, 2014, entitled, "MICROELECTROMECHANICAL SYSTEMS SENSOR CONTROL INTERFACE," describes control interfaces that facilitate control of a MEMS sensor over an existing pin of a package, which can employ read/write protocols that enable reading and/or writing internal registers associated with MEMS sensors, the entirety of which is incorporated by reference herein.

Thus, exemplary embodiments comprising exemplary flexible performance digital microphones, systems, and methods as provided where can facilitate entering power saving modes without interrupting the streaming of the audio signal from the exemplary flexible performance digital microphones. Moreover, exemplary embodiments comprising exemplary flexible performance digital microphones, systems, and methods can facilitate providing and/or entering further power saving modes, which can be facilitated by seamlessly shutting down one of the signal paths without any resulting audible artifacts and without interruption of the audio signal via the exemplary flexible performance digital microphones, in addition to further power saving modes enabled by varying supplied clock frequency.

For instance, in further non-limiting aspects, exemplary embodiments can comprise exemplary flexible performance digital microphones, systems, and methods that facilitate turning off one of the two paths, and/or portions thereof, which can facilitate further power reductions, trading off performance parameters of the exemplary flexible performance digital microphones (e.g., SNR and/or AOP). In still other non-limiting aspects, exemplary embodiments can comprise exemplary flexible performance digital microphones, systems, and methods that facilitate keeping the clock frequency and sensitivity of the microphone the same, via appropriate switching of the biasing and gain in the signal paths, while providing transitions between different performance modes without any audible artifacts.

FIG. 1 depicts a functional block diagram of an exemplary embodiment demonstrating various non-limiting aspects of the subject disclosure. For instance, FIG. 1 depicts an exemplary application specific integrated circuit (ASIC) 100 associated with a MEMS acoustic sensor or microphone (not shown). In non-limiting aspects, exemplary ASIC 100 can comprise one or more of audio front end (AFE) 102, gain stage (GST) 104, adjustable ADCs 106, and/or exemplary digital signal processor (DSP) 108, for example, as further described herein regarding FIGS. 2-6.

In discussions of the various figures, it should be understood that where one signal path of the signal paths 110 (e.g., low sound pressure level (LSPL) signal path 110L, high sound pressure level (HSPL) signal path 110H) and/or portions or components thereof are discussed, where the components are named or numbered similarly, the same discussion applies equally to similarly named or numbered components in the LSPL and HSPL signal paths, except where context or explicit distinction is made otherwise. Thus, where reference characters are appended with "L" or "H," herein, such references are understood to apply to the LSPL and HSPL signal paths 110, respectively.

In further non-limiting aspects, exemplary ASIC 100 can comprise or be associated with one or more of signal paths 110 (e.g., LSPL signal path 110L, HSPL signal path 110H) associated with the MEMS acoustic sensor or microphone (not shown). In another non-limiting aspect, the one or more signal paths 110 (e.g., LSPL signal path 110L, HSPL signal path 110H) of the MEMS acoustic sensor or microphone have different gains, for example, as further described herein regarding FIGS. 3-6.

Exemplary embodiments of ASIC 100 can further comprise or be associated with a DSP 108 configured to receive one or more of the signals from the one or more adjustable ADCs 106 associated with the one or more signal paths 110 (e.g., LSPL signal path 110L, HSPL signal path 110H) associated with the MEMS acoustic sensor or microphone (not shown). In a further non-limiting aspect, the one or more adjustable ADCs 106 can comprise sigma delta modulator ADCs configured to improve quantization noise for small signals, e.g., by amplifying the signal before converting the analog signal to digital.

Figure 2:
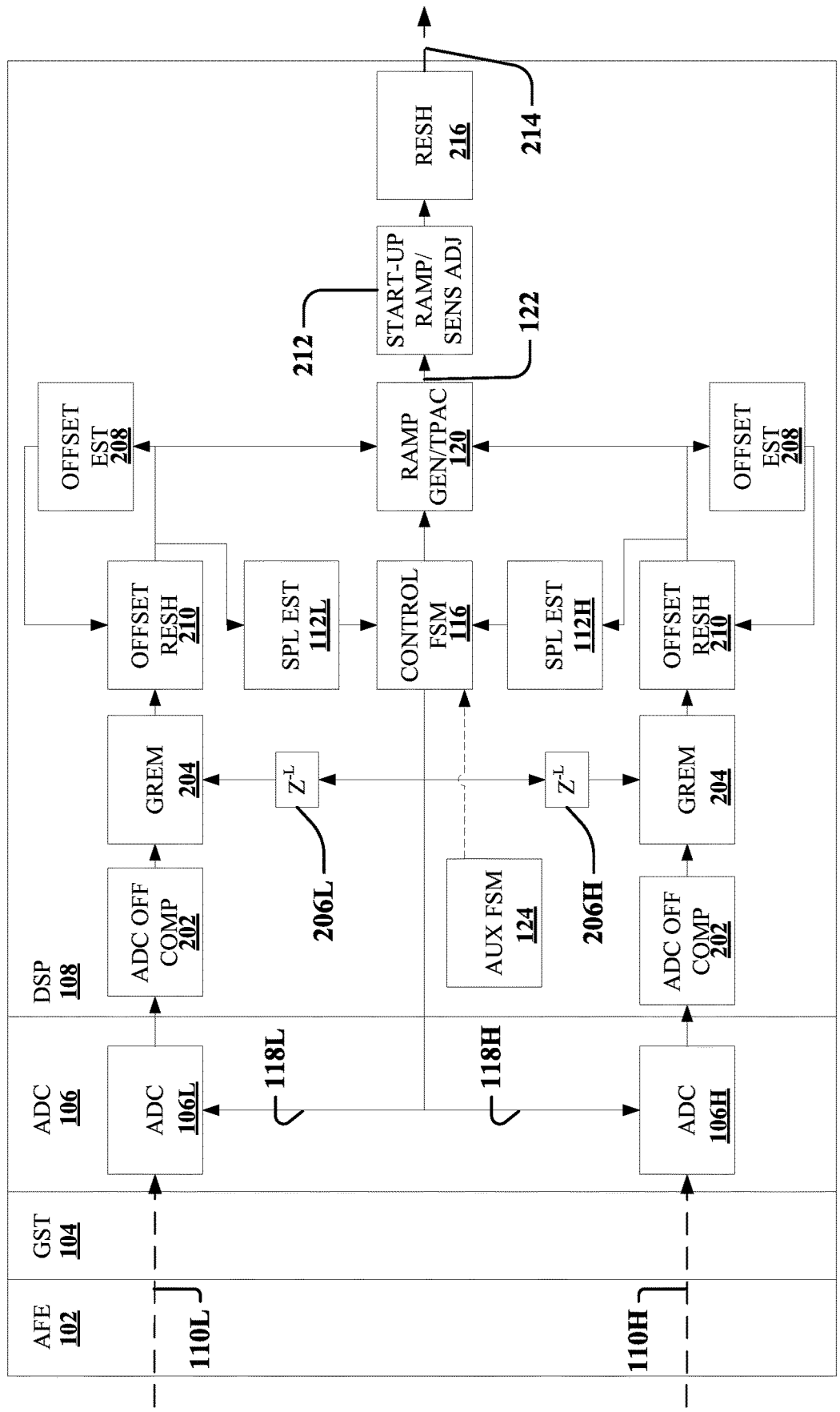
FIG. 2 depicts a functional block diagram of an exemplary flexible performance digital microphone system, demonstrating further non-limiting aspects of the subject disclosure.
Figure 3:
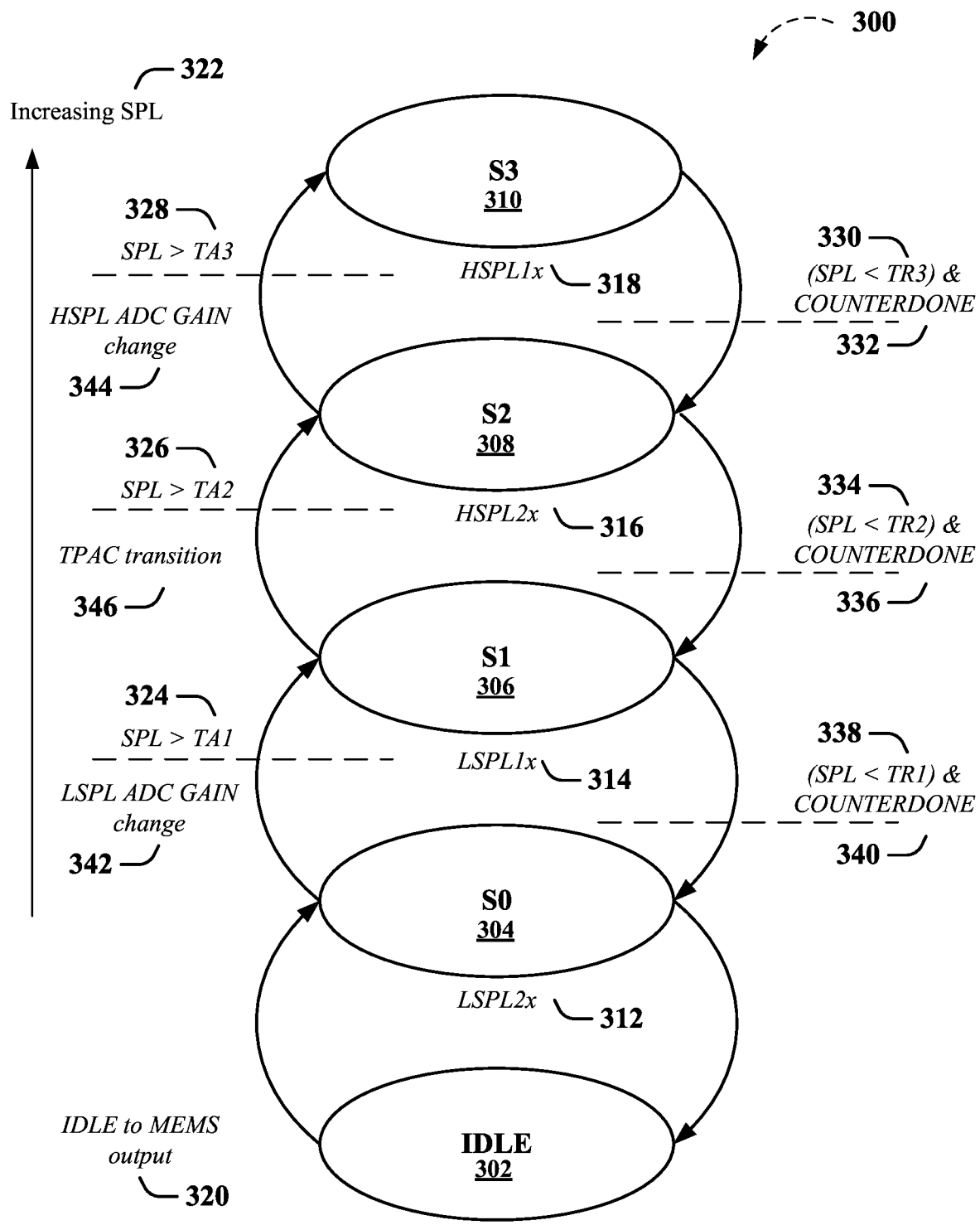
FIG. 3 depicts a non-limiting state diagram of an exemplary flexible performance digital microphone system comprising a gain adjustment component configured to coordinate switching among signal paths based on signal levels and a selected state transition, according to further aspects of the subject disclosure.

In addition, exemplary embodiments of ASIC 100 can further comprise or be associated with one or more signal or sound pressure level estimation components (SPL EST) 112 (e.g., LSPL signal path SPL estimation 112L, HSPL signal path SPL estimation 112H) associated with the DSP 108, which can be configured to estimate respective signal levels 114 (e.g., LSPL signal level 114L, HSPL signal level 114H) associated with at least respective portions of the one or more signal paths 110 (e.g., LSPL signal path 110L, HSPL signal path 110H) of the MEMS acoustic sensor or microphone (not shown), for example, as further described herein regarding FIGS. 2-3.

Figure 4:
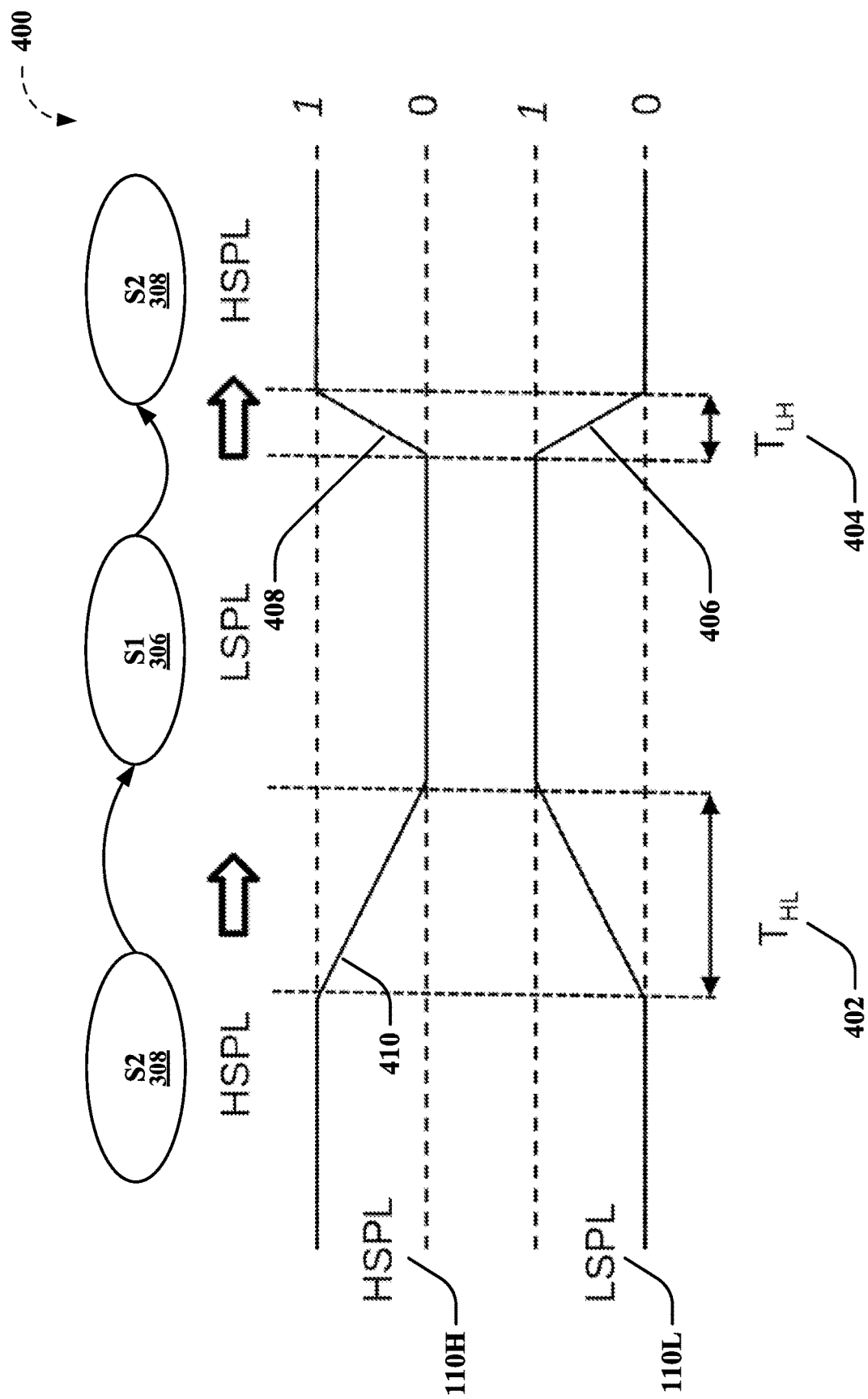
FIG. 4 depicts exemplary aspects of signal path mixing during selected state transitions, according to further aspects of the subject disclosure.

Further non-limiting embodiments of ASIC 100 can comprise or be associated with a gain adjustment component or control finite state machine (CTRL FSM) 116 associated with the DSP 108 configured to adjust respective gains 118 (e.g., LSPL ADC gain 118L, HSPL ADC gain 118H) associated with the one or more adjustable ADCs 106 based at least in part on the respective signal levels 114 (e.g., LSPL signal level 114L, HSPL signal level 114H), for example, further described herein regarding FIGS. 3-4. In a further non-limiting aspect, the one or more signal or sound pressure level estimation components (SPL EST) 112 (e.g., LSPL signal path SPL estimation 112L, HSPL signal path SPL estimation 112H) associated with the DSP 108 are configured to provide the sound pressure level estimations for their respective paths (e.g., incoming signal amplitude) to the gain adjustment component or control finite state machine (CTRL FSM) 116 associated with the DSP 108.

Other non-limiting embodiments of ASIC 100 can comprise or be associated with a multipath digital audio combiner component or ramp generation and two-path audio combine (RAMP GEN/TPAC) 120 associated with the DSP 108 configured to compensate for gain imbalance among the at least respective portions of the one or more signal paths 110 (e.g., LSPL signal path 110L, HSPL signal path 110H) of the MEMS acoustic sensor or microphone to generate an output signal (e.g., DSP output signal 122)), for example, further described herein regarding FIGS. 2-6. It is understood that while signal path 110L and signal path 110H are annotated in the figures in the AFE 102 portion of exemplary ASIC 100, the terms, signal path 110L and signal path 110H, refer to the entire signal path from the MEMS acoustic sensor or microphone (not shown) to the respective nodes leading to the one or more signal or sound pressure level estimation components (SPL EST) 112 (e.g., LSPL signal path SPL estimation 112L, HSPL signal path SPL estimation 112H) and the multipath digital audio combiner component or ramp generation and two-path audio combine (RAMP GEN/TPAC) 120. In yet another non-limiting aspect, multipath digital audio combiner component or ramp generation and two-path audio combine (RAMP GEN/TPAC) 120 associated with the DSP 108 can be further configured to compensate for gain imbalance among HSPL signal path 110H and LPSL signal path 110L and mixing of the HSPL signal path 110H and LPSL signal path 110L during two-path combination handover, for example, as further described herein regarding FIGS. 3-6.

In still other non-limiting embodiments, exemplary ASIC 100 can comprise or be associated with a power management component or auxiliary finite state machine (AUX FSM) 124 associated with the DSP 108 configured to manage power states associated with components associated with the one or more signal paths 110 (e.g., LSPL signal path 110L, HSPL signal path 110H) of the MEMS acoustic sensor or microphone based at least in part on a selected transition of modes based at least in part on at least one of a performance criteria or a power consumption criteria, for example, further described herein regarding FIGS. 2-6. As further described herein regarding FIGS. 3-6, gain adjustment component or control finite state machine (CTRL FSM) 116, together with power management component or auxiliary finite state machine (AUX FSM) 124, can be configured to manage gain change operations for the one or more adjustable ADCs 106 associated with the one or more signal paths 110 (e.g., LSPL signal path 110L, HSPL signal path 110H) and two-path combine operations of the multipath digital audio combiner component or ramp generation and two-path audio combine (RAMP GEN/TPAC) 120, according to sound pressure level estimations for their respective paths (e.g., incoming signal amplitude) provided by the one or more signal or sound pressure level estimation components (SPL EST) 112 (e.g., LSPL signal path SPL estimation 112L, HSPL signal path SPL estimation 112H). Further discussion of management component or auxiliary finite state machine (AUX FSM) 124 associated with the DSP 108 configured to manage power states associated with components associated with the one or more signal paths 110 (e.g., LSPL signal path 110L, HSPL signal path 110H) management of transitions of modes between FDR mode to RDR, reduced power mode, and back are provided below regarding FIGS. 5-6.

FIG. 2 depicts a functional block diagram of an exemplary flexible performance digital microphone system, demonstrating further non-limiting aspects of the subject disclosure. For instance, FIG. 2 depicts an exemplary application specific integrated circuit (ASIC) 200 associated with a MEMS acoustic sensor or microphone (not shown). In non-limiting aspects, exemplary ASIC 100/200 can comprise one or more of audio front end (AFE) 102, gain stage (GST) 104, adjustable ADCs 106, and/or exemplary digital signal processor (DSP) 108, for example, as further described herein regarding FIGS. 1 and 3-6. As described above, where one signal path of the signal paths 110 (e.g., LSPL signal path 110L, HSPL signal path 110H) and/or portions or components thereof are discussed, where the components are named or numbered similarly, the same discussion applies equally to similarly named or numbered components in the LSPL and HSPL signal paths, except where context or explicit distinction is made otherwise. Thus, where reference characters are appended with "L" or "H," herein, such references are understood to apply to the LSPL and HSPL signal paths 110, respectively.

Thus, in further non-limiting aspects, exemplary ASIC 100/200 can comprise or be associated with one or more of signal paths 110 (e.g., LSPL signal path 110L, HSPL signal path 110H) associated with the MEMS acoustic sensor or microphone (not shown). In another non-limiting aspect, the one or more signal paths 110 (e.g., LSPL signal path 110L, HSPL signal path 110H) of the MEMS acoustic sensor or microphone have different gains, for example, as further described herein regarding FIGS. 1 and 3-6.

Accordingly, exemplary embodiments of ASIC 100/200 can further comprise or be associated with one or more offset remover components or ADC offset compensation component (ADC OFF COMP) 202 configured to remove offset associated with respective signals of the one or more signals from the one or more adjustable ADCs 106. For instance, in a non-limiting aspect, the one or more offset remover components or ADC offset compensation component (ADC OFF COMP) 202 can be configured to compensate for the static offset due to the ADC quantizer of respective adjustable ADCs 106.

In addition, exemplary embodiments of ASIC 100/200 can further comprise or be associated with one or more glitch removal components (GREM) 204 associated with the one or more offset remover components or ADC offset compensation component (ADC OFF COMP) 202. As a non-limiting example, the one or more glitch removal components (GREM) 204 can be configured to compensate for adjustments in respective gains 118 (e.g., LSPL ADC gain 118L, HSPL ADC gain 118H) associated with the one or more adjustable ADCs 106. Accordingly, in a further non-limiting embodiment, exemplary glitch removal components (GREM) 204 can be further configured for glitch removal associated with the adjustments in respective gains 118 (e.g., LSPL ADC gain 118L, HSPL ADC gain 118H) associated with the one or more adjustable ADCs 106 and associated compensation for adjustments in respective gains 118 (e.g., LSPL ADC gain 118L, HSPL ADC gain 118H) associated with the one or more adjustable ADCs 106. As a non-limiting example, as further described herein regarding FIGS. 3-4, exemplary glitch removal components (GREM) 204 can be configured to compensate for the gain change of the one or more adjustable ADCs 106 and remove attendant glitches, thereby mitigating their effects. As a further non-limiting example, as described below regarding FIG. 3, proceeding from a State S0 to State S1, if gain of the LSPL signal path 110L adjustable ADC 106L changes from +6 (deciBel) dB (2×) to 0 dB (1×), exemplary glitch removal component (GREM) 204 can be configured to employ the fact of the gain change operation in adjustable ADC 106L to compensate for the adjustable ADC 106L gain change to adequately compensate for such gain change, after a predetermined delay $Z^{-L}$ 206L (e.g., a predetermined amount of clock cycles), which accounts for the delay between the adjustable ADC 106L gain change and exemplary glitch removal component (GREM) 204 in the LSPL signal path 110L (e.g., delay due to the ADC 106L gain change and offset remover component or ADC offset compensation component (ADC OFF COMP) 202 in the LSPL signal path 110L).

In addition, exemplary embodiments of ASIC 100/200 can further comprise or be associated with one or more offset estimation components (OFFSET EST) 208 configured to estimate offset associated with the at least respective portions of the one or more signal paths 110 (e.g., LSPL signal path 110L, HSPL signal path 110H) of the MEMS acoustic sensor or microphone (not shown).

Further non-limiting embodiments of ASIC 100/200 can comprise or be associated with one or more first signal reshaping components or offset reshaper (OFFSET RESH) 210 configured to subtract offset associated with the at least respective portions of the one or more signal paths 110 (e.g., LSPL signal path 110L, HSPL signal path 110H) of the MEMS acoustic sensor or microphone and reduce bit size in the at least respective portions of the one or more signal paths 110 (e.g., LSPL signal path 110L, HSPL signal path 110H) of the MEMS acoustic sensor or microphone.

In a non-limiting embodiment, the one or more offset estimation components (OFFSET EST) 208 can be configured to estimate offset to be subtracted to the signal paths 110 (e.g., LSPL signal path 110L, HSPL signal path 110H) inside the one or more first signal reshaping components or offset reshaper (OFFSET RESH) 210. In a non-limiting aspect, the one or more offset estimation components (OFFSET EST) 208 can be configured to estimate offset due to the entire analog portions of the signal paths 110 (e.g., LSPL signal path 110L, HSPL signal path 110H) (e.g., including that resulting from components of the AFE 102 and GST 104) to be compensated in the one or more first signal reshaping components or offset reshaper (OFFSET RESH) 210. In another non-limiting aspect, the one or more offset estimation components (OFFSET EST) 208 can be configured to can be configured to employ a least mean square adaptive filter, which can facilitate tracking the low frequency content of the signal in the signal paths 110 (e.g., LSPL signal path 110L, HSPL signal path 110H) and for cancellation or compensation in the one or more first signal reshaping components or offset reshaper (OFFSET RESH) 210.

In a further non-limiting embodiment, the one or more first signal reshaping components or offset reshaper (OFFSET RESH) 210 can be configured to reshape signal by employing a third-order error feedback reshaper, and which can be further configured to reduce bit size following the offset cancellation or compensation, (e.g., reduce bit size from 3 bit out of adjustable ADC 106 and finer resolution out of offset remover component or ADC offset compensation component (ADC OFF COMP) 202 and glitch removal component (GREM) 204, which would negatively impact die area and power consumption) to 1 bit.

Other non-limiting embodiments of ASIC 100/200 can comprise or be associated with a signal smoothing component or start-up ramp and sensitivity adjustment (START-UP RAMP & SENS ADJ) 212 configured to smooth the output signal (e.g., DSP output signal 122). In another non-limiting aspect, exemplary signal smoothing component or start-up ramp and sensitivity adjustment (START-UP RAMP & SENS ADJ) 212 can be further configured adjust gain associated with the output signal (e.g., DSP output signal 122). Thus, in non-limiting embodiments, exemplary signal smoothing component or start-up ramp and sensitivity adjustment (START-UP RAMP & SENS ADJ) 212 can facilitate smoothing the output signal (e.g., DSP output signal 122) at start-up to avoid pop, click, or other transient start-up related noise artifacts, and can facilitate gain adjustments at the output signal (e.g., DSP output signal 122) to meet sensitivity requirement (e.g., via a digital sigma delta modulator providing fine digital adjustment control of gain of the output signal (e.g., DSP output signal 122) due to any non-linearities in the entire signal/data path gain.

In still other non-limiting embodiments, exemplary ASIC 100/200 can comprise or be associated with a second signal reshaping component (RESH) 216 configured to provide a PDM signal (e.g., MEMS ASIC output signal 214) based at least in part on the output signal (e.g., DSP output signal 122). In a non-limiting aspect, exemplary second signal reshaping component (RESH) 216 can facilitate signal reshaping to producing single bit PDM stream out (e.g., via a digital sigma delta modulator, PDM modulator). In another non-limiting aspect, exemplary second signal reshaping component (RESH) 216 can comprise a bit scrambler, which can pseudo randomize the output, according to a predetermined scrambling/descrambling or encoding/decoding scheme.

In further non-limiting embodiments, exemplary ASIC 100/200 can comprise or be associated with the exemplary multipath digital audio combiner component or ramp generation and two-path audio combine (RAMP GEN/TPAC) 120 that can be further configured to mix signals associated with the at least respective portions of the one or more signal paths 110 (e.g., LSPL signal path 110L, HSPL signal path 110H) of the MEMS acoustic sensor or microphone based at least in part on switching control of the gain adjustment component or control finite state machine (CTRL FSM) 116, for example, as further described herein regarding FIGS. 3-4. As a non-limiting example, a first signal path (e.g., LSPL signal path 110L) of the one or more signal paths 110 (e.g., LSPL signal path 110L, HSPL signal path 110H) of the MEMS acoustic sensor or microphone can be associated with a first power consumption and a first performance level (e.g., relatively low power or reduced power, reduced DR), wherein a second signal path (e.g., HLSPL signal path 110H) of the one or more signal paths 110 (e.g., LSPL signal path 110L, HSPL signal path 110H) of the MEMS acoustic sensor or microphone can be associated with a second power consumption and a second performance level (e.g., relatively high power or increased power, increased DR), and wherein at least one of the first power consumption or the first performance level (e.g., relatively low power or reduced power, reduced DR) can be less than a respective one of the second power consumption or the second performance level (e.g., relatively high power or increased power, increased DR), as further described herein regarding FIGS. 5-6.

Figure 5:
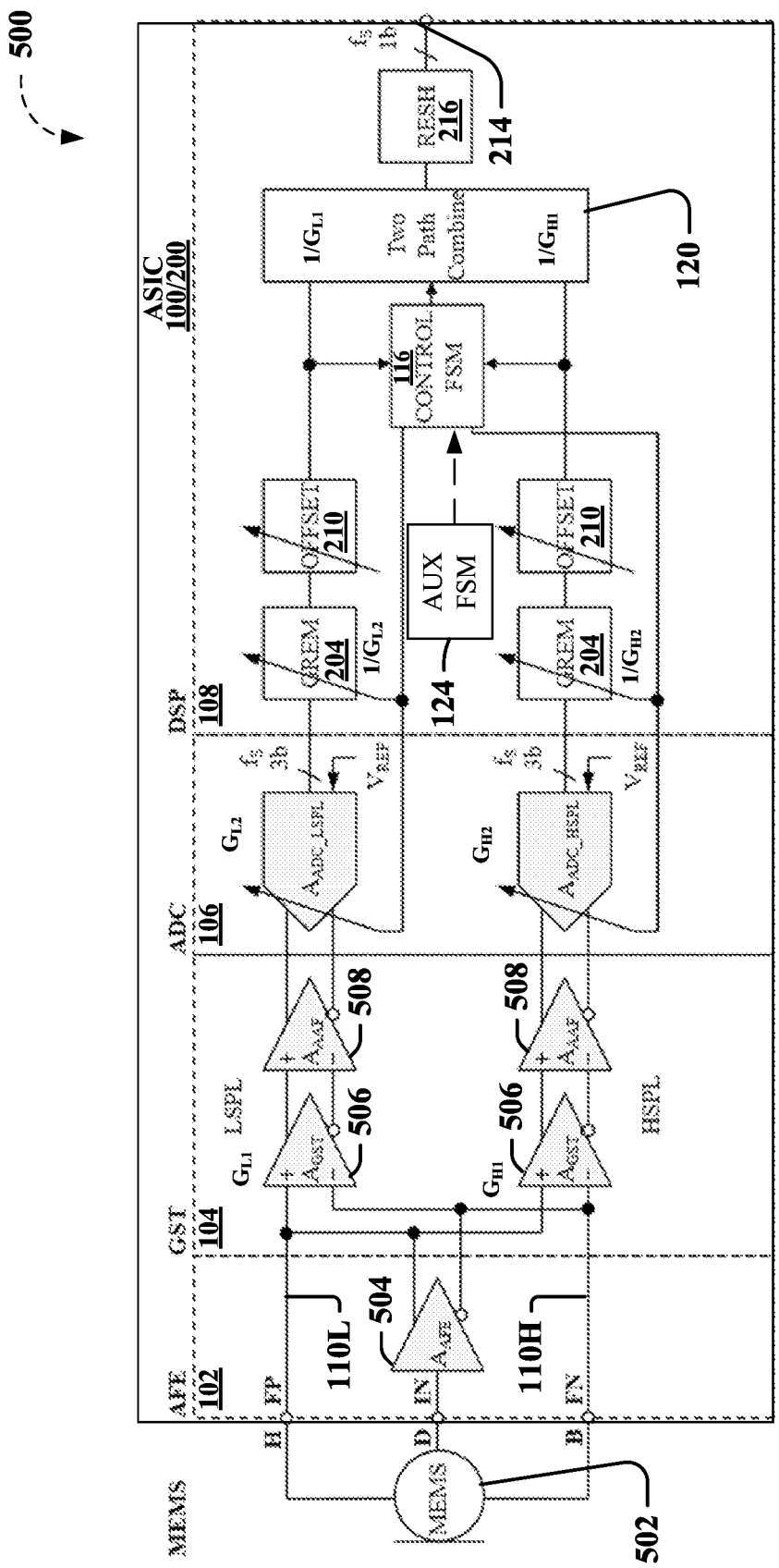
FIG. 5 depicts a functional block diagram of an exemplary flexible performance digital microphone system in a full dynamic range (FDR) mode, demonstrating further non-limiting aspects of the subject disclosure.
Figure 6:
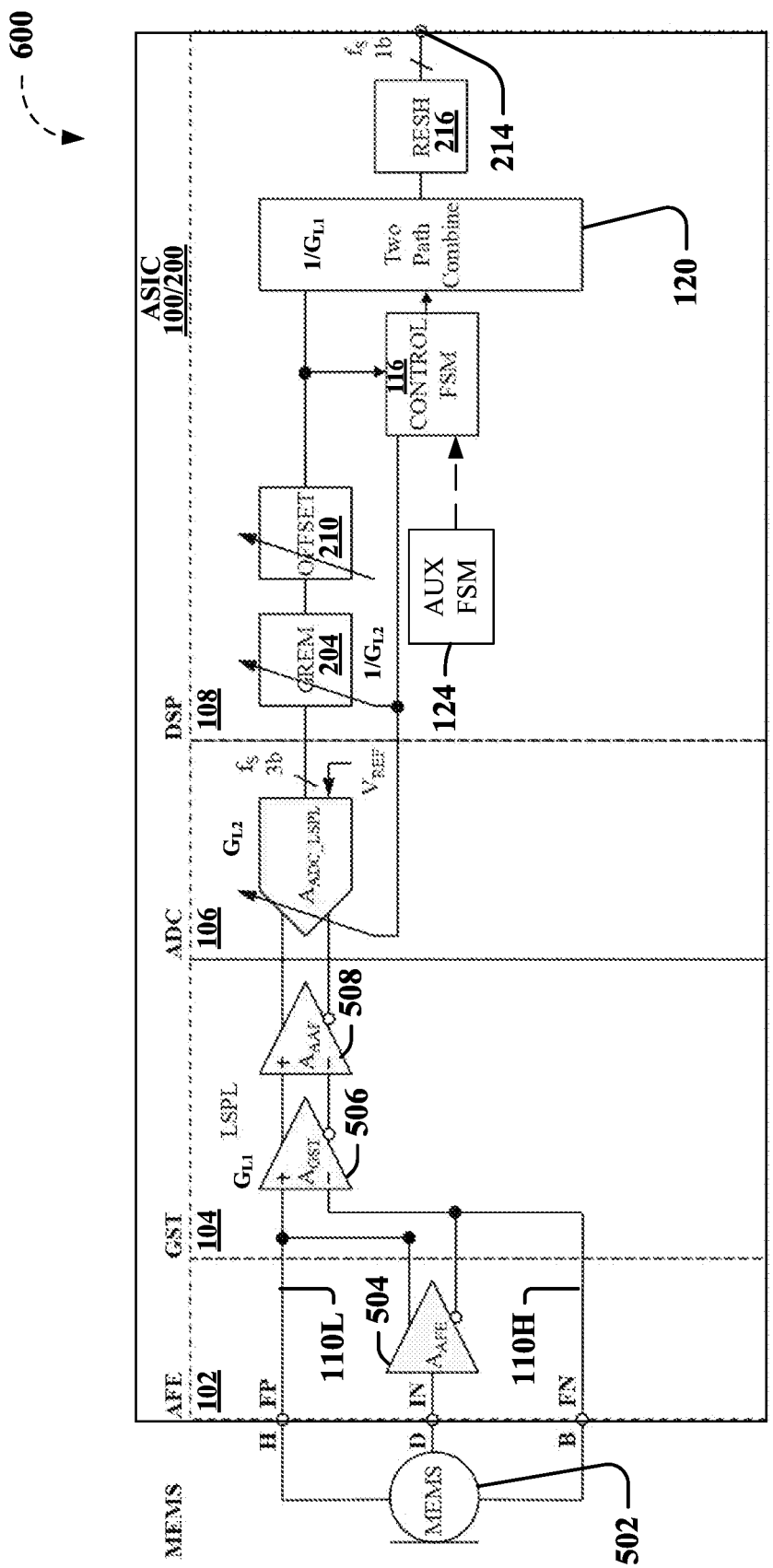
FIG. 6 depicts a functional block diagram of an exemplary flexible performance digital microphone system in a reduced dynamic range (RDR), reduced power mode, demonstrating further non-limiting aspects of the subject disclosure.

As further described herein regarding FIG. 5-6, various disclosed embodiments can comprise the exemplary DSP 108 further configured to at least one of switch from operating the one or more signal paths 110 (e.g., LSPL signal path 110L, HSPL signal path 110H) of the MEMS acoustic sensor or microphone to a single signal path or switch from operating the single signal path to the one or more signal paths 110 (e.g., LSPL signal path 110L, HSPL signal path 110H) of the MEMS acoustic sensor or microphone, wherein the one or more signal paths 110 (e.g., LSPL signal path 110L, HSPL signal path 110H) of the MEMS acoustic sensor or microphone comprises at least a HSPL signal path 110H and a LSPL signal path 110L, and wherein the HSPL signal path 110H can be characterized at least in part by having at least one of a different performance characteristic (e.g., DR, SNR) or power characteristic (e.g., power consumption, supply voltage, clock frequency, and so on) relative to the LSPL signal path 110L, and wherein the single signal path comprises the LSPL signal path 110L.

As a non-limiting example, exemplary DSP 108 can be further configured to switch to the HSPL signal path 110H using the multipath digital audio combiner component or ramp generation and two-path audio combine (RAMP GEN/TPAC) 120, adjust gain and biasing in the LSPL signal path 110L using the exemplary power management component or auxiliary finite state machine (AUX FSM) 124, switch to the LSPL signal path 110L using the multipath digital audio combiner component or ramp generation and two-path audio combine (RAMP GEN/TPAC) 120 further configured to generate the output signal (e.g., DSP output signal 122) based at least in part on a respective portion of the LSPL signal path 110L and a minimum transition time configured to allow the respective portion of the LSPL signal path 110L to stabilize, and power off at least one component associated with the HSPL signal path 110H using the power management component or auxiliary finite state machine (AUX FSM) 124 configured, based at least in part on the selected transition, as further described herein regarding FIGS. 5-6.

In a further non-limiting example, exemplary DSP 108 can be further configured to switch to the HSPL signal path 110H using the multipath digital audio combiner component or ramp generation and two-path audio combine (RAMP GEN/TPAC) 120, adjust gain and biasing in the LSPL signal path 110L using the exemplary power management component or auxiliary finite state machine (AUX FSM) 124, switch to the LSPL signal path 110L using the multipath digital audio combiner component or ramp generation and two-path audio combine (RAMP GEN/TPAC) 120 further configured to generate the output signal (e.g., DSP output signal 122) based at least in part on a respective portion of the LSPL signal path 110L and a minimum transition time configured to allow the respective portion of the LSPL signal path 110L to stabilize, and power off at least one component associated with the HSPL signal path 110H using the power management component or auxiliary finite state machine (AUX FSM) 124 configured, based at least in part on the selected transition, as further described herein regarding FIGS. 5-6.

FIG. 3 depicts a non-limiting state diagram 300 of an exemplary flexible performance digital microphone system comprising a gain adjustment component (e.g., exemplary gain adjustment component or control finite state machine (CTRL FSM) 116) configured to coordinate switching among signal paths 110 (e.g., LSPL signal path 110L, HSPL signal path 110H) based on signal levels (e.g., respective signal levels 114 (e.g., LSPL signal level 114L, HSPL signal level 114H)) and a selected state transition, according to further aspects of the subject disclosure.

Thus, FIG. 3 depicts various states, State Idle 302, State S0 304, State S1 306, State S2 308, and State S3 310, operations to prepare signals for outputs and their state transitions, which states represent the steady state of the signal coming from the exemplary MEMS acoustic sensor or microphone with respect to the status of the various components of exemplary ASIC 100/200 and their effect on or state of the output signal. For instance, State S0 304 represents that the components of exemplary ASIC 100/200, such that the signal is being supplied by the LSPL signal path SPL 110L with 2× gain 312 (e.g., +6 dB), when the one or more signal or sound pressure level estimation components (SPL EST) 112 (e.g., LSPL signal path SPL estimation 112L, HSPL signal path SPL estimation 112H) associated with the DSP 108 estimates a relatively low incoming signal amplitude (e.g., low SPL). In a further example, State S1 306 represents that the components of exemplary ASIC 100/200, such that the signal is being supplied by the LSPL signal path SPL 110L with 1× gain 314 (e.g., 0 dB), when the one or more signal or sound pressure level estimation components (SPL EST) 112 (e.g., LSPL signal path SPL estimation 112L, HSPL signal path SPL estimation 112H) associated with the DSP 108 estimates a relatively higher incoming signal amplitude (e.g., high SPL), based on predetermined thresholds as further described herein.

State S2 308 represents that the components of exemplary ASIC 100/200, such that the signal is being supplied by the HSPL signal path SPL 110H with 2× gain 316 (e.g., +6 dB), when the one or more signal or sound pressure level estimation components (SPL EST) 112 (e.g., LSPL signal path SPL estimation 112L, HSPL signal path SPL estimation 112H) associated with the DSP 108 estimates an even higher incoming signal amplitude (e.g., higher SPL), based on predetermined thresholds as further described herein.

State S3 310 represents that the components of exemplary ASIC 100/200, such that the signal is being supplied by the HSPL signal path SPL 110H with 2× gain 318 (e.g., 0 dB), when the one or more signal or sound pressure level estimation components (SPL EST) 112 (e.g., LSPL signal path SPL estimation 112L, HSPL signal path SPL estimation 112H) associated with the DSP 108 estimates an even higher incoming signal amplitude (e.g., highest SPL), based on predetermined thresholds as further described herein.

State Idle 302, represents that the components of exemplary ASIC 100/200 are idle to MEMS output 320, when the exemplary MEMS acoustic sensor microphone is not operating.

Each of these states (except State Idle 302) can be set based on the one or more signal or sound pressure level estimation components (SPL EST) 112 (e.g., LSPL signal path SPL estimation 112L, HSPL signal path SPL estimation 112H) associated with the DSP 108 estimates of the incoming signal amplitude. Thus, as the estimates of the incoming signal amplitude from the one or more signal or sound pressure level estimation components (SPL EST) 112 (e.g., LSPL signal path SPL estimation 112L, HSPL signal path SPL estimation 112H) show incoming signal amplitude or SPL 322 increasing in State S0 304, exemplary gain adjustment component or control finite state machine (CTRL FSM) 116 associated with the DSP 108 can facilitate transition through State S1 306, State S2 308, and State S3 310, as further described herein. Similarly, decreasing incoming signal amplitude or SPL 322 can be facilitated by transition from State S3 310 to State S2 308, State S1 306, and State S0 304, as further described herein.

In further non-limiting aspects, a set of thresholds for incoming signal amplitude or SPL (e.g., increasing SPL (attack) and decreasing SPL (release)) can be predetermined to enable exemplary gain adjustment component or control finite state machine (CTRL FSM) 116 associated with the DSP 108 to facilitate management of orderly and stable state transitions. Note that reference to incoming signal amplitude or SPL 322 is based on the one or more signal or sound pressure level estimation components (SPL EST) 112 (e.g., LSPL signal path SPL estimation 112L, HSPL signal path SPL estimation 112H) associated with the DSP 108 estimates of the incoming signal amplitude. Note further that the reference $TA_x$ and $TR_x$ in FIG. 3 refers respectively to attack threshold for increasing incoming signal amplitude or SPL 322 and release threshold for decreasing incoming signal amplitude or SPL 322. Thus, exemplary gain adjustment component or control finite state machine (CTRL FSM) 116 provides an orderly and seamless transition between State S0 304 to State S3 310, which states describes the source of the useful signal to be output from the exemplary MEMS acoustic sensor or microphone, without interruption of audio, without audible artifacts, and with low latency switching.

For instance, if incoming signal amplitude or SPL 322 is increasing and passing though TA1 324, then exemplary gain adjustment component or control finite state machine (CTRL FSM) 116 manages transition from State S0 304 to State S1 306.

If incoming signal amplitude or SPL 322 is increasing and passing though TA2 326, then exemplary gain adjustment component or control finite state machine (CTRL FSM) 116 manages transition from State S1 306 to State S2 308.

If incoming signal amplitude or SPL 322 is increasing and passing though TA3 328, then exemplary gain adjustment component or control finite state machine (CTRL FSM) 116 manages transition from State S2 308 to State S3 310.

If incoming signal amplitude or SPL 322 is decreasing and passing though TR3 330, then exemplary gain adjustment component or control finite state machine (CTRL FSM) 116 manages transition from State S3 310 to State S2 308, once counter done 332 counter expires.

In another non-limiting aspect, exemplary gain adjustment component or control finite state machine (CTRL FSM) 116 can employ one or more counters (e.g., counter done 332 and the like) to facilitate providing an additional hysteresis variable to ensure a smooth transition between states without oscillation of the exemplary gain adjustment component or control finite state machine (CTRL FSM) 116. As a result, when managing a transition in decreasing incoming signal amplitude or SPL 322, such that the signal SPL is less than the release threshold (e.g., TR3 330), a predetermined period of time (e.g., clock cycles) elapse before conducting the state transition, to ensure the incoming signal amplitude or SPL 322 is low and stably low. Accordingly, the exemplary gain adjustment component or control finite state machine (CTRL FSM) 116 can prevent exemplary gain adjustment component or control finite state machine (CTRL FSM) 116 following low frequency sinusoids of the incoming signal amplitude or SPL 322, and oscillation of the exemplary gain adjustment component or control finite state machine (CTRL FSM) 116 between adjacent states (e.g., State S3 310 to State S2 308, and so on).

If incoming signal amplitude or SPL 322 is decreasing and passing though TR2 334, then exemplary gain adjustment component or control finite state machine (CTRL FSM) 116 manages transition from State S2 308 to State S1 306, once counterdone 336 counter expires, as described above.

If incoming signal amplitude or SPL 322 is decreasing and passing though TR1 338, then exemplary gain adjustment component or control finite state machine (CTRL FSM) 116 manages transition from State S1 306 to State S0 304, once counterdone 336 counter expires, as described above.

Note that FIG. 3 depicts, as a set of horizontal dashed lines, a predetermined selection of staggered attack and release thresholds (e.g., staggered by a predetermined amount, staggered by 6 dB), by which exemplary gain adjustment component or control finite state machine (CTRL FSM) 116 can employ hysteresis to facilitate stable operation of the exemplary gain adjustment component or control finite state machine (CTRL FSM) 116, by preventing rapid or periodic oscillations between states. That is, FIG. 3 depicts TA1 324 as greater than TR1 338, which is less than the set of TA2 326 and TR2 334, in a non-limiting aspect. In addition, FIG. 3 depicts TA2 326 as greater than TR2 334, which is less than the set of TA3 328 and TR3 330, whereas TA3 328 is greater than TR3 330, in further non-limiting aspects. In still further non-limiting aspects.

In yet another non-limiting aspect, the predetermined selection of staggered attack and release thresholds can be selected to prevent saturation of the one or more adjustable ADCs 106, which would otherwise result in output signal distortion. Thus, it can be understood that the transitions depicted in FIG. 3 occur prior to saturation of the one or more adjustable ADCs 106.

As described above, exemplary gain adjustment component or control finite state machine (CTRL FSM) 116 associated with the DSP 108 can be configured to adjust respective gains 118 (e.g., LSPL ADC gain 118L, HSPL ADC gain 118H) associated with the one or more adjustable ADCs based at least in part on the respective signal levels 114 (e.g., LSPL signal level 114L, HSPL signal level 114H). Thus, if incoming signal amplitude or SPL 322 is increasing and passing though TA1 324, then exemplary gain adjustment component or control finite state machine (CTRL FSM) 116 manages transition from State S0 304 to State S1 306, adjusting gain 342 of the adjustable ADC 106L in the LSPL signal path 110L to 1× (e.g., 0 dB). Similarly, if incoming signal amplitude or SPL 322 is decreasing and passing though TR1 338, then exemplary gain adjustment component or control finite state machine (CTRL FSM) 116 manages transition from State S1 306 to State S0 304, once counterdone 336 counter expires, adjusting gain 342 of the adjustable ADC 106L in the LSPL signal path 110L to 2× (e.g., +6 dB).

Likewise, if incoming signal amplitude or SPL 322 is increasing and passing though TA3 328, then exemplary gain adjustment component or control finite state machine (CTRL FSM) 116 manages transition from State S2 308 to State S3 310, adjusting gain 344 of the adjustable ADC 106H in the HSPL signal path 110H to 1× (e.g., 0 dB). Similarly, if incoming signal amplitude or SPL 322 is decreasing and passing though TR3 330, then exemplary gain adjustment component or control finite state machine (CTRL FSM) 116 manages transition from State S3 310 to State S2 308, once counterdone 332 counter expires, adjusting gain 344 of the adjustable ADC 106H in the HSPL signal path 110H to 2× (e.g., +6 dB).

However, if incoming signal amplitude or SPL 322 is increasing and passing though TA2 326, then exemplary gain adjustment component or control finite state machine (CTRL FSM) 116 manages transition from State S1 306 to State S2 308, and directing 346 exemplary multipath digital audio combiner component or ramp generation and two path audio combiner component (RAMP GEN/TPAC) 120 to facilitate the state transition, as further described herein regarding FIG. 4. Similarly, if incoming signal amplitude or SPL 322 is decreasing and passing though TR2 334, then exemplary gain adjustment component or control finite state machine (CTRL FSM) 116 manages transition from State S2 308 to State S1 306, once counterdone 332 counter expires, directing 346 exemplary multipath digital audio combiner component or ramp generation and two path audio combiner component (RAMP GEN/TPAC) 120 to facilitate the state transition, as further described herein regarding FIG. 4.

FIG. 4 depicts exemplary aspects of signal path mixing 400 during selected state transitions, according to further aspects of the subject disclosure. FIG. 4 describes how to transition between State S2 308 and State S1 306 and back. Between State S0 304 and State S1 306, there is a gain change in the LSPL signal path 110L. When transitioning from State S1 306 to State S2 308, there is a transition from LSPL signal path 110L to the HSPL signal path 110H. During the transition, both signal paths are in use by the exemplary multipath digital audio combiner component or ramp generation and two path audio combiner component (RAMP GEN/TPAC) 120 associated with DSP 108, as depicted in FIG. 4. According to further non-limiting aspects, the signal paths (e.g., LSPL signal path 110L and HSPL signal path 110H) can be weighted by the exemplary multipath digital audio combiner component or ramp generation and two path audio combiner component (RAMP GEN/TPAC) 120 associated with DSP 108 using complementary weights, such that there sum is equal to 1, as further depicted in FIG. 4. According to a further non-limiting aspect, the complementary weights can be defined by a ramp step (db) and a duration in milliseconds (ms) ($T_{HL}$ 402, $T_{LH}$ 404), which complementary weights can vary according to DSP 108 clock frequency Feit, and which complementary weights can be employed by exemplary multipath digital audio combiner component or ramp generation and two path audio combiner component (RAMP GEN/TPAC) 120 to facilitate seamless signal mixing and state transitions.

Thus, for the transition from State S1 306 to State S2 308, exemplary multipath digital audio combiner component or ramp generation and two path audio combiner component (RAMP GEN/TPAC) 120 associated with DSP 108 can be configured to conduct a transition from LSPL signal path 110L to the HSPL signal path 110H, where the weight of the LSPL signal path 110L is gradually reduced 406 by the exemplary multipath digital audio combiner component or ramp generation and two path audio combiner component (RAMP GEN/TPAC) 120 associated with DSP 108 from 1 to 0, while simultaneously the weight of the HSPL signal path 110H is gradually increased 408 by the exemplary multipath digital audio combiner component or ramp generation and two path audio combiner component (RAMP GEN/TPAC) 120 associated with DSP 108 from 0 to 1.

Note that the decreasing 406 weight ramp from LSPL signal path 110L to HSPL signal path 110H is steeper (TLH duration shorter), than that of the decreasing 410 weight ramp for HSPL signal path 110H to LSPL signal path 110L, because when the incoming signal amplitude or SPL 322 is increasing, the transition should be undertaken quickly to avoid saturating the LSPL signal path 110L ADC. Conversely, decreasing weight 410 ramp from HSPL signal path 110H to LSPL signal path 110L can be more gradual (THL duration longer), than that of the of the decreasing 408 weight ramp for LSPL signal path 110L to HSPL signal path 110H, because when the incoming signal amplitude or SPL 322 is decreasing, the transition can be undertaken more gradually to ensure a more smooth transition between the HSPL signal path 110H and the LSPL signal path 110L.

Note that, as in FIG. 3, reference to incoming signal amplitude or SPL 322 is based on the one or more signal or sound pressure level estimation components (SPL EST) 112 (e.g., LSPL signal path SPL estimation 112L, HSPL signal path SPL estimation 112H) associated with the DSP 108 estimates of the incoming signal amplitude. However, note that regarding FIG. 4, reference to LSPL signal path 110L and HSPL signal path 110H, regarding mixing of signals via exemplary multipath digital audio combiner component or ramp generation and two path audio combiner component (RAMP GEN/TPAC) 120 associated with DSP 108, refers to the signals into exemplary multipath digital audio combiner component or ramp generation and two path audio combiner component (RAMP GEN/TPAC) 120 associated with DSP 108, and not any signals further up the signal paths 110 (e.g., LSPL signal path 110L, HSPL signal path 110H) toward exemplary MEMS acoustic sensor or microphone.

FIG. 5 depicts a functional block diagram 500 of an exemplary flexible performance digital microphone system in a FDR mode, demonstrating further non-limiting aspects of the subject disclosure. As described above regarding ASIC 100/200, an exemplary flexible performance digital microphone system as provided herein can comprise one or more of MEMS acoustic sensor or microphone 502, AFE 102, GST 104, and adjustable ADCs 106 for respective signal paths 110 (e.g., LSPL signal path 110L, HSPL signal path 110H), and/or exemplary digital signal processor (DSP) 108, as further described herein regarding FIGS. 1-4. Note that FIG. 5, for clarity, omits certain blocks to simplify discussion of the transitions between modes. Accordingly, FIG. 5 depicts exemplary ASIC 100/200 that can comprise or be associated with an exemplary AFE 102 that can comprise or be associated with a MEMS acoustic sensor or microphone preamplifier 504. In FIGS. 5-6, FP denotes a positive node, FN denotes a negative node, and fs denotes sampling frequency. Note further that whereas ADC 106 is converting on a multi-bit signal, the final output audio signal (e.g., the PDM signal (e.g., MEMS ASIC output signal 214)) from the MEMS acoustic sensor or microphone 502 is a 1 bit signal, according to non-limiting aspects.

In further non-limiting embodiments, exemplary ASIC 100/200 can comprise or be associated with an exemplary GST 104 that can comprise or be associated with an exemplary GST amplifier 506 and anti-aliasing filter (AAF) 508 for respective signal paths 110 (e.g., LSPL signal path 110L, HSPL signal path 110H), according to further non-limiting aspects. Thus, FIG. 5 depicts two signal paths (e.g., LSPL signal path 110L, HSPL signal path 110H) running in parallel. In a non-limiting aspect, the two signal paths (e.g., LSPL signal path 110L, HSPL signal path 110H) have different DR and SNR. In a further non-limiting aspect, HSPL signal path 110H can be configured to have a lower relative gain, higher relative DR, as would be appropriate to handle higher amplitude or SPL 322 signals. In yet another non-limiting aspect, LSPL signal path 110L can be configured to have a higher relative gain, and lower relative DR, as would be appropriate to handle lower amplitude or SPL 322 signals. Thus, HSPL signal path 110H has wider DR, capable of processing all incoming signals, but has a more course SNR of the ADC 106H, whereas the LSPL signal path 110L has lower DR, capable of processing incoming signals at lower signal levels, but with better SNR of the ADC 106L, relative to HSPL signal path 110H. Note that in FIGS. 5-6, relationships between gains associated with various exemplary components are annotated as $G_{L1}$, $G_{H1}$, $G_{L2}$, $G_{H2}$, $1/G_{L1}$, $1/G_{H1}$, $1/G_{L2}$, and $1/G_{H2}$, according to further non-limiting aspects.

FIG. 6 depicts a functional block diagram 600 of an exemplary flexible performance digital microphone system as depicted in FIG. 5 in a RDR, reduced power mode, demonstrating further non-limiting aspects of the subject disclosure. As further described herein, transition from FIG. 5 to FIG. 6 represents a transition from a FDR, full power configuration to a RDR, reduced power configuration. Accordingly, exemplary ASIC 100/200 can comprise or be associated with exemplary power management component or auxiliary finite state machine (AUX FSM) 124 associated with the DSP 108 configured to manage power states associated with components associated with the one or more signal paths 110 (e.g., LSPL signal path 110L, HSPL signal path 110H) of the MEMS acoustic sensor or microphone based at least in part on a selected transition of modes based at least in part on at least one of a performance criteria or a power consumption criteria. Thus, in a lower power, lower DR mode of exemplary ASIC 100/200, exemplary power management component or auxiliary finite state machine (AUX FSM) 124 associated with the DSP 108 can be configured to power down one or more components associated with HSPL signal path 110H, including but not limited to GST amplifier 506H, AAF 508H, adjustable ADC 106H, more glitch removal components (GREM) 204H, offset estimation components (OFFSET EST) 208H, first signal reshaping components or offset reshaper (OFFSET RESH) 210H, signal or sound pressure level estimation components (SPL EST) 112H, and other components as necessary or desired, including any portion and/or combination thereof, without limitation. Accordingly, in a further non-limiting aspect, exemplary power management component or auxiliary finite state machine (AUX FSM) 124 associated with the DSP 108 can be configured to turn off one of two paths (e.g., HSPL signal path 110H), in an exemplary power-saving mode. In another non-limiting aspect, exemplary power management component or auxiliary finite state machine (AUX FSM) 124 associated with the DSP 108 can be configured to adjust gain of the one or more adjustable ADCs 106, adjust bias of one or more of the MEMS acoustic sensor or microphone preamplifier 504, the GST amplifier 506H, to provide lower gain and/or SNR, according to a power-saving mode (e.g., as directed via a OWCI or otherwise as determined by exemplary power management component or auxiliary finite state machine (AUX FSM) 124 associated with the DSP 108), based at least in part on at least one of a performance criteria (e.g., gain, DR, SNR) or a power consumption criteria (e.g., muting instruction, off instruction, power-saving mode instruction, for example, via an exemplary OWCI), which facilitates further reduced power consumption in one or more of the adjustable ADCs 106. As a result, exemplary power management component or auxiliary finite state machine (AUX FSM) 124 associated with the DSP 108 can facilitate providing a flexible performance microphone with both wide DR and extensive power saving capabilities. Thus, In another non-limiting aspect, exemplary embodiments described herein can facilitate RDR with reduced power by powering only the LSPL signal path (e.g., LSPL signal path 110L), as further described herein. In addition, in further non-limiting embodiments, gains of a selected and powered signal path (e.g. LSPL) can be adjusted (e.g., via an exemplary power management component or auxiliary finite state machine (AUX FSM) 124) in order to facilitate FDR implementations with reduced power, while facilitating better SNR than the HSPL signal path (e.g., HSPL signal path 110H). In still further non-limiting aspects, while power reductions can be achieved by switching off one of the paths (e.g., LSPL signal path 110L or HSPL signal path 110H), further power reductions can be facilitated by reducing supplied current to one or more components in the selected and powered signal path, as further described herein.

Accordingly, various embodiments described herein can provide seamless state and mode transitions, with extremely low latency and without introducing audible switch artifacts, and without interruption in the PDM signal (e.g., MEMS ASIC output signal 214), as a result of the described digital implementations that avoid filtering and attendant delays, and as a result of the digital implementations being maintained at a DSP 108 clock frequency $F_{clk}$ much higher the minimum sampling rate for a 20 kiloHertz (kHz) signal anticipated in the AFE 102 and GST 104 stages. In addition, the various embodiments described here can enter the various power saving modes, in addition to varying DSP 108 clock frequency $F_{clk}$ without interrupting the streaming of the audio signal (e.g., the PDM signal (e.g., MEMS ASIC output signal 214)) from the MEMS acoustic sensor or microphone 502.

As a result, various embodiments described herein can accommodate, with good SNR, a very low signal up to a certain signal level (e.g., below saturation point of adjustable ADC 106L), with the LSPL signal path 110L, which is not the maximum amplitude or AOP of the MEMS acoustic sensor or microphone 502, and the HSPL signal path 110H can accommodate the full DR, while having relatively poorer SNR. As described herein regarding FIGS. 1-4, the decision on which path to be used is managed by exemplary gain adjustment component or control finite state machine (CTRL FSM) 116 associated with DSP 108, which employs the one or more signal or sound pressure level estimation components (SPL EST) 112 that provide an estimate of the incoming signal amplitude or SPL 322 to perform the described state transitions that determine whether and at what gain to use the LSPL signal path 110L or the HSPL signal path 110H for use in the conversion of the final output audio signal (e.g., the PDM signal (e.g., MEMS ASIC output signal 214)) from the MEMS acoustic sensor or microphone 502. In further non-limiting aspects, the adjustable ADCs 106 in the respective signal paths LSPL signal path 110L and HSPL signal path 110H have the ability gain adjusted as described above, regarding exemplary gain adjustment component or control finite state machine (CTRL FSM) 116 associated with the DSP 108, to facilitate providing better signal DR and SNR.

As described above, transition from FIG. 5 to FIG. 6 represents a transition from a FDR, full power configuration to a RDR, reduced power configuration. In various described embodiments, exemplary gain adjustment component or control finite state machine (CTRL FSM) 116, together with exemplary power management component or auxiliary finite state machine (AUX FSM) 124 facilitates and manages the transitions from a FDR, full power configuration of FIG. 5 to a RDR, reduced power configuration of FIG. 6, and back. Note that whereas FIG. 3 describes the steady state condition and transitions of the signals as they are prepare for output in FIGS. 5-6, under the control and implementation of exemplary gain adjustment component or control finite state machine (CTRL FSM) 116 and exemplary multipath digital audio combiner component or ramp generation and two-path audio combine (RAMP GEN/TPAC) 120, exemplary power management component or auxiliary finite state machine (AUX FSM) 124 associated with the DSP 108 configured to manage power states associated with components associated with the one or more signal paths 110 (e.g., LSPL signal path 110L, HSPL signal path 110H) of the MEMS acoustic sensor or microphone 502 based at least in part on a selected transition of modes based at least in part on at least one of a performance criteria or a power consumption criteria, as further describe herein, in the transitions from a FDR, full power configuration of FIG. 5 to a RDR, reduced power configuration of FIG. 6, and back. Thus, in a further non-limiting aspect, exemplary power management component or auxiliary finite state machine (AUX FSM) 124 associated with the DSP 108 can be configured to manage the switching between paths the one or more signal paths 110 (e.g., LSPL signal path 110L, HSPL signal path 110H) of the MEMS acoustic sensor or microphone 502, powering down components, powering up components, adjusting gains and biases, applying counters and performing actions based thereon, and so on, as further described herein.

Thus, in a transition from FIG. 5 to FIG. 6 represents a transition from a FDR, full power configuration to a RDR, reduced power configuration, exemplary gain adjustment component or control finite state machine (CTRL FSM) 116 can switch to HSPL signal path 110H, as further described herein, regarding FIGS. 3-4, for State S2 308. Then, exemplary power management component or auxiliary finite state machine (AUX FSM) 124 can facilitate GST 104 GST amplifier 506 gain and biasing of the MEMS acoustic sensor or microphone preamplifier 504, the GST amplifier 506L in LSPL signal path 110L such that LSPL signal path 110L gain is matched to gain in HSPL signal path 110H. In a further non-limiting aspect, exemplary power management component or auxiliary finite state machine (AUX FSM) 124 can be configured to wait for a minimum transition time (e.g., a predetermined minimum number of clock cycles) until LSPL signal path 110L settles. Note that this minimum transition time (e.g., a predetermined minimum number of clock cycles) until LSPL signal path 110L settles is different from the counterdone 340) to ensure a stable LSPL signal path 110L signal. Then, exemplary gain adjustment component or control finite state machine (CTRL FSM) 116 can switch to LSPL signal path 110L, as further described herein, regarding FIGS. 3-4, for State S1 306. Thereafter, exemplary power management component or auxiliary finite state machine (AUX FSM) 124 can power down the HSPL signal path 110H, as further described herein, and the transition from a FDR, full power configuration of FIG. 5, to a RDR, reduced power configuration of FIG. 6 is completed. As further described above, exemplary power management component or auxiliary finite state machine (AUX FSM) 124 associated with the DSP 108 can be configured to adjust gain of the one or more adjustable ADCs 106, adjust bias of one or more of the MEMS acoustic sensor or microphone preamplifier 504, the GST amplifier 506H, to provide lower gain and/or SNR, according to a power-saving mode (e.g., as directed via a OWCI or otherwise as determined by exemplary power management component or auxiliary finite state machine (AUX FSM) 124 associated with the DSP 108), based at least in part on at least one of a performance criteria (e.g., gain, DR, SNR) or a power consumption criteria (e.g., muting instruction, off instruction, power-saving mode instruction, for example, via an exemplary Inter-Integrated Circuit (I²C) interface), which facilitates further reduced power consumption in one or more of the adjustable ADCs 106.

In a further non-limiting embodiment, a transition from FIG. 6 to FIG. 5 represents a transition from a RDR, low power configuration to a FDR, full power configuration, facilitated by exemplary gain adjustment component or control finite state machine (CTRL FSM) 116, together with exemplary power management component or auxiliary finite state machine (AUX FSM) 124. Accordingly, exemplary power management component or auxiliary finite state machine (AUX FSM) 124 can be configured to power up components of the HSPL signal path 110H to power up the HSPL signal path 110H, and exemplary power management component or auxiliary finite state machine (AUX FSM) 124 can be configured to wait for a minimum transition time (e.g., a predetermined minimum number of clock cycles) until HSPL signal path 110H settles. Note that this minimum transition time (e.g., a predetermined minimum number of clock cycles) until HSPL signal path 110H settles is different from the counterdone specification of FIG. 3) to ensure a stable HSPL signal path 110H signal. Then, exemplary gain adjustment component or control finite state machine (CTRL FSM) 116 can switch to HSPL signal path 110H, as further described herein, regarding FIGS. 3-4, for State S2 308. As further described above, exemplary power management component or auxiliary finite state machine (AUX FSM) 124 associated with the DSP 108 can be configured to adjust GST 104 GST amplifier 506 gain of the MEMS acoustic sensor or microphone preamplifier 504, the GST amplifier 506L in LSPL signal path 110L to match gain in HSPL signal path 110H. Then, exemplary power management component or auxiliary finite state machine (AUX FSM) 124 can be configured to wait for a minimum transition time (e.g., a predetermined minimum number of clock cycles) until LSPL signal path 110L settles. Note that this minimum transition time (e.g., a predetermined minimum number of clock cycles) until LSPL signal path 110L settles is different from the counterdone specification of FIG. 3) to ensure a stable LSPL signal path 110L signal, and the transition from a RDR, reduced power configuration of FIG. 6, to a FDR, full power configuration of FIG. 5 is completed, thereby enabling signal path switch as described above regard FIGS. 3-4.

Accordingly, various non-limiting embodiments described herein provide devices apparatus and/or systems that can comprise one or more exemplary adjustable ADCs 106 associated with one or more signal paths 110 (e.g., LSPL signal path 110L, HSPL signal path 110H) of the MEMS acoustic sensor or microphone of a MEMS acoustic sensor or microphone, as further described herein. Disclosed embodiments can further comprise an exemplary ASIC 100/200 in a package (e.g., comprising or associated with one or more of a package substrate, one or more MEMS sensors, and a lid or cover, and/or portions thereof) associated with MEMS acoustic sensor or microphone (e.g., MEMS acoustic sensor or microphone 502), wherein a digital signal processing component (DSP) implemented into the ASIC 100/200 can be configured to receive one or more signals from one or more adjustable ADCs 106, in a non-limiting aspect.

In a further non-limiting aspect, exemplary embodiments can further comprise one or more offset remover components or ADC offset compensation component (ADC OFF COMP) 202 configured to remove offset associated with respective signals associated with the one or more adjustable ADCs 106, as further described herein regarding FIG. 2. In still another non-limiting aspect, exemplary embodiments can further comprise one or more glitch removal components (GREM) 204 associated with the one or more offset remover components or ADC offset compensation component (ADC OFF COMP) 202, wherein the one or more glitch removal components (GREM) 204 can be configured to compensate for adjustments in respective gains 118 (e.g., LSPL ADC gain 118L, HSPL ADC gain 118H) associated with the one or more adjustable ADCs 106, and wherein the one or more glitch removal components (GREM) 204 can be further configured for glitch removal associated with the adjustments in respective gains 118 (e.g., LSPL ADC gain 118L, HSPL ADC gain 118H) associated with the one or more adjustable ADCs 106 and associated compensation, as further described herein regarding FIG. 2.

In addition, disclosed embodiments can further comprise one or more offset estimation components (OFFSET EST) 208 configured to estimate offset associated with at least respective portions of the one or more signal paths 110 (e.g., LSPL signal path 110L, HSPL signal path 110H) of the MEMS acoustic sensor or microphone (e.g., MEMS acoustic sensor or microphone 502) associated with the respective outputs associated with the one or more glitch removal components (GREM) 204, as further described herein regarding FIG. 2. Thus, further non-limiting embodiments can comprise one or more first signal reshaping components or offset reshaper (OFFSET RESH) 210 configured to subtract offset associated with the at least respective portions of the one or more signal paths 110 (e.g., LSPL signal path 110L, HSPL signal path 110H) of the MEMS acoustic sensor or microphone (e.g., MEMS acoustic sensor or microphone 502) and reduce bit size in the at least respective portions of the one or more signal paths 110 (e.g., LSPL signal path 110L, HSPL signal path 110H) of the MEMS acoustic sensor or microphone (e.g., MEMS acoustic sensor or microphone 502), for example, as further described herein regarding FIG. 2.

Moreover, various disclosed embodiments can comprise one or more signal or sound pressure level estimation components (SPL EST) 112 (e.g., LSPL signal path SPL estimation 112L, HSPL signal path SPL estimation 112H) configured to estimate respective signal levels 114 (e.g., LSPL signal level 114L, HSPL signal level 114H) associated with at least respective portions of the one or more signal paths 110 (e.g., LSPL signal path 110L, HSPL signal path 110H) of the MEMS acoustic sensor or microphone (e.g., MEMS acoustic sensor or microphone 502), for example, as further described herein regarding FIGS. 1-9.

Accordingly, exemplary embodiments described herein can further comprise a gain adjustment component or control finite state machine (CTRL FSM) 116 configured to adjust respective gains 118 (e.g., LSPL ADC gain 118L, HSPL ADC gain 118H) associated with the one or more adjustable ADCs 106 based at least in part on the respective signal levels 114 (e.g., LSPL signal level 114L, HSPL signal level 114H), for example, as further described herein regarding FIGS. 1-9. As a non-limiting example, the gain adjustment component or control finite state machine (CTRL FSM) 116 can be further configured to coordinate switching among the at least respective portions of the one or more signal paths 110 (e.g., LSPL signal path 110L, HSPL signal path 110H) of the MEMS acoustic sensor or microphone (e.g., MEMS acoustic sensor or microphone 502) based at least in part on the respective signal levels 114 (e.g., LSPL signal level 114L, HSPL signal level 114H) and the selected transition, for example, as further described herein regarding FIGS. 3-4.

In addition, various disclosed embodiments can comprise a multipath digital audio combiner component or ramp generation and two-path audio combine (RAMP GEN/TPAC) 120 configured to compensate for gain imbalance among the at least respective portions of the one or more signal paths 110 (e.g., LSPL signal path 110L, HSPL signal path 110H) of the MEMS acoustic sensor or microphone (e.g., MEMS acoustic sensor or microphone 502) to generate an output signal (e.g., DSP output signal 122), for example, as further described herein regarding FIGS. 1-9. As a non-limiting example, exemplary embodiments described herein can comprise exemplary multipath digital audio combiner component or ramp generation and two-path audio combine (RAMP GEN/TPAC) 120 configured to mix signals associated with the at least respective portions of the one or more signal paths 110 (e.g., LSPL signal path 110L, HSPL signal path 110H) based at least in part on switching control of the gain adjustment component or control finite state machine (CTRL FSM) 116, as further described herein regarding FIGS. 1-9.

Moreover, exemplary embodiments described herein can further comprise a power management component or auxiliary finite state machine (AUX FSM) 124 configured to manage power states associated with components associated with the one or more signal paths 110 (e.g., LSPL signal path 110L, HSPL signal path 110H) of the MEMS acoustic sensor or microphone (e.g., MEMS acoustic sensor or microphone 502) based at least in part on a selected transition from at least one of a performance criteria (e.g., gain, DR, SNR) or a power consumption criteria (e.g., muting instruction, off instruction, power-saving mode instruction, for example, via an exemplary Inter-Integrated Circuit ($I^2C$) interface), for example, as further described herein regarding FIGS. 1-9. In addition, various embodiments as described herein can further comprise a signal smoothing component or start-up ramp and sensitivity adjustment (START-UP RAMP & SENS ADJ) 212 that can be further configured to adjust gain associated with the output signal (e.g., DSP output signal 122), as further described herein, regarding FIGS. 1-2.

Other non-limiting embodiments can comprise or be associated with a second signal reshaping component (RESH) 216 configured to provide a PDM signal (e.g., MEMS ASIC output signal 214) based at least in part on the output signal (e.g., DSP output signal 122), as further described herein regarding FIG. 2. In a non-limiting aspect, various embodiments described herein can comprise an exemplary DSP 108 further configured to at least one of switch from operating the one or more signal paths 110 (e.g., LSPL signal path 110L, HSPL signal path 110H) of the MEMS acoustic sensor or microphone (e.g., MEMS acoustic sensor or microphone 502) to a single signal path or switch from operating the single signal path to the one or more signal paths 110 (e.g., LSPL signal path 110L, HSPL signal path 110H) of the MEMS acoustic sensor or microphone (e.g., MEMS acoustic sensor or microphone 502), wherein the one or more signal paths 110 (e.g., LSPL signal path 110L, HSPL signal path 110H) of the MEMS acoustic sensor or microphone (e.g., MEMS acoustic sensor or microphone 502) comprises at least a HSPL signal path 110H and a LSPL signal path 110L, and wherein the HSPL signal path 110H can be characterized at least in part by having at least one of a different performance characteristic (e.g., DR, SNR) or power characteristic (e.g., power consumption, supply voltage, clock frequency, and so on) relative to the LSPL signal path 110L, and wherein the single signal path comprises the LSPL signal path 110L, as further described herein regarding FIGS. 1-9.

In yet another non-limiting aspect, various embodiments described herein can comprise an exemplary DSP 108 further configured to switch to the HSPL signal path 110H using the multipath digital audio combiner component or ramp generation and two-path audio combine (RAMP GEN/TPAC) 120, adjust gain and biasing in the LSPL signal path 110L using the exemplary power management component or auxiliary finite state machine (AUX FSM) 124, switch to the LSPL signal path 110L using the multipath digital audio combiner component or ramp generation and two-path audio combine (RAMP GEN/TPAC) 120 further configured to generate the output signal (e.g., DSP output signal 122) based at least in part on a respective portion of the LSPL signal path 110L and a minimum transition time configured to allow the respective portion of the LSPL signal path 110L to stabilize, and power off at least one component associated with the HSPL signal path 110H using the power management component or auxiliary finite state machine (AUX FSM) 124 configured, based at least in part on the selected transition, as further described herein regarding FIGS. 1-9.

In still further non-limiting aspects, various embodiments described herein can comprise an exemplary DSP 108 further configured to power on at least a subset of components associated with the HSPL signal path 110H using the power management component or auxiliary finite state machine (AUX FSM) 124 based at least in part on the selected transition, switch to the HSPL signal path 110H using the multipath digital audio combiner component or ramp generation and two-path audio combine (RAMP GEN/TPAC) 120 configured to generate the output signal (e.g., DSP output signal 122) based at least in part on a respective portion of the HSPL signal path 110H and another minimum transition time configured to allow the respective portion of the HSPL signal path 110H to stabilize, adjust gain and biasing in the LSPL signal path 110L using the power management component or auxiliary finite state machine (AUX FSM) 124, and enable switching, using the multipath digital audio combiner component or ramp generation and two-path audio combine (RAMP GEN/TPAC) 120, from operating the one or more signal paths 110 (e.g., LSPL signal path 110L, HSPL signal path 110H) of the MEMS acoustic sensor or microphone (e.g., MEMS acoustic sensor or microphone 502) in DSP 108 to the single signal path in the DSP 108 based at least in part on the respective portion of the LSPL signal path 110L and the minimum transition time configured to allow the respective portion of the LSPL signal path 110L to stabilize, as further described herein regarding FIGS. 1-9.

As described above, under normal operations of the disclosed embodiments, two signal paths (e.g., HSPL signal path 110H and LSPL signal path 110L) are normally available (except when a signal path or portions thereof are powered down as described here), with paths dynamically selected based on the amplitude of the incoming signal via gain adjustment component or control finite state machine (CTRL FSM) 116. Thus, the described embodiments can typically employ power reduction strategies by turning one path, or portions thereof, off entirely. For example, exemplary implementations employing the described embodiments of FIG. 6 can be employed, sacrificing performance (e.g., reduced dynamic range, SNR, etc.) for power reduction.

Thus, during normal operation of the disclosed embodiments, the output signal comes from HSPL signal path 110H or LSPL signal path 110L, depending on incoming signal amplitude, and resulting state transitions. Accordingly, under normal use, various implementations of the dual path architecture can switch the source of the output signal from one path to the other, and such switching can happen dynamically up to tens of times per second, depending on the input signal amplitude.

However, for stable input signal amplitude, e.g., if the input signal amplitude stays low, the LSPL signal path 110L may be used primarily for extended periods of time, without the need to switch to the HSPL signal path 110H, and vice versa. Thus, in other non-limiting implementations, further power savings can be realized. For example, even though a signal path may remain unused for a short period of time, various implementations of the disclosed subject matter can be employed to capitalize on these further power saving opportunities, without the potential delay and potential performance loss resulting from completely powering down the HSPL signal path 110H or LSPL signal path 110L or portions thereof.

Figure 7:
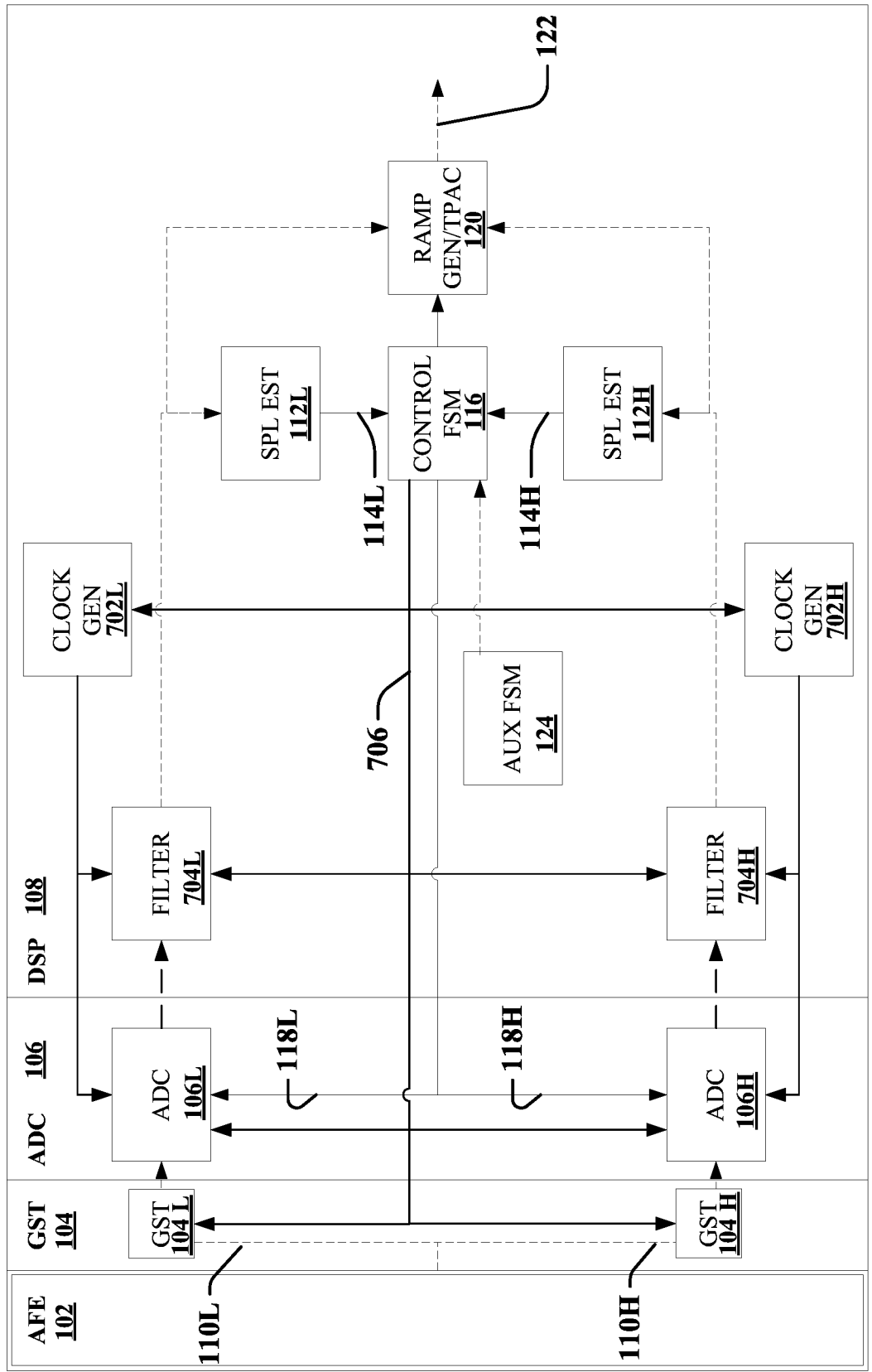
FIG. 7 depicts another functional block diagram of an exemplary embodiment demonstrating further non-limiting aspects of the subject disclosure.
Figure 8:
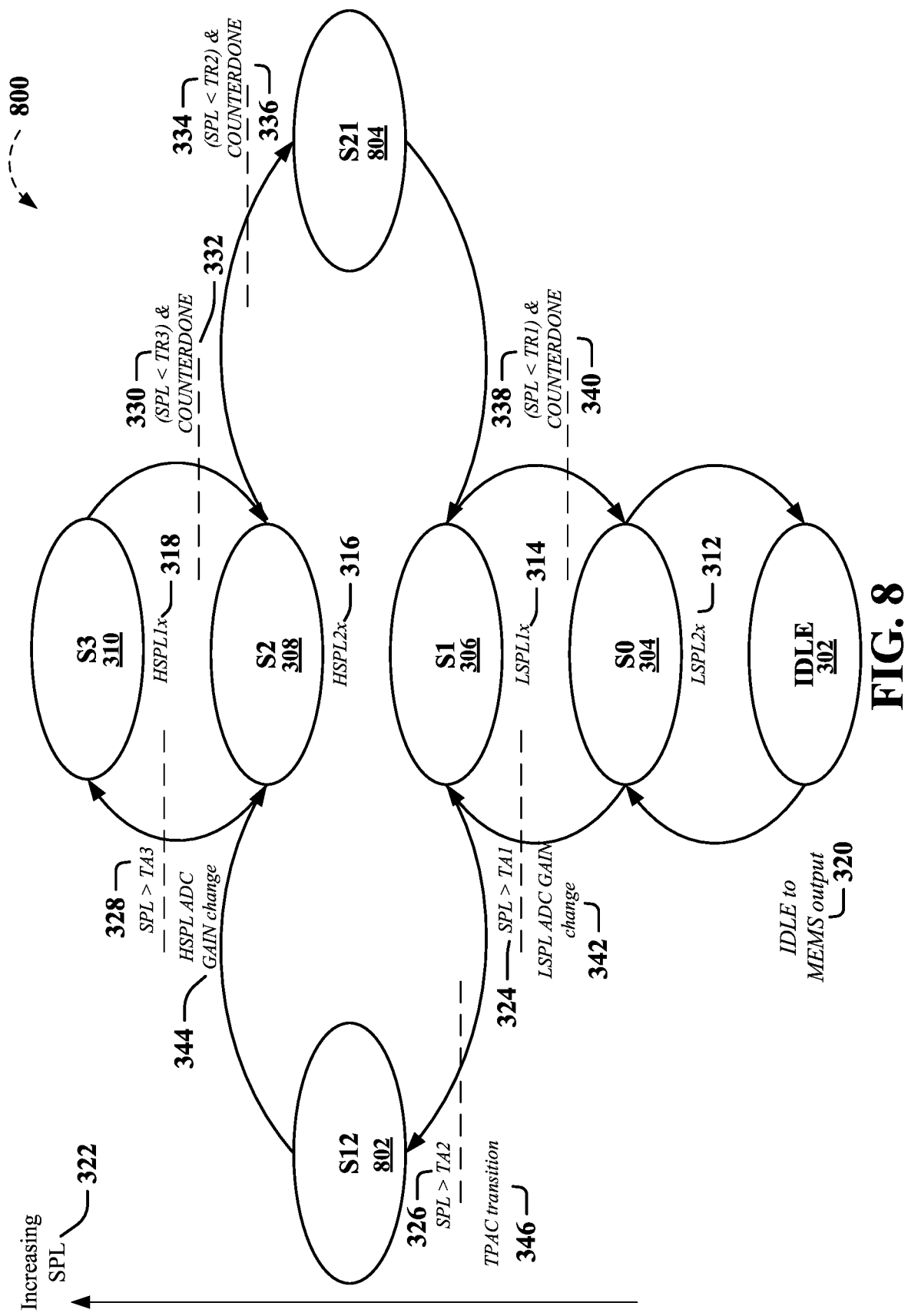
FIG. 8 depicts another non-limiting state diagram of an exemplary flexible performance digital microphone system comprising a gain adjustment component configured to coordinate switching among signal paths based on signal levels and a selected state transition, according to still further aspects of the subject disclosure.
Figure 9:
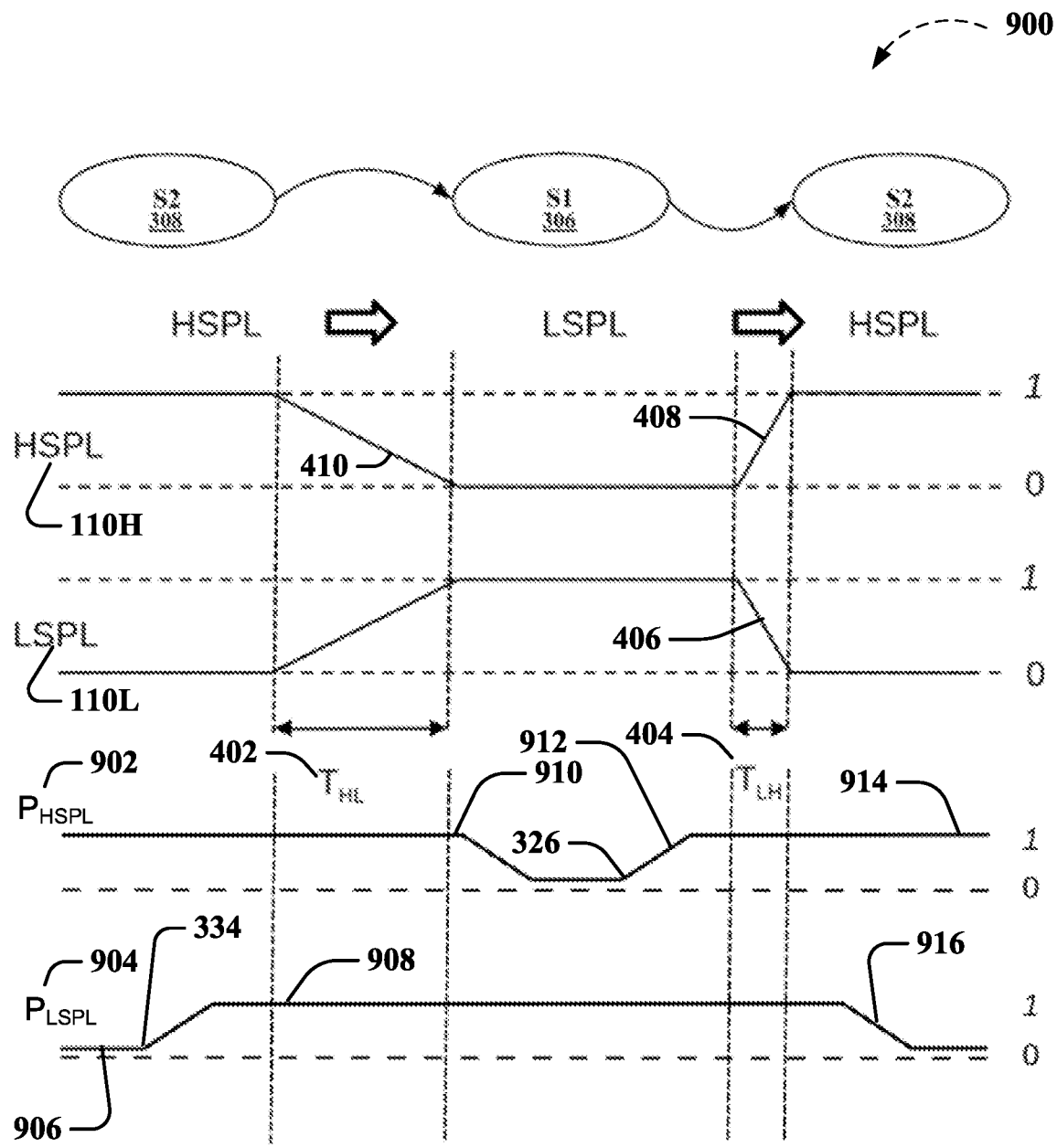
FIG. 9 depicts further aspects of signal path mixing during selected state transitions, according to still further aspects of the subject disclosure.

For instance, in situations for which it may not be desirable to fully power off the unused signal path (e.g., HSPL signal path 110H or LSPL signal path 110L, or portions thereof), it is possible to introduce other temporary power saving strategies affecting the unused path, in further non-limiting aspects, as further described herein regarding FIGS. 7-9.

FIG. 7 depicts another functional block diagram 700 of an exemplary embodiment demonstrating further non-limiting aspects of the subject disclosure. FIG. 7 depicts essentially the components of functional block diagrams 100 and 200 of FIGS. 1-2, as further described in FIGS. 5-6, respectively. As such, to avoid repetition, the descriptions of components of FIGS. 1-2 and 5-6 apply to the components of FIG. 7, except where explicitly complemented or supplemented herein. Thus, in addition to the components of FIGS. 1 and 2, FIG. 7 depicts functional block diagram 700, comprising a GST 104L and GST 104H, for the purpose of illustration, which can be understood to be analogous to GST 104 as described regarding FIGS. 5-6 GST 104, which can comprise or be associated with an exemplary GST amplifier 506 and AAF 508 for respective signal paths 110 (e.g., LSPL signal path 110L, HSPL signal path 110H), according to further non-limiting aspects.

In addition, functional block diagram 700 of FIG. 7 can comprise clock generation components (CLOCK GEN) 702L 702H, DSP filter components (FILTER) 704L and 704H, for LSPL signal path 110L and HSPL signal path 110H, respectively, and exemplary gain adjustment component or control finite state machine (CTRL FSM) 116 further configured to generate a power control signal 706, according to further non-limiting aspects described herein. For instance, exemplary gain adjustment component or control finite state machine (CTRL FSM) 116 can be configured to coordinate temporary power reduction and power restoration associated with an unused portion of the signal paths 110 (e.g., LSPL signal path 110L, HSPL signal path 110H). In a non-limiting aspect, exemplary gain adjustment component or control finite state machine (CTRL FSM) 116 can be configured to coordinate temporary power reduction and power restoration associated with an unused portion of the signal paths 110 (e.g., LSPL signal path 110L, HSPL signal path 110H) based in part on a selected transition of modes and respective signal levels associated with the signal paths 110 (e.g., LSPL signal path 110L, HSPL signal path 110H), as further described herein, for example, regarding FIGS. 8-9.

Thus, in a non-limiting aspect, based in part on a selected transition of modes and respective signal levels associated with the signal paths 110 (e.g., LSPL signal path 110L, HSPL signal path 110H), exemplary gain adjustment component or control finite state machine (CTRL FSM) 116 can facilitate one or more of temporarily and smoothly reducing the bias (GST bias or current of the stage) of the unused gain stage (e.g., one of 104L and GST 104H) and restoring it to normal values just before the path transition is to occur based on the selected path transition, temporarily reducing the frequency of the clock serving ADC (e.g., ADC 106L or ADC 106H) and companion DSP portion (e.g., DSP filter components (FILTER) 704L and 704H) associated with the signal processing of the ADC output (e.g., ADC 106L or ADC 106H) and restoring it to normal values just before the path transition is to occur based on the selected path transition, and/or temporarily reducing the ADC (e.g., ADC 106L or ADC 106H) bias (ADC bias or current of the stage) and restoring it to normal values just before the path transition is to occur based on the selected path transition.

Accordingly, in further non-limiting embodiments, exemplary gain adjustment component or control finite state machine (CTRL FSM) 116 can be further configured to provide power control signal 706m, which can be employed by one or more of GST (e.g., GST 104L or GST 104H), ADC (e.g., ADC 106L or ADC 106H), and clock generation components (CLOCK GEN) 702L 702H for controlling frequency of the clock serving ADC (e.g., ADC 106L or ADC 106H) and companion DSP portion (e.g., DSP filter components (FILTER) 704L and 704H), to provide temporary power reduction or dynamic power allocation strategies without the potential delay and potential performance loss resulting from completely powering down the HSPL signal path 110H or LSPL signal path 110L or portions thereof.

For example, such strategies can be used in lieu of switching off the components of the unused signal path, as described above regarding FIGS. 1-6, which strategies can be employed to reduce the power of the unused signal path (e.g., LSPL signal path 110L, HSPL signal path 110H), but which strategies retain the unused signal path (e.g., LSPL signal path 110L, HSPL signal path 110H) in a more relatively ready state that allows for quick restoration of the unused signal path with a nominal clock (e.g., via clock generation components (CLOCK GEN) 702L 702H) and nominal current (e.g., ADC and GST bias or current) and path switching.

FIG. 8 depicts a non-limiting state diagram 800 of an exemplary flexible performance digital microphone system comprising a gain adjustment component (e.g., exemplary gain adjustment component or control finite state machine (CTRL FSM) 116) configured to coordinate switching among signal paths 110 (e.g., LSPL signal path 110L, HSPL signal path 110H) based on signal levels (e.g., respective signal levels 114 (e.g., LSPL signal level 114L, HSPL signal level 114H)) and a selected state transition similar to that described regarding FIG. 3, according to further aspects of the subject disclosure.

Thus, FIG. 8 depicts various states, State Idle 302, State S0 304, State S1 306, State S2 308, and State S3 310, operations to prepare signals for outputs and their state transitions, which states represent the steady state of the signal coming from the exemplary MEMS acoustic sensor or microphone with respect to the status of the various components of exemplary ASIC 100/200/700 and their effect on or state of the output signal.

In addition, non-limiting state diagram 800 of FIG. 8 describes two states, State S12 802 and State S21 804, which can be understood to represent transitional states in which the components of exemplary ASIC 100/200/700, if under temporary power reduction as described herein (e.g., under the control of exemplary gain adjustment component or control finite state machine (CTRL FSM) 116 via power control signal 706) are being prepared to return to their nominal power states in preparation for transition between the signal paths 110 (e.g., LSPL signal path 110L, HSPL signal path 110H).

According to various non-limiting aspects, from State S0 304 to State S2 308, gain adjustment component (e.g., exemplary gain adjustment component or control finite state machine (CTRL FSM) 116) can be configured to control (e.g., via power control signal 706) components of the HSPL signal path 110H to place them in a low power condition, and, similarly, from State S2 308 to State S3 310 gain adjustment component (e.g., exemplary gain adjustment component or control finite state machine (CTRL FSM) 116) can be configured to control (e.g., via power control signal 706) components of the LSPL signal path 110L to place them in a low power condition, as further described herein.

Thus, gain adjustment component (e.g., exemplary gain adjustment component or control finite state machine (CTRL FSM) 116) can be configured to control (e.g., via power control signal 706) the power restorations for the signal paths 110 (e.g., LSPL signal path 110L, HSPL signal path 110H) based on signal levels (e.g., respective signal levels 114 (e.g., LSPL signal level 114L, HSPL signal level 114H)) and a selected state transition as a prelude to the transitions from State S1 306 to State S2 308 or State S12 802 (e.g., incoming signal amplitude or SPL 322 is increasing and passing though TA2 326), or State S2 308 to State S1 306 or State 21 804 (e.g., incoming signal amplitude or SPL 322 is decreasing and passing though TR2 334, then exemplary gain adjustment component or control finite state machine (CTRL FSM) 116 manages transition from State S2 308 to State S1 306, once counterdone 336 counter expires), respectively, in non-limiting aspects, for example, as further described regarding FIG. 9.

In other non-limiting aspects, gain adjustment component (e.g., exemplary gain adjustment component or control finite state machine (CTRL FSM) 116) can be configured to control (e.g., via power control signal 706) the power reductions for the signal paths 110 (e.g., LSPL signal path 110L, HSPL signal path 110H) after the completion of the transitions from State S1 306 to State S2 308 (e.g., at State S2 308) or State S2 308 to State S1 306 (e.g., at State S1 306), respectively, in lieu of completely powering down the unused signal path or portions thereof, for example, as further described regarding FIG. 9.

Thus, State S0 304 represents that the components of exemplary ASIC 100/200/700, such that the signal is being supplied by the LSPL signal path SPL 110L with 2× gain 312 (e.g., +6 dB), when the one or more signal or sound pressure level estimation components (SPL EST) 112 (e.g., LSPL signal path SPL estimation 112L, HSPL signal path SPL estimation 112H) associated with the DSP 108 estimates a relatively low incoming signal amplitude (e.g., low SPL). In a further example, State S1 306 represents that the components of exemplary ASIC 100/200/700, such that the signal is being supplied by the LSPL signal path SPL 110L with 1× gain 314 (e.g., 0 dB), when the one or more signal or sound pressure level estimation components (SPL EST) 112 (e.g., LSPL signal path SPL estimation 112L, HSPL signal path SPL estimation 112H) associated with the DSP 108 estimates a relatively higher incoming signal amplitude (e.g., high SPL), based on predetermined thresholds as further described herein.

State S2 308 represents that the components of exemplary ASIC 100/200/700, such that the signal is being supplied by the HSPL signal path SPL 110H with 2× gain 316 (e.g., +6 dB), when the one or more signal or sound pressure level estimation components (SPL EST) 112 (e.g., LSPL signal path SPL estimation 112L, HSPL signal path SPL estimation 112H) associated with the DSP 108 estimates an even higher incoming signal amplitude (e.g., higher SPL), based on predetermined thresholds as further described herein.

State S3 310 represents that the components of exemplary ASIC 100/200/700, such that the signal is being supplied by the HSPL signal path SPL 110H with 2× gain 318 (e.g., 0 dB), when the one or more signal or sound pressure level estimation components (SPL EST) 112 (e.g., LSPL signal path SPL estimation 112L, HSPL signal path SPL estimation 112H) associated with the DSP 108 estimates an even higher incoming signal amplitude (e.g., highest SPL), based on predetermined thresholds as further described herein.

State Idle 302, represents that the components of exemplary ASIC 100/200/700 are idle to MEMS output 320, when the exemplary MEMS acoustic sensor microphone is not operating.

Each of these states (except State Idle 302) can be set based on one or more signal or sound pressure level estimation components (SPL EST) 112 (e.g., LSPL signal path SPL estimation 112L, HSPL signal path SPL estimation 112H) associated with the DSP 108 estimates of the incoming signal amplitude. Thus, as the estimates of the incoming signal amplitude from the one or more signal or sound pressure level estimation components (SPL EST) 112 (e.g., LSPL signal path SPL estimation 112L, HSPL signal path SPL estimation 112H) show incoming signal amplitude or SPL 322 increasing in State S0 304, exemplary gain adjustment component or control finite state machine (CTRL FSM) 116 associated with the DSP 108 can facilitate transition through State S1 306, State S2 308, and State S3 310, as further described herein. Similarly, decreasing incoming signal amplitude or SPL 322 can be facilitated by transition from State S3 310 to State S2 308, State S1 306, and State S0 304, as further described herein.

In further non-limiting aspects, a set of thresholds for incoming signal amplitude or SPL (e.g., increasing SPL (attack) and decreasing SPL (release)) can be predetermined to enable exemplary gain adjustment component or control finite state machine (CTRL FSM) 116 associated with the DSP 108 to facilitate management of orderly and stable state transitions, as well as restoration of power to nominal levels for components of signal paths 110 (e.g., LSPL signal path 110L, HSPL signal path 110H) under a temporary power reduction as described herein. Note that reference to incoming signal amplitude or SPL 322 is based on one or more signal or sound pressure level estimation components (SPL EST) 112 (e.g., LSPL signal path SPL estimation 112L, HSPL signal path SPL estimation 112H) associated with the DSP 108 estimates of the incoming signal amplitude. Note further that the reference $TA_x$ and $TR_x$ in FIG. 8 refers respectively to attack threshold for increasing incoming signal amplitude or SPL 322 and release threshold for decreasing incoming signal amplitude or SPL 322. Thus, exemplary gain adjustment component or control finite state machine (CTRL FSM) 116 provides an orderly and seamless transition between State S0 304 to State S3 310, with any accompanying temporary power reduction or restoration, which states describes the source of the useful signal to be output from the exemplary MEMS acoustic sensor or microphone, without interruption of audio, without audible artifacts, and with low latency switching.

For instance, if incoming signal amplitude or SPL 322 is increasing and passing though TA1 324, then exemplary gain adjustment component or control finite state machine (CTRL FSM) 116 manages transition from State S0 304 to State S1 306.

At this point (e.g., either at State S0 304 or State S1 306), gain adjustment component (e.g., exemplary gain adjustment component or control finite state machine (CTRL FSM) 116 can be configured to control (e.g., via power control signal 706) the power reduction for the signal paths 110 (e.g., HSPL signal path 110H) based on signal levels (e.g., respective signal levels 114 (e.g., LSPL signal level 114L, HSPL signal level 114H)) and a selected state transition (e.g., at State S0 304 or State S1 306) to provide a temporary power reduction in the signal paths 110 (e.g., HSPL signal path 110H), as further described herein.

If incoming signal amplitude or SPL 322 is increasing and passing though TA2 326, then exemplary gain adjustment component or control finite state machine (CTRL FSM) 116 manages transition from State S1 306 to State S2 308, via, for example, gain adjustment component (e.g., exemplary gain adjustment component or control finite state machine (CTRL FSM) 116) configured to control (e.g., via power control signal 706) the power restorations for the signal paths 110 (e.g., LSPL signal path 110L, HSPL signal path 110H) based on signal levels (e.g., respective signal levels 114 (e.g., LSPL signal level 114L, HSPL signal level 114H)) and a selected state transition as a prelude to the transitions from State S1 306 to State S2 308 or State S12 802.

At this point (e.g., at State S2 308), and thereafter with increasing or steady incoming signal level, gain adjustment component (e.g., exemplary gain adjustment component or control finite state machine (CTRL FSM) 116) can be configured to control (e.g., via power control signal 706) the power reduction for the signal paths 110 (e.g., LSPL signal path 110L) based on signal levels (e.g., respective signal levels 114 (e.g., LSPL signal level 114L, HSPL signal level 114H)) and a selected state transition (e.g., at State S2 308) to provide a temporary power reduction in the signal paths 110 (e.g., LSPL signal path 110L), as further described herein.

If incoming signal amplitude or SPL 322 is increasing and passing though TA3 328, then exemplary gain adjustment component or control finite state machine (CTRL FSM) 116 manages transition from State S2 308 to State S3 310.

If incoming signal amplitude or SPL 322 is decreasing and passing though TR3 330, then exemplary gain adjustment component or control finite state machine (CTRL FSM) 116 manages transition from State S3 310 to State S2 308, once counterdone 332 counter expires.

In another non-limiting aspect, exemplary gain adjustment component or control finite state machine (CTRL FSM) 116 can employ one or more counters (e.g., counterdone 332 and the like) to facilitate providing an additional hysteresis variable to ensure a smooth transition between states without oscillation of the exemplary gain adjustment component or control finite state machine (CTRL FSM) 116. As a result, when managing a transition in decreasing incoming signal amplitude or SPL 322, such that the signal SPL is less than the release threshold (e.g., TR3 330), a predetermined period of time (e.g., clock cycles) elapse before conducting the state transition, to ensure the incoming signal amplitude or SPL 322 is low and stably low. Accordingly, the exemplary gain adjustment component or control finite state machine (CTRL FSM) 116 can prevent exemplary gain adjustment component or control finite state machine (CTRL FSM) 116 following low frequency sinusoids of the incoming signal amplitude or SPL 322, and oscillation of the exemplary gain adjustment component or control finite state machine (CTRL FSM) 116 between adjacent states (e.g., State S3 310 to State S2 308, and so on).

If incoming signal amplitude or SPL 322 is decreasing and passing though TR2 334, then exemplary gain adjustment component or control finite state machine (CTRL FSM) 116 manages transition from State S2 308 to State S1 306, once counterdone 336 counter expires, via, for example, gain adjustment component (e.g., exemplary gain adjustment component or control finite state machine (CTRL FSM) 116) configured to control (e.g., via power control signal 706) the power restorations for the signal paths 110 (e.g., LSPL signal path 110L, HSPL signal path 110H) based on signal levels (e.g., respective signal levels 114 (e.g., LSPL signal level 114L, HSPL signal level 114H)) and a selected state transition as a prelude to the transitions from State S2 308 to State S1 306 or State S21 804.

At this point (e.g., at State S1 306), and thereafter with decreasing or steady incoming signal level, gain adjustment component (e.g., exemplary gain adjustment component or control finite state machine (CTRL FSM) 116) can be configured to control (e.g., via power control signal 706) the power reduction for the signal paths 110 (e.g., HSPL signal path 110H) based on signal levels (e.g., respective signal levels 114 (e.g., LSPL signal level 114L, HSPL signal level 114H)) and a selected state transition (e.g., at State S1 306) to provide a temporary power reduction in the signal paths 110 (e.g., HSPL signal path 110H), as further described herein.

If incoming signal amplitude or SPL 322 is decreasing and passing though TR1 338, then exemplary gain adjustment component or control finite state machine (CTRL FSM) 116 manages transition from State S1 306 to State S0 304, once counterdone 336 counter expires, as described above.

Note that FIG. 8 depicts, as a set of horizontal dashed lines, a predetermined selection of staggered attack and release thresholds (e.g., staggered by a predetermined amount, staggered by 6 dB), by which exemplary gain adjustment component or control finite state machine (CTRL FSM) 116 can employ hysteresis to facilitate stable operation of the exemplary gain adjustment component or control finite state machine (CTRL FSM) 116, by preventing rapid or periodic oscillations between states. That is, FIG. 8 depicts TA1 324 as greater than TR1 338, which is less than the set of TA2 326 and TR2 334, in a non-limiting aspect. In addition, FIG. 8 depicts TA2 326 as greater than TR2 334, which is less than the set of TA3 328 and TR3 330, whereas TA3 328 is greater than TR3 330, in further non-limiting aspects. In still further non-limiting aspects.

In yet another non-limiting aspect, the predetermined selection of staggered attack and release thresholds can be selected to prevent saturation of the one or more adjustable ADCs 106, which would otherwise result in output signal distortion. Thus, it can be understood that the transitions depicted in FIG. 8 occur prior to saturation of the one or more adjustable ADCs 106.

As described above, exemplary gain adjustment component or control finite state machine (CTRL FSM) 116 associated with the DSP 108 can be configured to adjust respective gains 118 (e.g., LSPL ADC gain 118L, HSPL ADC gain 118H) 118 associated with the one or more adjustable ADCs based at least in part on the respective signal levels 114 (e.g., LSPL signal level 114L, HSPL signal level 114H). Thus, if incoming signal amplitude or SPL 322 is increasing and passing though TA1 324, then exemplary gain adjustment component or control finite state machine (CTRL FSM) 116 manages transition from State S0 304 to State S1 306, adjusting gain 342 of the adjustable ADC 106L in the LSPL signal path 110L to 1× (e.g., 0 dB). Similarly, if incoming signal amplitude or SPL 322 is decreasing and passing though TR1 338, then exemplary gain adjustment component or control finite state machine (CTRL FSM) 116 manages transition from State S1 306 to State S0 304, once counterdone 336 counter expires, adjusting gain 342 of the adjustable ADC 106L in the LSPL signal path 110L to 2× (e.g., +6 dB).

Likewise, if incoming signal amplitude or SPL 322 is increasing and passing though TA3 328, then exemplary gain adjustment component or control finite state machine (CTRL FSM) 116 manages transition from State S2 308 to State S3 310, adjusting gain 344 of the adjustable ADC 106H in the HSPL signal path 110H to 1× (e.g., 0 dB). Similarly, if incoming signal amplitude or SPL 322 is decreasing and passing though TR3 330, then exemplary gain adjustment component or control finite state machine (CTRL FSM) 116 manages transition from State S3 310 to State S2 308, once counterdone 332 counter expires, adjusting gain 344 of the adjustable ADC 106H in the HSPL signal path 110H to 2× (e.g., +6 dB).

However, if incoming signal amplitude or SPL 322 is increasing and passing though TA2 326, then exemplary gain adjustment component or control finite state machine (CTRL FSM) 116 manages transition from State S1 306 to State S2 308 or S12 802, restoring power to the signal paths 110 (e.g., HSPL signal path 110H), and directing 346 exemplary multipath digital audio combiner component or ramp generation and two path audio combiner component (RAMP GEN/TPAC) 120 to facilitate the state transition, as further described herein regarding FIG. 9. Similarly, if incoming signal amplitude or SPL 322 is decreasing and passing though TR2 334, then exemplary gain adjustment component or control finite state machine (CTRL FSM) 116 manages transition from State S2 308 to State S1 306 or S21 804, once counterdone 332 counter expires, restoring power to the signal paths 110 (e.g., LSPL signal path 110L), and directing 346 exemplary multipath digital audio combiner component or ramp generation and two path audio combiner component (RAMP GEN/TPAC) 120 to facilitate the state transition, as further described herein regarding FIG. 9.

FIG. 9 depicts further aspects of signal path mixing 900 during selected state transitions, according to still further aspects of the subject disclosure. FIG. 9 describes how to transition between State S2 308 and State S1 306 and back with concurrent temporary power reduction and restoration or dynamic power allocation aspects depicted. Between State S0 304 and State S1 306, there is a gain change in the LSPL signal path 110L. When transitioning from State S1 306 to State S2 308, there is a transition from LSPL signal path 110L to the HSPL signal path 110H. During the transition, both signal paths are in use by the exemplary multipath digital audio combiner component or ramp generation and two path audio combiner component (RAMP GEN/TPAC) 120 associated with DSP 108, as depicted in FIG. 9. According to further non-limiting aspects, the signal paths (e.g., LSPL signal path 110L and HSPL signal path 110H) can be weighted by the exemplary multipath digital audio combiner component or ramp generation and two path audio combiner component (RAMP GEN/TPAC) 120 associated with DSP 108 using complementary weights, such that there sum is equal to 1, as further depicted in FIG. 9. According to a further non-limiting aspect, the complementary weights can be defined by a ramp step (db) and a duration in milliseconds (ms) ($T_{HL}$ 402, $T_{LH}$ 404), which complementary weights can vary according to DSP 108 clock frequency Fclk, and which complementary weights can be employed by exemplary multipath digital audio combiner component or ramp generation and two path audio combiner component (RAMP GEN/TPAC) 120 to facilitate seamless signal mixing and state transitions.

Thus, for the transition from State S1 306 to State S2 308, exemplary multipath digital audio combiner component or ramp generation and two path audio combiner component (RAMP GEN/TPAC) 120 associated with DSP 108 can be configured to conduct a transition from LSPL signal path 110L to the HSPL signal path 110H, where the weight of the LSPL signal path 110L is gradually reduced 406 by the exemplary multipath digital audio combiner component or ramp generation and two path audio combiner component (RAMP GEN/TPAC) 120 associated with DSP 108 from 1 to 0, while simultaneously the weight of the HSPL signal path 110H is gradually increased 408 by the exemplary multipath digital audio combiner component or ramp generation and two path audio combiner component (RAMP GEN/TPAC) 120 associated with DSP 108 from 0 to 1.

Note that the decreasing 406 weight ramp from LSPL signal path 110L to HSPL signal path 110H is steeper ($T_{LH}$ duration shorter), than that of the decreasing 410 weight ramp for HSPL signal path 110H to LSPL signal path 110L, because when the incoming signal amplitude or SPL 322 is increasing, the transition should be undertaken quickly to avoid saturating the LSPL signal path 110L ADC. Conversely, decreasing weight 410 ramp from HSPL signal path 110H to LSPL signal path 110L can be more gradual (THL duration longer), than that of the of the decreasing 408 weight ramp for LSPL signal path 110L to HSPL signal path 110H, because when the incoming signal amplitude or SPL 322 is decreasing, the transition can be undertaken more gradually to ensure a more smooth transition between the HSPL signal path 110H and the LSPL signal path 110L. Note that both SPL signal path 110L and HSPL signal path 110H during $T_{HL}$ 402 and $T_{LH}$ 404) are fully operational and powered to nominal power levels.

Note that, as in FIG. 8, reference to incoming signal amplitude or SPL 322 is based on the one or more signal or sound pressure level estimation components (SPL EST) 112 (e.g., LSPL signal path SPL estimation 112L, HSPL signal path SPL estimation 112H) associated with the DSP 108 estimates of the incoming signal amplitude. However, note that regarding FIG. 9, reference to LSPL signal path 110L and HSPL signal path 110H, regarding mixing of signals via exemplary multipath digital audio combiner component or ramp generation and two path audio combiner component (RAMP GEN/TPAC) 120 associated with DSP 108, refers to the signals into exemplary multipath digital audio combiner component or ramp generation and two path audio combiner component (RAMP GEN/TPAC) 120 associated with DSP 108, and not any signals further up the signal paths 110 (e.g., LSPL signal path 110L, HSPL signal path 110H) toward exemplary MEMS acoustic sensor or microphone, and in the absence of any concurrent temporary power reduction and restoration or dynamic power allocation aspects depicted.

Thus, FIG. 9 depicts signal path mixing 900 as timed with concurrent temporary power reduction and restoration or dynamic power allocation aspects. Accordingly, FIG. 9 further depicts a relative power $P_{HSPL}$ 902 and $P_{LSPL}$ 904 of the signal paths 110 (e.g., HSPL signal path 110H) between powered down (0) and nominal operating power (1) during exemplary power reductions and restorations controlled by gain adjustment component (e.g., exemplary gain adjustment component or control finite state machine (CTRL FSM) 116) (e.g., via power control signal 706).

Note that while reference to LSPL signal path 110L and HSPL signal path 110H, regarding mixing of signals via exemplary multipath digital audio combiner component or ramp generation and two path audio combiner component (RAMP GEN/TPAC) 120 associated with DSP 108, refers to the signals into exemplary multipath digital audio combiner component or ramp generation and two path audio combiner component (RAMP GEN/TPAC) 120 associated with DSP 108, and not any signals further up the signal paths 110 (e.g., LSPL signal path 110L, HSPL signal path 110H) toward exemplary MEMS acoustic sensor or microphone, and in the absence of any concurrent temporary power reduction and restoration or dynamic power allocation aspects depicted, power reduction/restoration in the signal paths 110 (e.g., LSPL signal path 110L, HSPL signal path 110H) would be expected to change the signals into exemplary multipath digital audio combiner component or ramp generation and two path audio combiner component (RAMP GEN/TPAC) 120 associated with DSP 108. Note further that, power in the signal paths 110 (e.g., LSPL signal path 110L, HSPL signal path 110H) powered down (0) can be understood as power of a signal path 110 (e.g., LSPL signal path 110L, HSPL signal path 110H) powered down as described regarding FIGS. 1-6 (e.g., a lower limit of power and not necessarily an absolute value of 0). Further note that power in the signal paths 110 (e.g., LSPL signal path 110L, HSPL signal path 110H) powered up (1) can be understood as power of a signal path 110 (e.g., LSPL signal path 110L, HSPL signal path 110H) nominally powered as described regarding FIGS. 1-6 (e.g., not necessarily a fixed value or at a maximum power), as a result of variability of component power in response to varying SPL and GST and ADC gain. Additionally, note that the relative timeline is shown exaggerated and not necessarily to scale for purpose of illustration, e.g., showing points 334 and 326 before State S1 306 and State S2 308, respectively.

Accordingly, FIG. 9 depicts relative power $P_{HSPL}$ 902 and $P_{LSPL}$ 904 of the signal paths 110 (e.g., HSPL signal path 110H) between powered down (0) and nominal operating power (1) as controlled by gain adjustment component (e.g., exemplary gain adjustment component or control finite state machine (CTRL FSM) 116) configured to control (e.g., via power control signal 706) the power reduction for the signal paths 110 (e.g., LSPL signal path 110L) based on signal levels (e.g., respective signal levels 114 (e.g., LSPL signal level 114L, HSPL signal level 114H)) and a selected state transition (e.g., at State S2 308) to provide a temporary power reduction and subsequent power restoration in the signal paths 110 (e.g., LSPL signal path 110L), as further described herein.

Thus, in State S2 308, where $P_{HSPL}$ 902 is in a reduced state at 906, if incoming signal amplitude or SPL 322 is decreasing and passing though TR2 334, then exemplary gain adjustment component or control finite state machine (CTRL FSM) 116 manages transition from State S2 308 to State S1 306 or S21 804, once counterdone 332 counter expires, restoring power to the signal paths 110 (e.g., LSPL signal path 110L) to nominal power at 908, and directing 346 exemplary multipath digital audio combiner component or ramp generation and two path audio combiner component (RAMP GEN/TPAC) 120 to facilitate the state transition, as further described herein regarding FIG. 9.

At this point (e.g., at State S1 306), and thereafter with decreasing or steady incoming signal level, gain adjustment component (e.g., exemplary gain adjustment component or control finite state machine (CTRL FSM) 116) can be configured to control (e.g., via power control signal 706) the power reduction for the signal paths 110 (e.g., HSPL signal path 110H) based on signal levels (e.g., respective signal levels 114 (e.g., LSPL signal level 114L, HSPL signal level 114H)) and a selected state transition (e.g., at State S1 306) to provide a temporary power reduction in the signal paths 110 (e.g., HSPL signal path 110H), at 910, as further described herein.

If incoming signal amplitude or SPL 322 is increasing and passing though TA2 326, then exemplary gain adjustment component or control finite state machine (CTRL FSM) 116 manages transition from State S1 306 to State S2 308, via, for example, gain adjustment component (e.g., exemplary gain adjustment component or control finite state machine (CTRL FSM) 116) configured to control (e.g., via power control signal 706) the power restoration at 912 for the signal paths 110 (e.g., HSPL signal path 110H) to a nominal level at 914 based on signal levels (e.g., respective signal levels 114 (e.g., LSPL signal level 114L, HSPL signal level 114H)) and a selected state transition as a prelude to the transitions from State S1 306 to State S2 308 or State S12 802.

At this point (e.g., at State S2 308), and thereafter with increasing or steady incoming signal level, gain adjustment component (e.g., exemplary gain adjustment component or control finite state machine (CTRL FSM) 116) can be configured to control (e.g., via power control signal 706) the power reduction for the signal paths 110 (e.g., LSPL signal path 110L) at 916 based on signal levels (e.g., respective signal levels 114 (e.g., LSPL signal level 114L, HSPL signal level 114H)) and a selected state transition (e.g., at State S2 308, from State S2 308 to S3 310) to provide a temporary power reduction in the signal paths 110 (e.g., LSPL signal path 110L), as further described herein.

Accordingly, referring again to FIG. 8, in various non-limiting embodiments, from State S0 304 to S1 306, HSPL signal path 110H can be temporarily and smoothly configured into a low power condition by exemplary gain adjustment component (e.g., exemplary gain adjustment component or control finite state machine (CTRL FSM) 116) configured to control (e.g., via power control signal 706) the power reduction/restoration for the signal paths 110 (e.g., LSPL signal path 110L, HSPL signal path 110H). Thus, HSPL signal path 110H is in a temporary energy saving condition (e.g. one or more of lower bias or current and/or lower clock for ADC and DSP components) with LSPL signal path 110L fully functional.

Similarly, in further non-limiting embodiments, from State S2 308 to S3 310, LSPL signal path 110L can be temporarily and smoothly configured into a low power condition by exemplary gain adjustment component (e.g., exemplary gain adjustment component or control finite state machine (CTRL FSM) 116) configured to control (e.g., via power control signal 706) the power reduction/restoration for the signal paths 110 (e.g., LSPL signal path 110L, HSPL signal path 110H). Thus, LSPL signal path 110L is in a temporary energy saving condition (e.g. one or more of lower bias or current and/or lower clock for ADC and DSP components) with HSPL signal path 110H fully functional.

In still further non-limiting embodiments, at State S12 802, HSPL signal path 110H is restored to fully functional, whereas at State S21, LSPL signal path 110L is restored to fully functional, by exemplary gain adjustment component (e.g., exemplary gain adjustment component or control finite state machine (CTRL FSM) 116) configured to control (e.g., via power control signal 706) the power reduction/restoration for the signal paths 110 (e.g., LSPL signal path 110L, HSPL signal path 110H).

Thus the power restorations for the signal paths 110 (e.g., LSPL signal path 110L, HSPL signal path 110H) occur as a prelude to the transitions from State S1 306 to State S2 308 (e.g., at State S12 802) or State S2 308 to State S1 306 (e.g., at State S21 804), respectively, whereas power reductions occur after the completion of the transitions from State S1 306 to State S2 308 or State S2 308 to State S1 306, respectively, in lieu of completely powering down the unused signal path or portions thereof.

Accordingly, various disclosed embodiment can comprise an ASIC (e.g., ASIC 100/200/700) associated with a MEMS acoustic sensor and having two or more signal paths 110 (e.g., LSPL signal path 110L, HSPL signal path 110H) associated with the MEMS acoustic sensor, wherein the two or more signal paths 110 (e.g., LSPL signal path 110L, HSPL signal path 110H) have different gains provided by two or more gain stage amplifiers (e.g., GST amplifier 506L, GST amplifier 506H).

In further non-limiting embodiments, a DSP (e.g., DSP 108) associated with the ASIC (e.g., ASIC 100/200/700) configured to receive two or more signals from two or more adjustable ADCs (e.g., adjustable ADC 106L, adjustable ADC 106H) associated with the two or more gain stage amplifiers (e.g., GST amplifier 506L, GST amplifier 506H), as described herein.

In addition, disclosed embodiments can comprise a gain adjustment component or control finite state machine (CTRL FSM) 116 associated with the DSP (e.g., DSP 108) configured to adjust respective gains associated with the two or more adjustable ADCs (e.g., adjustable ADC 106L, adjustable ADC 106H) based on respective signal levels 114 (e.g., LSPL signal level 114L, HSPL signal level 114H) associated with the two or more signal paths 110 (e.g., LSPL signal path 110L, HSPL signal path 110H), wherein the gain adjustment component or control finite state machine (CTRL FSM) 116 can be configured to coordinate switching among at least respective portions of the two or more signal paths 110 (e.g., LSPL signal path 110L, HSPL signal path 110H) based on the respective signal levels 114 (e.g., LSPL signal level 114L, HSPL signal level 114H) and a selected transition of modes based on one or more of a performance criteria (e.g., gain, DR, SNR) or a power consumption criteria (e.g., muting instruction, off instruction, power-saving mode instruction, for example, via an exemplary OWCI), and wherein the gain adjustment component or control finite state machine (CTRL FSM) 116 can be configured to coordinate temporary power (e.g., one of $P_{HSPL}$ 902 or $P_{LSPL}$ 904) reduction and power (e.g., one of $P_{HSPL}$ 902 or $P_{LSPL}$ 904) restoration associated with an unused portion of the two or more signal paths 110 (e.g., LSPL signal path 110L, HSPL signal path 110H) based on the selected transition of modes and respective signal levels 114 (e.g., LSPL signal level 114L, HSPL signal level 114H) associated with the two or more signal paths 110 (e.g., LSPL signal path 110L, HSPL signal path 110H).

In a non-limiting aspect, an exemplary gain adjustment component or control finite state machine (CTRL FSM) 116 can be configured to coordinate temporary power (e.g., one of $P_{HSPL}$ 902 or $P_{LSPL}$ 904) reduction and power (e.g., one of $P_{HSPL}$ 902 or $P_{LSPL}$ 904) restoration by directing one or more of reduction or restoration of gain stage current associated with an unused one of the two or more gain stage amplifiers (e.g., GST amplifier 506L, GST amplifier 506H), reduction or restoration of clock frequency (e.g., via CLOCK GEN 702L, 702H) of an unused one of the two or more adjustable ADCs (e.g., adjustable ADC 106L, adjustable ADC 106H), reduction or restoration of clock frequency (e.g., via CLOCK GEN 702L, 702H) of a signal path component of the DSP (e.g., DSP 108) associated with the unused one of the two or more adjustable ADCs (e.g., adjustable ADC 106L, adjustable ADC 106H), or reduction or restoration of current of the unused one of the two or more adjustable ADCs (e.g., adjustable ADC 106L, adjustable ADC 106H).

In non-limiting aspects, an exemplary DSP (e.g., DSP 108) can be configured to one or more of switch from operating the two or more signal paths 110 (e.g., LSPL signal path 110L, HSPL signal path 110H) to a single signal path or switch from operating the single signal path to the two or more signal paths 110 (e.g., LSPL signal path 110L, HSPL signal path 110H), wherein the two or more signal paths 110 (e.g., LSPL signal path 110L, HSPL signal path 110H) comprises at least a high sound pressure level signal path (e.g., HSPL signal path 110H) and a low sound pressure level signal path (e.g., LSPL signal path 110L), and wherein the high sound pressure level signal path (e.g., HSPL signal path 110H) is characterized at least in part by having one or more of a different performance characteristic or power characteristic relative to the low sound pressure level signal path (e.g., LSPL signal path 110L), and wherein the single signal path comprises the low sound pressure level signal path (e.g., LSPL signal path 110L).

According to further non-limiting aspects, an exemplary DSP (e.g., DSP 108) can be configured to switch to the low sound pressure level signal path (e.g., LSPL signal path 110L) using a multipath digital audio combiner component or ramp generation and two-path audio combine (RAMP GEN/TPAC) 120, restore power (e.g., one of $P_{HSPL}$ 902 or $P_{LSPL}$ 904) associated with the low sound pressure level signal path (e.g., LSPL signal path 110L) using the gain adjustment component or control finite state machine (CTRL FSM) 116, switch to the low sound pressure level signal path (e.g., LSPL signal path 110L) using the multipath digital audio combiner component or ramp generation and two-path audio combine (RAMP GEN/TPAC) 120, which can be further configured to generate the output signal based on a respective portion of the low sound pressure level signal path (e.g., LSPL signal path 110L) and a minimum transition time configured to allow the respective portion of the low sound pressure level signal path (e.g., LSPL signal path 110L) to stabilize, and temporarily reduce power (e.g., one of $P_{HSPL}$ 902 or $P_{LSPL}$ 904) associated with the high sound pressure level signal path (e.g., HSPL signal path 110H) as directed by the gain adjustment component or control finite state machine (CTRL FSM) 116.

In still other non-limiting aspects, an exemplary DSP (e.g., DSP 108) can be configured to temporarily reduce power (e.g., one of $P_{HSPL}$ 902 or $P_{LSPL}$ 904) associated with the high sound pressure level signal path (e.g., HSPL signal path 110H) as directed by the gain adjustment component or control finite state machine (CTRL FSM) 116 by one or more of reducing gain stage current associated with the unused one of the two or more gain stage amplifiers (e.g., GST amplifier 506L, GST amplifier 506H) associated with the high sound pressure level signal path (e.g., HSPL signal path 110H), reducing clock frequency (e.g., via CLOCK GEN 702L, 702H) of the unused one of the two or more adjustable ADCs (e.g., adjustable ADC 106L, adjustable ADC 106H) associated with the high sound pressure level signal path (e.g., HSPL signal path 110H), reducing clock frequency (e.g., via CLOCK GEN 702L, 702H) of the signal path component of the DSP (e.g., DSP 108) associated with the unused one of the two or more adjustable ADCs (e.g., adjustable ADC 106L, adjustable ADC 106H) of the high sound pressure level signal path (e.g., HSPL signal path 110H), or reducing current of the unused one of the two or more adjustable ADCs (e.g., adjustable ADC 106L, adjustable ADC 106H) associated with the high sound pressure level signal path (e.g., HSPL signal path 110H), as further described herein.

According to other non-limiting aspects, an exemplary DSP (e.g., DSP 108) can be configured to restore power (e.g., one of $P_{HSPL}$ 902 or $P_{LSPL}$ 904) associated with the low sound pressure level signal path (e.g., LSPL signal path 110L) using the gain adjustment component or control finite state machine (CTRL FSM) 116 to one or more of restore gain stage current associated with the unused one of the two or more gain stage amplifiers (e.g., GST amplifier 506L, GST amplifier 506H) associated with the low sound pressure level signal path (e.g., LSPL signal path 110L), restore clock frequency (e.g., via CLOCK GEN 702L, 702H) of the unused one of the two or more adjustable ADCs (e.g., adjustable ADC 106L, adjustable ADC 106H) associated with the low sound pressure level signal path (e.g., LSPL signal path 110L), restore clock frequency (e.g., via CLOCK GEN 702L, 702H) of the signal path component of the DSP (e.g., DSP 108) associated with the unused one of the two or more adjustable ADCs (e.g., adjustable ADC 106L, adjustable ADC 106H) of the low sound pressure level signal path (e.g., LSPL signal path 110L), or restore current of the unused one of the two or more adjustable ADCs (e.g., adjustable ADC 106L, adjustable ADC 106H) associated with the low sound pressure level signal path (e.g., LSPL signal path 110L).

In other non-limiting examples, an exemplary DSP (e.g., DSP 108) can be configured to switch to the high sound pressure level signal path (e.g., HSPL signal path 110H) using a multipath digital audio combiner component or ramp generation and two-path audio combine (RAMP GEN/TPAC) 120, restore power (e.g., one of $P_{HSPL}$ 902 or $P_{LSPL}$ 904) associated with the high sound pressure level signal path (e.g., HSPL signal path 110H) using the gain adjustment component or control finite state machine (CTRL FSM) 116, switch to the high sound pressure level signal path (e.g., HSPL signal path 110H) using the multipath digital audio combiner component or ramp generation and two-path audio combine (RAMP GEN/TPAC) 120 further configured to generate the output signal based on a respective portion of the high sound pressure level signal path (e.g., HSPL signal path 110H) and another minimum transition time configured to allow the respective portion of the high sound pressure level signal path (e.g., HSPL signal path 110H) to stabilize, and temporarily reduce power (e.g., one of $P_{HSPL}$ 902 or $P_{LSPL}$ 904) associated with the high sound pressure level signal path (e.g., HSPL signal path 110H) as directed by the gain adjustment component or control finite state machine (CTRL FSM) 116, as further described herein.

According to further non-limiting examples, an exemplary DSP (e.g., DSP 108) can be configured to temporarily reduce power (e.g., one of $P_{HSPL}$ 902 or $P_{LSPL}$ 904) associated with the low sound pressure level signal path (e.g., LSPL signal path 110L) as directed by the gain adjustment component or control finite state machine (CTRL FSM) 116 by one or more of reducing gain stage current associated with the unused one of the two or more gain stage amplifiers (e.g., GST amplifier 506L, GST amplifier 506H) associated with the low sound pressure level signal path (e.g., LSPL signal path 110L), reducing clock frequency (e.g., via CLOCK GEN 702L, 702H) of the unused one of the two or more adjustable ADCs (e.g., adjustable ADC 106L, adjustable ADC 106H) associated with the low sound pressure level signal path (e.g., LSPL signal path 110L), reducing clock frequency (e.g., via CLOCK GEN 702L, 702H) of the signal path component of the DSP (e.g., DSP 108) associated with the unused one of the two or more adjustable ADCs (e.g., adjustable ADC 106L, adjustable ADC 106H) of the low sound pressure level signal path (e.g., LSPL signal path 110L), or reducing current of the unused one of the two or more adjustable ADCs (e.g., adjustable ADC 106L, adjustable ADC 106H) associated with the low sound pressure level signal path (e.g., LSPL signal path 110L).

In still other non-limiting aspects, an exemplary DSP (e.g., DSP 108) can be configured to restore power (e.g., one of $P_{HSPL}$ 902 or $P_{LSPL}$ 904) associated with the high sound pressure level signal path (e.g., HSPL signal path 110H) using the gain adjustment component or control finite state machine (CTRL FSM) 116 to one or more of restore gain stage current associated with the unused one of the two or more gain stage amplifiers (e.g., GST amplifier 506L, GST amplifier 506H) associated with the high sound pressure level signal path (e.g., HSPL signal path 110H), restore clock frequency (e.g., via CLOCK GEN 702L, 702H) of the unused one of the two or more adjustable ADCs (e.g., adjustable ADC 106L, adjustable ADC 106H) associated with the high sound pressure level signal path (e.g., HSPL signal path 110H), restore clock frequency (e.g., via CLOCK GEN 702L, 702H) of the signal path component of the DSP (e.g., DSP 108) associated with the unused one of the two or more adjustable ADCs (e.g., adjustable ADC 106L, adjustable ADC 106H) of the high sound pressure level signal path (e.g., HSPL signal path 110H), or restore current of the unused one of the two or more adjustable ADCs (e.g., adjustable ADC 106L, adjustable ADC 106H) associated with the high sound pressure level signal path (e.g., HSPL signal path 110H), as further described herein.

Figure 10:
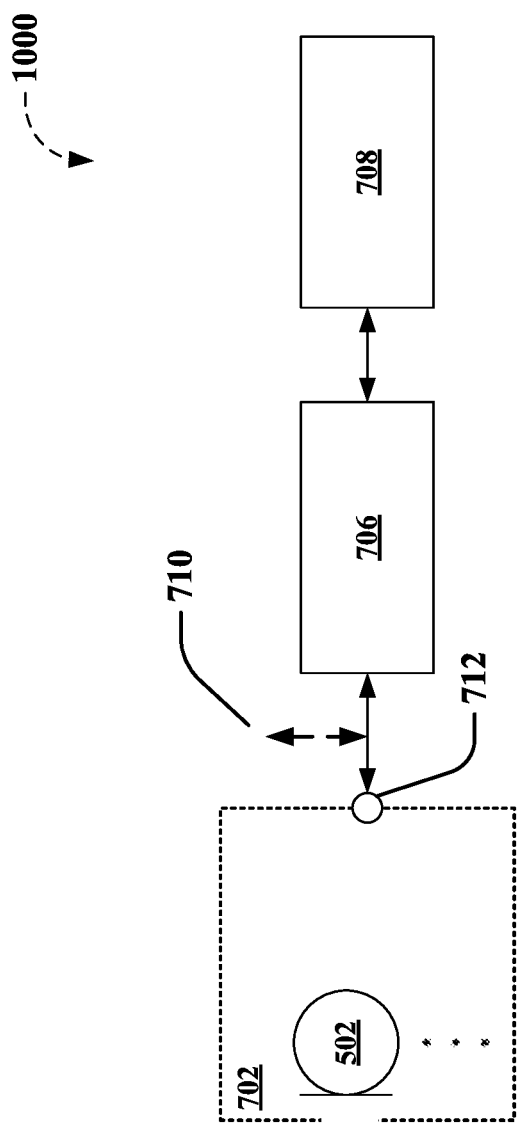
FIG. 10 depicts a non-limiting operating environment comprising exemplary microelectromechanical systems (MEMS) sensor, control interface component, and external controller, in which non-limiting aspects of the subject disclosure can be practiced.

As described herein various power saving or select performance modes may be selected via sources external to exemplary MEMS acoustic sensor or microphone 502. Accordingly, FIG. 10 depicts a non-limiting operating environment 1000 comprising an exemplary MEMS sensor 1002, which can comprise a MEMS transducer (e.g., a MEMS acoustic sensor 1002 comprising MEMS acoustic sensor or microphone 502, etc.), a control interface component 1006, and an external controller 1008, in which non-limiting aspects of the subject disclosure can be practiced. As can be appreciated, MEMS sensor 1002 can comprise, but are not limited to, gyroscopes, accelerometers, magnetometers, pressure sensors, acoustic sensors or microphones, and radio-frequency components. But for the purpose of illustration and not limitation, MEMS sensor 1002 refers herein to MEMS acoustic sensor or microphone 501, as further described herein regarding FIGS. 1-9, conventional MEMS sensor 1002 can comprise MEMS transducer 1004 coupled to components and/or circuitry for sensor signal conditioning, which in turn, can be coupled to an output pin of a package comprising MEMS sensor 1002. In addition, MEMS sensor 1002 can further comprise one or more registers coupled to the MEMS transducer 1004 and the components and/or circuitry for sensor signal conditioning. Some of the one or more registers can be employed to control different functions of the MEMS sensor 1002, such as, for example, trim and test functions built into components and/or circuitry for sensor signal conditioning, which, in turn, can process an output from the MEMS transducer 1004 and can produce a MEMS sensor output. MEMS sensor 1002 can also comprise other components and/or circuitry, such as, for example, components and/or circuitry for internal voltage regulation, gain and bias adjustment, performance mode selection, power-saving mode selection, multiplexing and/or demultiplexing of signals, and similar purposes, some of which are described herein regarding FIGS. 1-9.

Control interface component 1006 is depicted external to a package comprising MEMS sensor 1002, but as further described herein, control interface component 1006 can be included in a package comprising MEMS sensor 1002, can include or be integrated, in whole or in part, with an ASIC associated with MEMS sensor 1002 (e.g., ASIC 100/200/700), and/or portions thereof. As further described herein, control interface component 1006 can provide flexible and reusable control interfaces for a variety of MEMS sensors 1002, for example, by reusing existing pins for communication with one or more of the MEMS sensors of a MEMS sensor package (e.g., package comprising MEMS sensor 1002 and/or one or more other MEMS sensors), while enabling write and read of internal registers associated with MEMS sensors.

In the exemplary operating environment 1000, the control interface component 1006 is depicted as connected via a signal 1010 line to existing pin 1012 for communication with one or more of the MEMS sensors of a MEMS sensor package (e.g., package comprising MEMS sensor 1002). For instance, as further described herein, an existing pin 1012 can provide an exemplary control pin for receiving control signals, such as can be the case for an OUTPUT pin of an analog MEMS acoustic sensor, L/R pin for a PDM digital MEMS acoustic sensor, configuration or L/R pin for an Inter-Integrated-Circuit Sound ($I^2S$)/time-division multiplexed (TDM) digital MEMS acoustic sensor, and similarly provided outputs such as PDM signal (e.g., MEMS ASIC output signal 214).

As further described herein, exemplary control interface component 1006 can comprise one or more of an interface component configured to receive a control signal associated with MEMS sensor 1002, a processing component configured to determine whether a control symbol is present in the control signal based on a width of a pulse associated with the control signal and a clock signal associated with MEMS sensor 1002, and a controller component configured to control operations related to MEMS sensor 1002 based on the control symbol, for example, as further described herein. For example, an exemplary interface component 1006 can comprise components and/or circuitry for data and/or clock conditioning, which can facilitate, for example, conditioning signals for digital data signaling. As a further non-limiting example, an exemplary processing component can comprise processing functionality provided by one or more of a microcontroller (MCU), a digital signal processor (DSP), a field programmable gate array (FPGA), and/or an ASIC, a central processing unit (CPU), and/or portions or combinations thereof. In further non-limiting examples, an exemplary controller component can be coupled between one or more of an exemplary interface component and/or an exemplary processing component and the one or more registers coupled to the MEMS acoustic sensor or microphone 502. Note that in the context of an exemplary control interface component 1006 comprising or associated with a DSP, or other processing component configured to determine whether a control symbol is present in a control signal, that any such DSP or other processing component functionality provided is different from that associated with the DSP 108 implemented as part of an exemplary ASIC 100/200/700, as further described herein.

In addition, exemplary control interface component 1006 can further comprise or be associated with a storage component (e.g., comprising a memory such as a nonvolatile memory, one or more registers, etc.) configured to, for example, store a dynamic reference pulse width to facilitate a determination of whether the control symbol is included in the control signal, for example, where the dynamic reference pulse width can be employed in MEMS sensor control interfaces and associated protocols based on pulse-width detection, as further described herein. As further described herein, one or more of exemplary interface component, processing component, control component, and/or storage component, and/or portions or combinations thereof can be included in a package comprising MEMS sensor 1002, and can include or be integrated, in whole or in part, with an ASIC and/or components and/or circuitry associated MEMS sensor 1002, and/or portions thereof.

As described, non-limiting operating environment 1000 can comprise an exemplary an external controller 1008. According to non-limiting aspects, exemplary external controller 1008 can be included in an exemplary host system that can comprise a testing platform employed during production, characterization, sort, etc., a system processor and/or external device associated with MEMS sensor 1002, and/or an application processor of a device comprising or associated with MEMS sensor 1002 such as a feature phone, smartphone, smart watch, tablet, eReader, netbook, automotive navigation device, gaming console or device, wearable computing device, GPS device, and so on, without limitation. Accordingly, a host system comprising exemplary external controller 1008 can comprise test equipment, another sensor, a digital signal processor, an application processor, a sensor hub, a coder-decode (codec), and/or the like.

Accordingly, exemplary external controller 1008 can comprise one or more of a controller component configured to generate a control symbol in a control signal associated with MEMS sensor 1002 (e.g., a control signal based on a pulse having a pulse width associated with a clock signal related to MEMS sensor 1002), a transmission component configured to transmit the control signal to MEMS sensor 1002 on a pin 1012 of a package comprising MEMS sensor 1002 and configured to a transmit or receive another signal 1010 in addition to signals associated with the control signal, for example, as further described herein. In addition, exemplary external controller 1008 can also comprise a communications component configured to receive or transmit data from or to one or more registers associated with MEMS sensor 1002 based on the control symbol. Further non-limiting implementations of exemplary external controller 1008 can also comprise a storage component configured to store a dynamic reference pulse width to facilitate generation of the pulse, where the dynamic reference pulse width can be employed in MEMS sensor control interfaces and associated protocols based on pulse-width detection, as further described herein.

For example, one or more of an exemplary controller component, transmission component, communications component, and/or a storage component, and/or portions thereof can comprise processing or other functionality provided by one or more of an MCU, a DSP, an FPGA, a CPU, and/or an ASIC, and/or portions thereof. In addition, as further described herein, one or more of exemplary controller component, transmission component, communications component, and/or a storage component, and/or portions or combinations thereof can be included in a device or system comprising or associated with MEMS sensor 1002, and can include or be integrated, in whole or in part, with an MCU, a DSP, an FPGA, a CPU, and/or an ASIC, and/or portions, components, and/or circuitry associated with device or system comprising or associated with MEMS sensor 1002, and/or portions thereof.

Accordingly, exemplary MEMS sensor 1002 can receive data and/or instructions from exemplary external controller 1008, via existing pin 1012 configured as a control pin by, for example, control interface component 1006, according to exemplary control interfaces and associated protocols as described herein. Thus, the subject disclosure briefly describes exemplary control interfaces and associated protocols that can facilitate one or more of identification, testing, programming, observation, configuration, control, and/or compensating of one or more MEMS sensors included in a package, for example, as further described herein, including, but not limited to the methods and processes described herein regarding FIGS. 1-9 and 9-10.

As a non-limiting example, one or more control symbols can be predefined based on the width of a pulse of a signal on a control pin (e.g., existing pin 1012), such that a dynamic reference pulse width of a pilot signal can be employed in MEMS sensor control interfaces and associated protocols, where the width of a pulse determined by pulse-width detection can be employed to define the control symbols employed in the protocol associated with the control interface, as further described herein. In a non-limiting aspect, except for knowledge of a clock signal, a singular control pin (e.g., existing pin 1012) can be sufficient to enable information transfer and/or control associated with MEMS sensor 1002, as provided by various embodiments described herein. Accordingly, in non-limiting embodiments, the information transfer can be bidirectional, where high level pulse width of a signal on the control pin (e.g., existing pin 1012) can be employed to define the communication protocol, for example, as further described herein.

Figure 11:
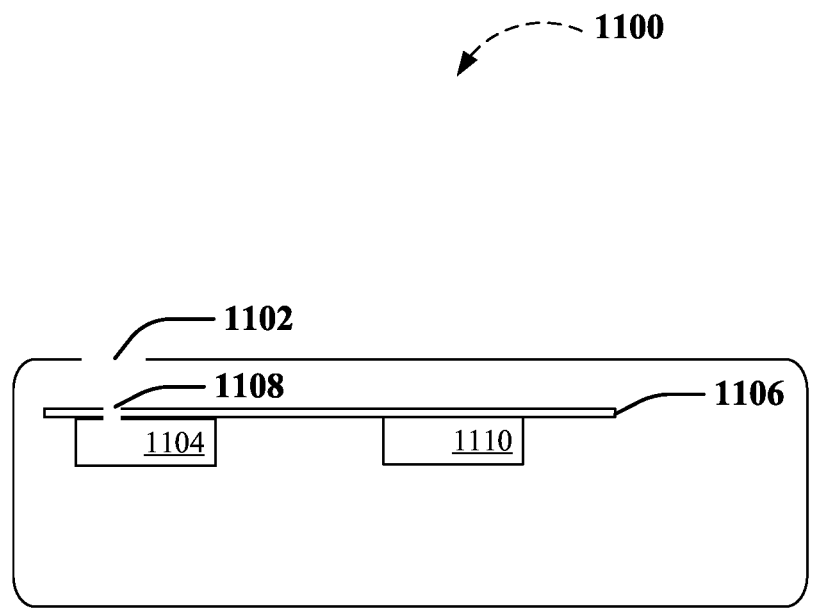
FIG. 11 illustrates a functional block diagram of non-limiting host system that can comprise or be associated with an exemplary MEMS sensor and control interface component, according to various non-limiting aspects of the subject disclosure.

FIG. 11 illustrates a functional block diagram of non-limiting host system 1100 that can comprise or be associated with an exemplary MEMS sensor (e.g., exemplary MEMS acoustic sensor or microphone 502 and/or associated ASIC 100/200/700) and exemplary control interface component 1006, and/or portions thereof, according to various non-limiting aspects of the subject disclosure. More specifically, a block diagram of a host system 1100 is shown to include an acoustic port 1102 and an exemplary MEMS sensor 1104 (e.g., comprising exemplary MEMS acoustic sensor or microphone 502) affixed to a PCB 1106 having an orifice 1108 or other means of passing acoustic waves or pressure to exemplary MEMS sensor 1104.

In addition, exemplary MEMS sensor 1104 (e.g., comprising exemplary MEMS acoustic sensor or microphone 502 comprising or associated with ASIC 100/200/700) can comprise or be associated with an exemplary control interface component 1006, and/or portions thereof, etc.). Host system 1100 can further comprise a device 1110, such as a host system 1100 processor, an external device associated with exemplary MEMS sensor 1104, and/or an application processor, that can be mechanically affixed to PCB 1106 and can be communicably coupled to exemplary MEMS sensor 1104, to facilitate generating and/or transmitting control signals comprising exemplary control symbols, instructions, data, and so on, reading and/or writing data or from one or more registers associated with MEMS sensor 1104, such as, for example, as described herein, regarding external controller 1008, and/or receiving and/or transmitting other signals, information, and/or data, from or to MEMS sensor 1104.

Figure 15:
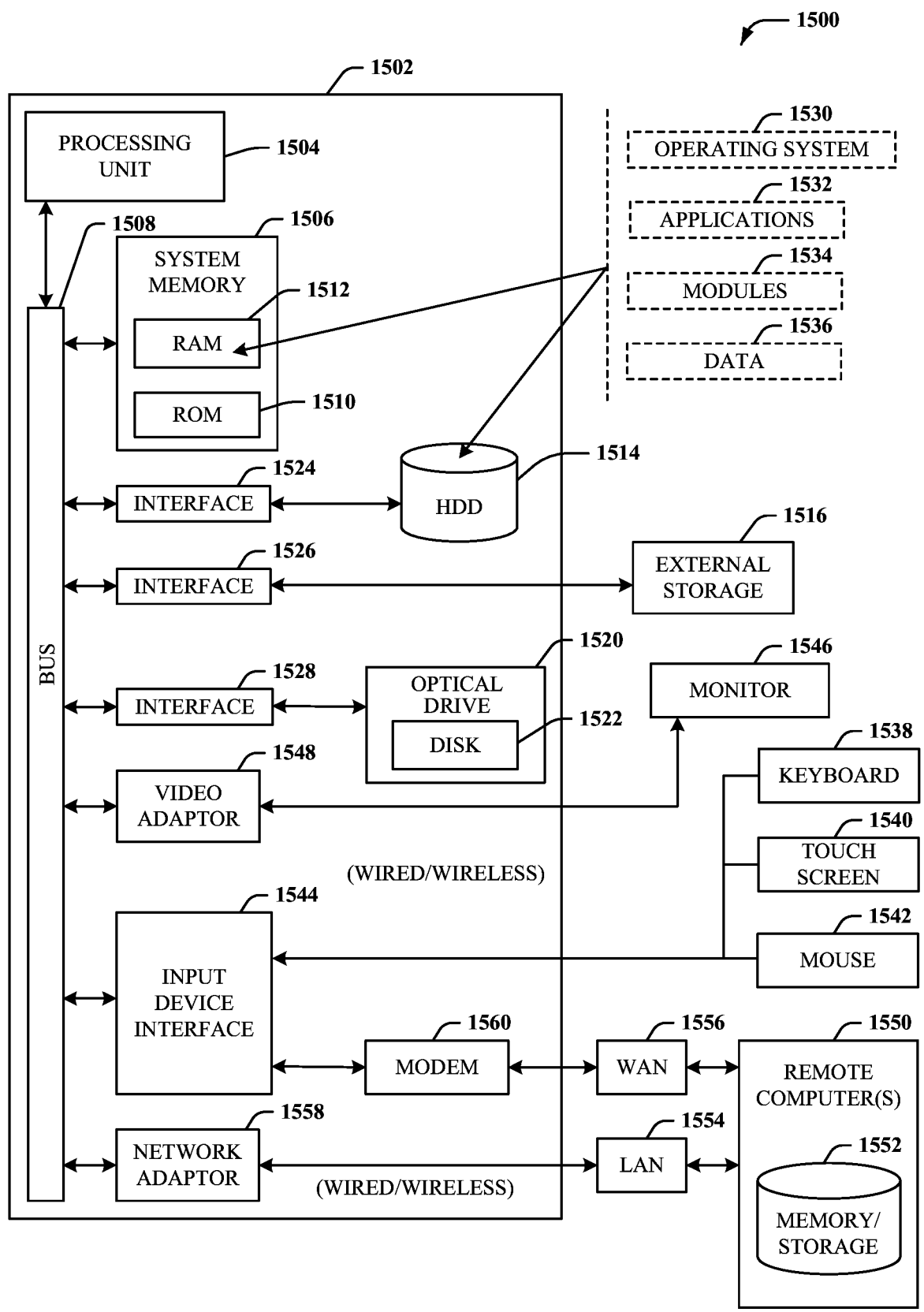
FIG. 15 depicts a functional block-diagram of an exemplary computing device suitable for practicing various non-limiting aspects described herein.

Exemplary host system 1100 can be any of a number of exemplary host systems that can comprise a system processor and/or external device comprising or associated with MEMS sensor 1104, and/or an application processor of a device comprising or associated with MEMS sensor 1104 such as a feature phone, smartphone, smart watch, tablet, eReader, netbook, automotive navigation device, gaming console or device, wearable computing device, GPS device, test, characterization, and/or sort platform, and so on, without limitation, for example, as further described herein regarding FIG. 15.

Figure 12:
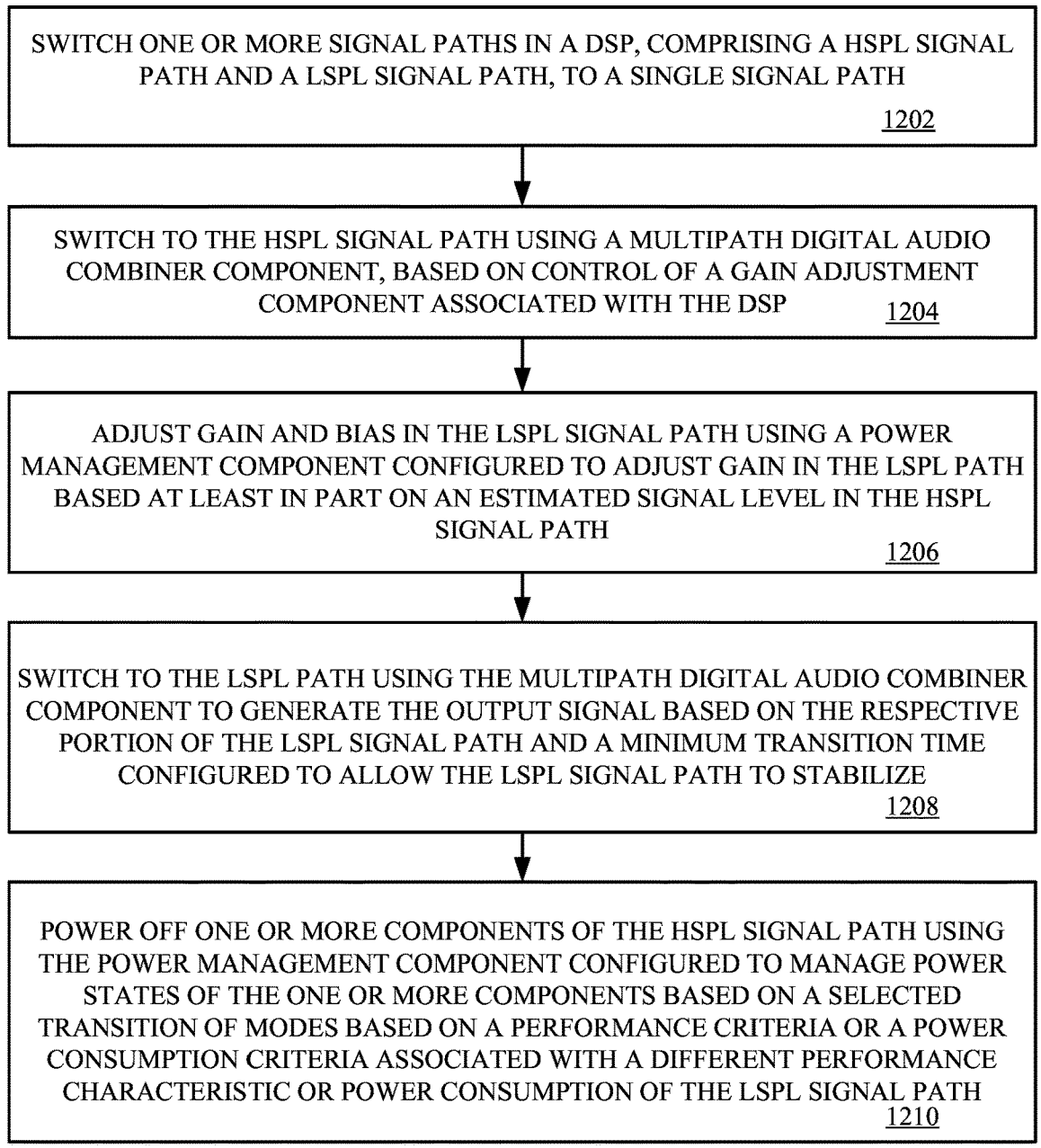
FIG. 12 depicts an exemplary flowchart of non-limiting methods associated with various non-limiting embodiments of the subject disclosure.
Figure 14:
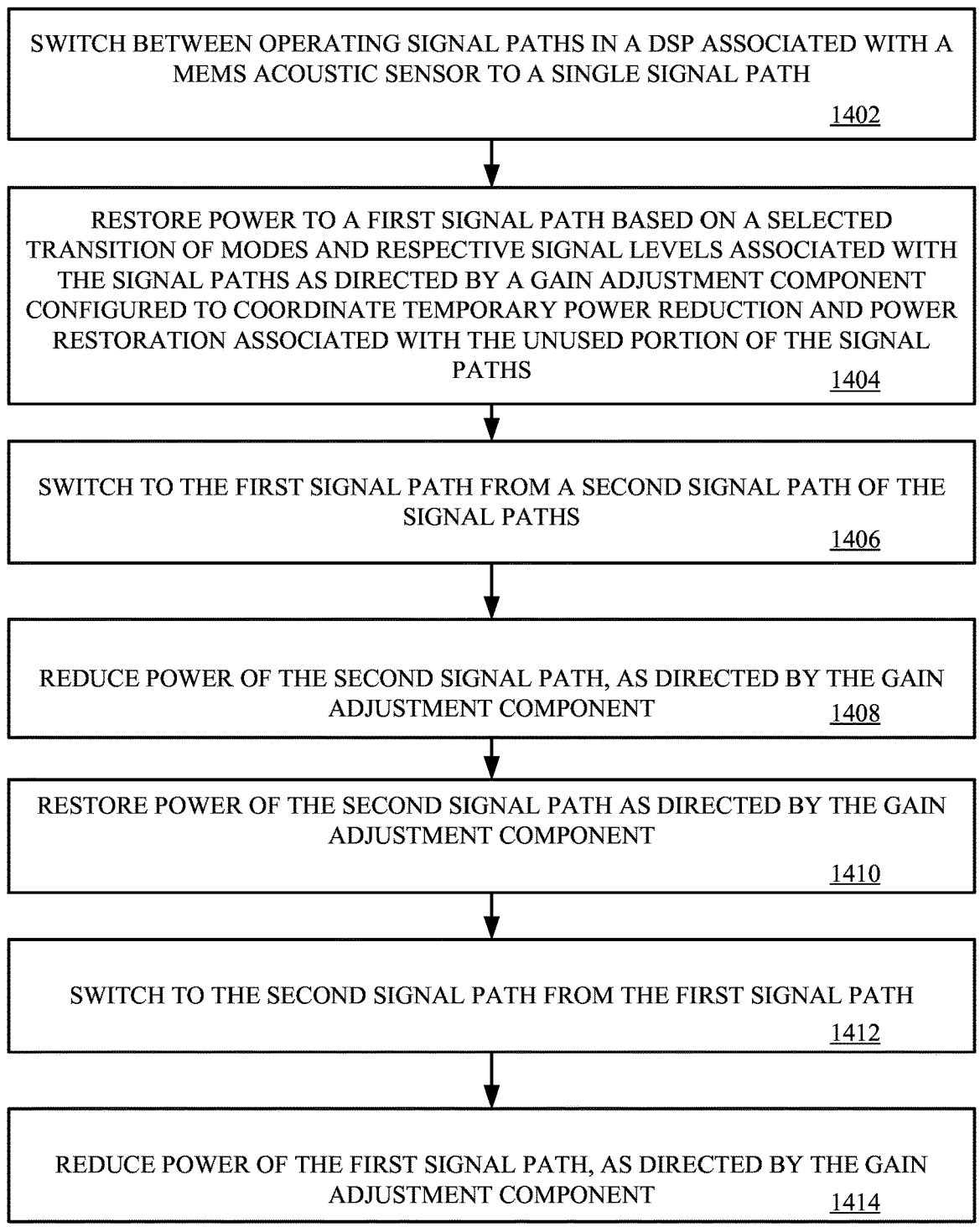
FIG. 14 depicts yet another exemplary flowchart of further non-limiting methods associated with non-limiting embodiments of the subject disclosure.

In view of the subject matter described supra, methods that can be implemented in accordance with the subject disclosure will be better appreciated with reference to the flowchart of FIGS. 12-14. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 12 depicts an exemplary flowchart of non-limiting methods 1200 associated with various non-limiting embodiments of the subject disclosure. For instance, exemplary methods 1200 can comprise, at 1202, switching from operating one or more signal paths 110 (e.g., LSPL signal path 110L, HSPL signal path 110H) of the MEMS acoustic sensor or microphone (e.g., MEMS acoustic sensor or microphone 502) in a digital signal processor (DSP) associated with a MEMS acoustic sensor or microphone (e.g., MEMS acoustic sensor or microphone 502) to a single signal path in the DSP, wherein the one or more signal paths 110 (e.g., LSPL signal path 110L, HSPL signal path 110H) of the MEMS acoustic sensor or microphone (e.g., MEMS acoustic sensor or microphone 502) comprises at least a HSPL signal path 110H and a LSPL signal path 110L, and wherein the HSPL signal path 110H can be characterized at least in part by having at least one of a different performance characteristic (e.g., DR, SNR) or power consumption relative to the LSPL signal path 110L, as further described herein regarding FIGS. 1-9.

In a further non-limiting aspect, exemplary methods 1200 can comprise, at 1204, switching to the HSPL signal path 110H using a multipath digital audio combiner component or ramp generation and two-path audio combine (RAMP GEN/TPAC) 120 configured to compensate for gain imbalance among at least respective portions of the one or more signal paths 110 (e.g., LSPL signal path 110L, HSPL signal path 110H) of the MEMS acoustic sensor or microphone (e.g., MEMS acoustic sensor or microphone 502) to generate an output signal (e.g., DSP output signal 122) and to mix signals associated with the at least respective portions of the one or more signal paths 110 (e.g., LSPL signal path 110L, HSPL signal path 110H) of the MEMS acoustic sensor or microphone (e.g., MEMS acoustic sensor or microphone 502), based at least in part on control of a gain adjustment component or control finite state machine (CTRL FSM) 116 associated with the DSP 108 configured to adjust respective gains associated with one or more adjustable ADCs 106 based at least in part on respective signal levels in the respective portions of the one or more signal paths 110, as further described herein regarding FIGS. 1-9.

In a another non-limiting aspect, exemplary methods 1200 can comprise, at 1206, adjusting gain and biasing in the LSPL signal path 110L using a power management component or auxiliary finite state machine (AUX FSM) 124 configured to adjust gain associated in the LSPL signal path 110L based at least in part on an estimated signal level in a respective portion of the HSPL signal path 110H, as further described herein regarding FIGS. 1-9. In still another non-limiting aspect, exemplary methods 1200 can comprise, at 1208, switching to the LSPL signal path 110L using the multipath digital audio combiner component or ramp generation and two-path audio combine (RAMP GEN/TPAC) 120 further configured to generate the output signal (e.g., DSP output signal 122) based at least in part on the respective portion of the LSPL signal path 110L and a minimum transition time configured to allow the respective portion of the LSPL signal path 110L to stabilize, as further described herein regarding FIGS. 1-9.

In addition, exemplary methods 1200 can further comprise, at 1210, powering off at least one component associated with the HSPL signal path 110H using the power management component or auxiliary finite state machine (AUX FSM) 124 configured to manage power states associated with components associated with the one or more signal paths 110 (e.g., LSPL signal path 110L, HSPL signal path 110H) of the MEMS acoustic sensor or microphone (e.g., MEMS acoustic sensor or microphone 502) in the DSP, based at least in part on a selected transition of modes based at least in part on at least one of a performance criteria (e.g., gain, DR, SNR) or a power consumption criteria (e.g., muting instruction, off instruction, power-saving mode instruction, for example, via an exemplary OWCI) associated with the at least one of a different performance characteristic (e.g., DR, SNR) or power consumption relative to the low sound pressure level signal path, as further described herein regarding FIGS. 1-9.

FIG. 13 depicts another exemplary flowchart of further non-limiting methods 1300 associated with various non-limiting embodiments of the subject disclosure. For instance, exemplary methods 1000 can comprise, at 1302, switching from operating a single signal path to one or more signal paths 110 (e.g., LSPL signal path 110L, HSPL signal path 110H) of the MEMS acoustic sensor or microphone (e.g., MEMS acoustic sensor or microphone 502) in a digital signal processor (DSP) associated with a MEMS acoustic sensor or microphone (e.g., MEMS acoustic sensor or microphone 502), wherein the single signal path comprises the LSPL signal path 110L, wherein the one or more signal paths 110 (e.g., LSPL signal path 110L, HSPL signal path 110H) of the MEMS acoustic sensor or microphone (e.g., MEMS acoustic sensor or microphone 502) comprises at least a HSPL signal path 110H and the LSPL signal path 110L, and wherein the HSPL signal path 110H can be characterized at least in part by having at least one of a different performance characteristic (e.g., DR, SNR) or power consumption relative to the LSPL signal path 110, as further described herein regarding FIGS. 1-9.

In addition, exemplary methods 1300 can further comprise, at 1304, powering on at least one component associated with the HSPL signal path 110H using a power management component or auxiliary finite state machine (AUX FSM) 124 configured to manage power states associated with components associated with the one or more signal paths 110 (e.g., LSPL signal path 110L, HSPL signal path 110H) of the MEMS acoustic sensor or microphone (e.g., MEMS acoustic sensor or microphone 502) in the DSP, based at least in part on a selected transition of modes based at least in part on at least one of a performance criteria (e.g., gain, DR, SNR) or a power consumption criteria (e.g., muting instruction, off instruction, power-saving mode instruction, for example, via an exemplary OWCI) associated with the at least one of a different performance characteristic (e.g., DR, SNR) or power consumption relative to the LSPL signal path 110L, as further described herein regarding FIGS. 1-9.

In a non-limiting aspect, exemplary methods 1300 can further comprise, at 1306, switching to the HSPL signal path 110H using a multipath digital audio combiner component or ramp generation and two-path audio combine (RAMP GEN/TPAC) 120 configured to compensate for gain imbalance among at least respective portions of the one or more signal paths 110 (e.g., LSPL signal path 110L, HSPL signal path 110H) of the MEMS acoustic sensor or microphone (e.g., MEMS acoustic sensor or microphone 502) to generate an output signal (e.g., DSP output signal 122) and to mix signals associated with the at least respective portions of the one or more signal paths 110 (e.g., LSPL signal path 110L, HSPL signal path 110H) of the MEMS acoustic sensor or microphone (e.g., MEMS acoustic sensor or microphone 502), wherein the output signal (e.g., DSP output signal 122) can be based at least in part on a respective portion of the HSPL signal path 110H and a minimum transition time configured to allow the respective portion of the HSPL signal path 110H to stabilize, based at least in part on control of a gain adjustment component or control finite state machine (CTRL FSM) 116 associated with the DSP 108 configured to adjust respective gains associated with one or more adjustable ADCs 106 based at least in part on respective signal levels in the respective portions of the one or more signal paths 110, as further described herein regarding FIGS. 1-9.

In another non-limiting aspect, exemplary methods 1300 can further comprise, at 1308, adjusting gain and biasing in the LSPL signal path 110L using a power management component or auxiliary finite state machine (AUX FSM) 124 configured to adjust gain associated in the LSPL signal path 110L based at least in part on an estimated signal level in a respective portion of the HSPL signal path 110H, as further described herein regarding FIGS. 1-9. In still another non-limiting aspect, exemplary methods 1300 can further comprise, at 1310, enabling switching, using the multipath digital audio combiner component or ramp generation and two-path audio combine (RAMP GEN/TPAC) 120, from operating the one or more signal paths 110 (e.g., LSPL signal path 110L, HSPL signal path 110H) of the MEMS acoustic sensor or microphone (e.g., MEMS acoustic sensor or microphone 502) in DSP 108 to the single signal path in the DSP 108 based at least in part on the respective portion of the LSPL signal path 110L and another minimum transition time configured to allow the respective portion of the LSPL signal path 110L to stabilize, as further described herein regarding FIGS. 1-9.

FIG. 14 depicts yet another exemplary flowchart 1400 of further non-limiting methods associated with non-limiting embodiments of the subject disclosure. Exemplary methods 1400 can comprise, at 1402, switching between operating two or more signal paths 110 (e.g., LSPL signal path 110L, HSPL signal path 110H) in a DSP (e.g., DSP 108) associated with a MEMS acoustic sensor associated with two or more gain stage amplifiers (e.g., GST amplifier 506L, GST amplifier 506H) and operating a single signal path in the DSP (e.g., DSP 108), as further described herein.

As a non-limiting example, exemplary methods 1400 can comprise, at 1404 restoring power (e.g., one of $P_{HSPL}$ 902 or $P_{LSPL}$ 904) to a first signal path (e.g., one of LSPL signal path 110L, HSPL signal path 110H) associated with an unused portion of the two or more signal paths 110 (e.g., LSPL signal path 110L, HSPL signal path 110H) based on a selected transition of modes and respective signal levels 114 (e.g., LSPL signal level 114L, HSPL signal level 114H) associated with the two or more signal paths 110 (e.g., LSPL signal path 110L, HSPL signal path 110H) as directed by a gain adjustment component or control finite state machine (CTRL FSM) 116 associated with the DSP (e.g., DSP 108) configured to coordinate switching among at least respective portions of the two or more signal paths 110 (e.g., LSPL signal path 110L, HSPL signal path 110H) based on the respective signal levels 114 (e.g., LSPL signal level 114L, HSPL signal level 114H) and a selected transition of modes based on one or more of a performance criteria (e.g., gain, DR, SNR) or a power consumption criteria (e.g., muting instruction, off instruction, power-saving mode instruction, for example, via an exemplary OWCI), in non-limiting aspects. In a non-limiting aspect, an exemplary gain adjustment component or control finite state machine (CTRL FSM) 116 can be configured to coordinate temporary power (e.g., one of $P_{HSPL}$ 902 or $P_{LSPL}$ 904) reduction and power (e.g., one of $P_{HSPL}$ 902 or $P_{LSPL}$ 904) restoration associated with the unused portion of the two or more signal paths 110 (e.g., LSPL signal path 110L, HSPL signal path 110H) based on the selected transition of modes and the respective signal levels 114 (e.g., LSPL signal level 114L, HSPL signal level 114H) associated with the two or more signal paths 110 (e.g., LSPL signal path 110L, HSPL signal path 110H). In another non-limiting aspect, an exemplary gain adjustment component or control finite state machine (CTRL FSM) 116 can be configured to adjust respective gains 118 (e.g., LSPL ADC gain 118L, HSPL ADC gain 118H) associated with two or more adjustable ADCs (e.g., adjustable ADC 106L, adjustable ADC 106H) based on the respective signal levels 114 (e.g., LSPL signal level 114L, HSPL signal level 114H) in the respective portions of the two or more signal paths 110 (e.g., LSPL signal path 110L, HSPL signal path 110H), as further described herein.

In yet another non-limiting aspect, exemplary methods 1400 can comprise restoring power (e.g., one of $P_{HSPL}$ 902 or $P_{LSPL}$ 904) of the first signal path (e.g., one of LSPL signal path 110L, HSPL signal path 110H) as directed by the gain adjustment component or control finite state machine (CTRL FSM) 116 by directing, in the first signal path (e.g., one of LSPL signal path 110L, HSPL signal path 110H) of the two or more signal paths 110 (e.g., LSPL signal path 110L, HSPL signal path 110H), one or more of restoration of gain stage current associated with one of two or more the gain stage amplifiers (e.g., GST amplifier 506L, GST amplifier 506H), restoration of clock frequency (e.g., via CLOCK GEN 702L, 702H) of one of the two or more adjustable ADCs (e.g., adjustable ADC 106L, adjustable ADC 106H), restoration of clock frequency (e.g., via CLOCK GEN 702L, 702H) of a signal path component of the DSP (e.g., DSP 108) associated with the one of the two or more adjustable ADCs (e.g., adjustable ADC 106L, adjustable ADC 106H), or restoration of current of the one of the two or more adjustable ADCs (e.g., adjustable ADC 106L, adjustable ADC 106H), as further described herein.

In a further non-limiting example, exemplary methods 1400 can comprise, at 1406, switching to the first signal path (e.g., one of LSPL signal path 110L, HSPL signal path 110H) of the two or more signal paths 110 (e.g., LSPL signal path 110L, HSPL signal path 110H) from a second signal path (e.g., another of LSPL signal path 110L, HSPL signal path 110H) of the two or more signal paths 110 (e.g., LSPL signal path 110L, HSPL signal path 110H) using a multipath digital audio combiner component or ramp generation and two-path audio combine (RAMP GEN/TPAC) 120 configured to compensate for gain imbalance among at least respective portions of the two or more signal paths 110 (e.g., LSPL signal path 110L, HSPL signal path 110H), to generate an output signal, and to mix signals associated with respective portions of the two or more signal paths 110 (e.g., LSPL signal path 110L, HSPL signal path 110H), based on control of the gain adjustment component or control finite state machine (CTRL FSM) 116, as further described herein. In non-limiting aspects, exemplary multipath digital audio combiner component or ramp generation and two-path audio combine (RAMP GEN/TPAC) 120 can be configured to generate the output signal based on the respective portion of the first signal path (e.g., one of LSPL signal path 110L, HSPL signal path 110H) and a minimum transition time configured to allow the respective portion of the first signal path (e.g., one of LSPL signal path 110L, HSPL signal path 110H) to stabilize, as described herein.

In yet another non-limiting embodiment, exemplary methods 1400 can comprise, at 1408, reducing power (e.g., one of $P_{HSPL}$ 902 or $P_{LSPL}$ 904) of the second signal path (e.g., another of LSPL signal path 110L, HSPL signal path 110H), as directed by the gain adjustment component or control finite state machine (CTRL FSM) 116, thereby recreating the unused portion of the two or more signal paths 110 (e.g., LSPL signal path 110L, HSPL signal path 110H). In exemplary embodiments, reducing power (e.g., one of $P_{HSPL}$ 902 or $P_{LSPL}$ 904) of the second signal path (e.g., another of LSPL signal path 110L, HSPL signal path 110H) as directed by the gain adjustment component or control finite state machine (CTRL FSM) 116 can comprise directing, in the first signal path (e.g., one of LSPL signal path 110L, HSPL signal path 110H) of the two or more signal paths 110 (e.g., LSPL signal path 110L, HSPL signal path 110H), one or more of reduction of gain stage current associated with another of the two or more gain stage amplifiers (e.g., GST amplifier 506L, GST amplifier 506H), reduction of clock frequency (e.g., via CLOCK GEN 702L, 702H) of another of the two or more adjustable ADCs (e.g., adjustable ADC 106L, adjustable ADC 106H), reduction of clock frequency (e.g., via CLOCK GEN 702L, 702H) of another signal path component of the DSP (e.g., DSP 108) associated with the another of the two or more adjustable ADCs (e.g., adjustable ADC 106L, adjustable ADC 106H), or reduction of current of the another of the two or more adjustable ADCs (e.g., adjustable ADC 106L, adjustable ADC 106H), as further described herein.

In addition, exemplary embodiments of methods 1400 can comprise, at 1410, restoring power (e.g., one of $P_{HSPL}$ 902 or $P_{LSPL}$ 904) of the second signal path (e.g., another of LSPL signal path 110L, HSPL signal path 110H) as directed by the gain adjustment component or control finite state machine (CTRL FSM) 116 comprising directing, in the second signal path (e.g., another of LSPL signal path 110L, HSPL signal path 110H) of the two or more signal paths 110 (e.g., LSPL signal path 110L, HSPL signal path 110H), one or more of restoration of gain stage current associated with the another of the two or more the gain stage amplifiers (e.g., GST amplifier 506L, GST amplifier 506H), restoration of clock frequency (e.g., via CLOCK GEN 702L, 702H) of the another of the two or more adjustable ADCs (e.g., adjustable ADC 106L, adjustable ADC 106H), restoration of clock frequency (e.g., via CLOCK GEN 702L, 702H) of the another signal path component of the DSP (e.g., DSP 108) associated with the another of the two or more adjustable ADCs (e.g., adjustable ADC 106L, adjustable ADC 106H), or restoration of current of the another of the two or more adjustable ADCs (e.g., adjustable ADC 106L, adjustable ADC 106H), in non-limiting aspects.

Exemplary embodiments of methods 1400 can further comprise, at 1412, switching to the second signal path (e.g., another of LSPL signal path 110L, HSPL signal path 110H) of the two or more signal paths 110 (e.g., LSPL signal path 110L, HSPL signal path 110H) from the first signal path (e.g., one of LSPL signal path 110L, HSPL signal path 110H) of the two or more signal paths 110 (e.g., LSPL signal path 110L, HSPL signal path 110H) using the multipath digital audio combiner component or ramp generation and two-path audio combine (RAMP GEN/TPAC) 120.

In further disclosed embodiments, exemplary methods 1400 can further comprise, at 1414, reducing power (e.g., one of $P_{HSPL}$ 902 or $P_{LSPL}$ 904) of the first signal path (e.g., one of LSPL signal path 110L, HSPL signal path 110H) as directed by the gain adjustment component or control finite state machine (CTRL FSM) 116 by directing, in the first signal path (e.g., one of LSPL signal path 110L, HSPL signal path 110H) of the two or more signal paths 110 (e.g., LSPL signal path 110L, HSPL signal path 110H), one or more of reduction of gain stage current associated with the one of the two or more gain stage amplifiers (e.g., GST amplifier 506L, GST amplifier 506H), reduction of clock frequency (e.g., via CLOCK GEN 702L, 702H) of the one of the two or more adjustable ADCs (e.g., adjustable ADC 106L, adjustable ADC 106H), reduction of clock frequency (e.g., via CLOCK GEN 702L, 702H) of the signal path component of the DSP (e.g., DSP 108) associated with the one of the two or more adjustable ADCs (e.g., adjustable ADC 106L, adjustable ADC 106H), or reduction of current of the one of the two or more adjustable ADCs (e.g., adjustable ADC 106L, adjustable ADC 106H), as further described herein.

Exemplary Computing Environment

FIG. 15 depicts a functional block-diagram of an exemplary computing device suitable for practicing various non-limiting aspects described herein. In order to provide additional context for various embodiments described herein, FIG. 15 and the following discussion are intended to provide a brief, general description of a suitable computing environment 1500 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, and related data, that perform particular tasks or implement particular abstract data types. Moreover, those skilled in the art will appreciate that the inventive methods can be practiced with other computer system configurations, including single-processor or multi-processor computer systems, minicomputers, mainframe computers, Internet of Things (IoT) devices, distributed computing systems, as well as personal computers, handheld computing devices, microprocessor-based or programmable consumer electronics, and the like, each of which can be operatively coupled to one or more associated devices.

The some aspects of illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 15, the example environment 1500 for implementing various embodiments of the aspects described herein includes a computer 1502, the computer 1502 including a processing unit 1504, a system memory 1506 and a system bus 1508. The system bus 1508 couples system components including, but not limited to, the system memory 1506 to the processing unit 1504. The processing unit 1504 can be any of various commercially available processors. Dual microprocessors and other multi-processor architectures can also be employed as the processing unit 1504.

The system bus 1508 can be any of several types of bus structure that can further interconnect to a memory bus (with or without a memory controller), a peripheral bus, and a local bus using any of a variety of commercially available bus architectures. The system memory 1506 includes ROM 1510 and RAM 1512. A basic input/output system (BIOS) can be stored in a non-volatile memory such as ROM, erasable programmable read only memory (EPROM), EEPROM, which BIOS contains the basic routines that help to transfer information between elements within the computer 1502, such as during startup. The RAM 1512 can also include a high-speed RAM such as static RAM for caching data.

The computer 1502 further includes an internal hard disk drive (HDD) 1514 (e.g., EIDE, SATA), one or more external storage devices 1516 (e.g., a magnetic floppy disk drive (FDD) 1516, a memory stick or flash drive reader, a memory card reader, and similar devices) and an optical disk drive 1520 (e.g., which can read or write from a CD-ROM disc, a DVD, a BD, and similar devices). While the internal HDD 1514 is illustrated as located within the computer 1502, the internal HDD 1514 can also be configured for external use in a suitable chassis (not shown). Additionally, while not shown in environment 1500, a solid state drive (SSD) could be used in addition to, or in place of, an HDD 1514. The HDD 1514, external storage device(s) 1516 and optical disk drive 1520 can be connected to the system bus 1508 by an HDD interface 1524, an external storage interface 1526 and an optical drive interface 1528, respectively. The interface 1524 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1502, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1512, including an operating system 1530, one or more application programs 1532, other program modules 1534 and program data 1536. All or portions of the operating system, applications, modules, and/or data can also be cached in the RAM 1512. The systems and methods described herein can be implemented utilizing various commercially available operating systems or combinations of operating systems.

Computer 1502 can optionally comprise emulation technologies. For example, a hypervisor (not shown) or other intermediary can emulate a hardware environment for operating system 1530, and the emulated hardware can optionally be different from the hardware illustrated in FIG. 15. In such an embodiment, operating system 1530 can comprise one virtual machine (VM) of multiple VMs hosted at computer 1502. Furthermore, operating system 1530 can provide runtime environments, such as the Java runtime environment or the NET framework, for applications 1532. Runtime environments are consistent execution environments that allow applications 1532 to run on any operating system that includes the runtime environment. Similarly, operating system 1530 can support containers, and applications 1532 can be in the form of containers, which are lightweight, stand-alone, executable packages of software that include, e.g., code, runtime, system tools, system libraries and settings for an application.

Further, computer 1502 can be enable with a security module, such as a trusted processing module (TPM). For instance with a TPM, boot components hash next in time boot components, and wait for a match of results to secured values, before loading a next boot component. This process can take place at any layer in the code execution stack of computer 1502, e.g., applied at the application execution level or at the operating system (OS) kernel level, thereby enabling security at any level of code execution.

A user can enter commands and information into the computer 1502 through one or more wired/wireless input devices, e.g., a keyboard 1538, a touch screen 1540, and a pointing device, such as a mouse 1542. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1504 through an input device interface 1544 that can be coupled to the system bus 1508, but can be connected by other interfaces, such as a parallel port, an IEEE 1394 serial port, a game port, a USB port, an IR interface, a BLUETOOTH® interface, and similar interfaces.

A monitor 1546 or other type of display device can be also connected to the system bus 1508 via an interface, such as a video adapter 1548. In addition to the monitor 1546, a computer typically includes other peripheral output devices (not shown), such as speakers, printers, and similar devices.

The computer 1502 can operate in a networked environment using logical connections via wired and/or wireless communications to one or more remote computers, such as a remote computer(s) 1550. The remote computer(s) 1550 can be a workstation, a server computer, a router, a personal computer, portable computer, microprocessor-based entertainment appliance, a peer device or other common network node, and typically includes many or all of the elements described relative to the computer 1502, although, for purposes of brevity, only a memory/storage device 1552 is illustrated. The logical connections depicted include wired/wireless connectivity to a local area network (LAN) 1554 and/or larger networks, e.g., a wide area network (WAN) 1556. Such LAN and WAN networking environments are commonplace in offices and companies, and facilitate enterprise-wide computer networks, such as intranets, all of which can connect to a global communications network, e.g., the Internet.

When used in a LAN networking environment, the computer 1502 can be connected to the local network 1554 through a wired and/or wireless communication network interface or adapter 1558. The adapter 1558 can facilitate wired or wireless communication to the LAN 1554, which can also include a wireless access point (AP) disposed thereon for communicating with the adapter 1558 in a wireless mode.

When used in a WAN networking environment, the computer 1502 can include a modem 1560 or can be connected to a communications server on the WAN 1556 via other means for establishing communications over the WAN 1556, such as by way of the Internet. The modem 1560, which can be internal or external and a wired or wireless device, can be connected to the system bus 1508 via the input device interface 1544. In a networked environment, program modules depicted relative to the computer 1502 or portions thereof, can be stored in the remote memory/storage device 1552. It will be appreciated that the network connections shown are example and other means of establishing a communications link between the computers can be used.

When used in either a LAN or WAN networking environment, the computer 1502 can access cloud storage systems or other network-based storage systems in addition to, or in place of, external storage devices 1516 as described above. Generally, a connection between the computer 1502 and a cloud storage system can be established over a LAN 1554 or WAN 1556 e.g., by the adapter 1558 or modem 1560, respectively. Upon connecting the computer 1502 to an associated cloud storage system, the external storage interface 1526 can, with the aid of the adapter 1558 and/or modem 1560, manage storage provided by the cloud storage system as it would other types of external storage. For instance, the external storage interface 1526 can be configured to provide access to cloud storage sources as if those sources were physically connected to the computer 1502.

The computer 1502 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, bin), and telephone. This can include Wireless Fidelity (Wi-Fi) and BLUETOOTH® wireless technologies. Thus, the communication can be a predefined structure as with a conventional network or simply an ad hoc communication between at least two devices.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

As used in this application, the terms "component," "module," "device" and "system" are intended to refer to a computer-related entity, either hardware, a combination of hardware and software, software, or software in execution. As one example, a component or module can be, but is not limited to being, a process running on a processor, a processor or portion thereof, a hard disk drive, multiple storage drives (of optical and/or magnetic storage medium), an object, an executable, a thread of execution, a program, and/or a computer. By way of illustration, both an application running on a server and the server can be a component or module. One or more components or modules scan reside within a process and/or thread of execution, and a component or module can be localized on one computer or processor and/or distributed between two or more computers or processors.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. An apparatus, comprising:
    an application specific integrated circuit (ASIC) associated with a microelectromechanical systems (MEMS) acoustic sensor and having a plurality of signal paths associated with the MEMS acoustic sensor, wherein the plurality of signal paths have different gains provided by a plurality of gain stage amplifiers;
    a digital signal processing component (DSP) associated with the ASIC configured to receive a plurality of signals from a plurality of adjustable analog-to-digital converters (ADCs) associated with the plurality of gain stage amplifiers; and
    a gain adjustment component associated with the DSP configured to adjust respective gains associated with the plurality of adjustable ADCs based at least in part on respective signal levels associated with the plurality of signal paths, wherein the gain adjustment component is further configured to coordinate switching among at least respective portions of the plurality of signal paths based at least in part on the respective signal levels and a selected transition of modes based at least in part on at least one of a performance criteria or a power consumption criteria, and wherein the gain adjustment component is further configured to coordinate temporary power reduction and power restoration associated with an unused portion of the plurality of signal paths based at least in part on the selected transition of modes and respective signal levels associated with the plurality of signal paths.

2. The apparatus of claim 1, wherein the gain adjustment component is further configured to coordinate temporary power reduction and power restoration by directing at least one of reduction or restoration of gain stage current associated with an unused one of the plurality of gain stage amplifiers, reduction or restoration of clock frequency of an unused one of the plurality of adjustable ADCs, reduction or restoration of clock frequency of a signal path component of the DSP associated with the unused one of the plurality of adjustable ADCs, or reduction or restoration of current of the unused one of the plurality of adjustable ADCs.

3. The apparatus of claim 2, wherein the DSP is further configured to at least one of switch from operating the plurality of signal paths to a single signal path or switch from operating the single signal path to the plurality of signal paths, wherein the plurality of signal paths comprises at least a high sound pressure level signal path and a low sound pressure level signal path, and wherein the high sound pressure level signal path is characterized at least in part by having at least one of a different performance characteristic or power characteristic relative to the low sound pressure level signal path, and wherein the single signal path comprises the low sound pressure level signal path.

4. The apparatus of claim 3, wherein the DSP is further configured to switch to the low sound pressure level signal path using a multipath digital audio combiner component, restore power associated with the low sound pressure level signal path using the gain adjustment component, switch to the low sound pressure level signal path using the multipath digital audio combiner component further configured to generate the output signal based at least in part on a respective portion of the low sound pressure level signal path and a minimum transition time configured to allow the respective portion of the low sound pressure level signal path to stabilize, and temporarily reduce power associated with the high sound pressure level signal path as directed by the gain adjustment component.

5. The apparatus of claim 4, wherein the DSP is further configured to temporarily reduce power associated with the high sound pressure level signal path as directed by the gain adjustment component by at least one of reducing gain stage current associated with the unused one of the plurality of gain stage amplifiers associated with the high sound pressure level signal path, reducing clock frequency of the unused one of the plurality of adjustable ADCs associated with the high sound pressure level signal path, reducing clock frequency of the signal path component of the DSP associated with the unused one of the plurality of adjustable ADCs of the high sound pressure level signal path, or reducing current of the unused one of the plurality of adjustable ADCs associated with the high sound pressure level signal path.

6. The apparatus of claim 4, wherein the DSP is further configured to restore power associated with the low sound pressure level signal path using the gain adjustment component to at least one of restore gain stage current associated with the unused one of the plurality of gain stage amplifiers associated with the low sound pressure level signal path, restore clock frequency of the unused one of the plurality of adjustable ADCs associated with the low sound pressure level signal path, restore clock frequency of the signal path component of the DSP associated with the unused one of the plurality of adjustable ADCs of the low sound pressure level signal path, or restore current of the unused one of the plurality of adjustable ADCs associated with the low sound pressure level signal path.

7. The apparatus of claim 3, wherein the DSP is further configured to switch to the high sound pressure level signal path using a multipath digital audio combiner component, restore power associated with the high sound pressure level signal path using the gain adjustment component, switch to the high sound pressure level signal path using the multipath digital audio combiner component further configured to generate the output signal based at least in part on a respective portion of the high sound pressure level signal path and another minimum transition time configured to allow the respective portion of the high sound pressure level signal path to stabilize, and temporarily reduce power associated with the high sound pressure level signal path as directed by the gain adjustment component.

8. The apparatus of claim 7, wherein the DSP is further configured to temporarily reduce power associated with the low sound pressure level signal path as directed by the gain adjustment component by at least one of reducing gain stage current associated with the unused one of the plurality of gain stage amplifiers associated with the low sound pressure level signal path, reducing clock frequency of the unused one of the plurality of adjustable ADCs associated with the low sound pressure level signal path, reducing clock frequency of the signal path component of the DSP associated with the unused one of the plurality of adjustable ADCs of the low sound pressure level signal path, or reducing current of the unused one of the plurality of adjustable ADCs associated with the low sound pressure level signal path.

9. The apparatus of claim 7, wherein the DSP is further configured to restore power associated with the high sound pressure level signal path using the gain adjustment component to at least one of restore gain stage current associated with the unused one of the plurality of gain stage amplifiers associated with the high sound pressure level signal path, restore clock frequency of the unused one of the plurality of adjustable ADCs associated with the high sound pressure level signal path, restore clock frequency of the signal path component of the DSP associated with the unused one of the plurality of adjustable ADCs of the high sound pressure level signal path, or restore current of the unused one of the plurality of adjustable ADCs associated with the high sound pressure level signal path.

10. A method, comprising:
   switching between operating a plurality of signal paths in a digital signal processor (DSP) associated with a microelectromechanical systems (MEMS) acoustic sensor associated with a plurality of gain stage amplifiers and operating a single signal path in the DSP, the method comprising:
   restoring power to a first signal path associated with an unused portion of the plurality of signal paths based at least in part on a selected transition of modes and respective signal levels associated with the plurality of signal paths as directed by a gain adjustment component associated with the DSP configured to coordinate switching among at least respective portions of the plurality of signal paths based at least in part on the respective signal levels and a selected transition of modes based at least in part on at least one of a performance criteria or a power consumption criteria, wherein the gain adjustment component is further configured to coordinate temporary power reduction and power restoration associated with the unused portion of the plurality of signal paths based at least in part on the selected transition of modes and the respective signal levels associated with the plurality of signal paths, and wherein the gain adjustment component is further configured to adjust respective gains associated with a plurality of adjustable ADCs based at least in part one the respective signal levels in the respective portions of the plurality of signal paths;
   switching to the first signal path of the plurality of signal paths from a second signal path of the plurality of signal paths using a multipath digital audio combiner component configured to compensate for gain imbalance among at least respective portions of the plurality of signal paths, to generate an output signal, and to mix signals associated with the at least respective portions of the plurality of signal paths, based at least in part on control of the gain adjustment component, and wherein the multipath digital audio combiner component is further configured to generate the output signal based at least in part on the respective portion of the first signal path and a minimum transition time configured to allow the respective portion of the first signal path to stabilize; and
   reducing power of the second signal path, as directed by the gain adjustment component, thereby recreating the unused portion of the plurality of signal paths.

11. The method of claim 10, wherein the restoring power of the first signal path as directed by the gain adjustment component comprises directing, in the first signal path of the plurality of signal paths, at least one of restoration of gain stage current associated with one of a plurality of the gain stage amplifiers, restoration of clock frequency of one of the plurality of adjustable ADCs, restoration of clock frequency of a signal path component of the DSP associated with the one of the plurality of adjustable ADCs, or restoration of current of the one of the plurality of adjustable ADCs.

12. The method of claim 11, wherein the reducing power of the second signal path as directed by the gain adjustment component comprises directing, in the first signal path of the plurality of signal paths, at least one of reduction of gain stage current associated with another of the plurality of gain stage amplifiers, reduction of clock frequency of another of the plurality of adjustable ADCs, reduction of clock frequency of another signal path component of the DSP associated with the another of the plurality of adjustable ADCs, or reduction of current of the another of the plurality of adjustable ADCs.

13. The method of claim 12, further comprising:
   restoring power of the second signal path as directed by the gain adjustment component comprising directing, in the second signal path of the plurality of signal paths, at least one of restoration of gain stage current associated with the another of the plurality of the gain stage amplifiers, restoration of clock frequency of the another of the plurality of adjustable ADCs, restoration of clock frequency of the another signal path component of the DSP associated with the another of the plurality of adjustable ADCs, or restoration of current of the another of the plurality of adjustable ADCs; and switching to the second signal path of the plurality of signal paths from the first signal path of the plurality of signal paths using the multipath digital audio combiner component.

14. The method of claim 13, further comprising:
reducing power of the first signal path as directed by the gain adjustment component by directing, in the first signal path of the plurality of signal paths, at least one of reduction of gain stage current associated with the one of the plurality of gain stage amplifiers, reduction of clock frequency of the one of the plurality of adjustable ADCs, reduction of clock frequency of the signal path component of the DSP associated with the one of the plurality of adjustable ADCs, or reduction of current of the one of the plurality of adjustable ADCs.

* * * * *